United States Patent [19]
Niimi et al.

[11] Patent Number: 5,499,213
[45] Date of Patent: Mar. 12, 1996

[54] SEMICONDUCTOR MEMORY DEVICE HAVING SELF-REFRESH FUNCTION

[75] Inventors: Makoto Niimi; Shigemasa Ito, both of Kasugai; Toyonobu Yamada; Yoshihiro Takemae, both of Kawasaki; Yoshiharu Kato, Kasugai, all of Japan

[73] Assignees: Fujitsu Limited, Kawasaki; Fujitsu VLSI Limited, Kasugai, both of Japan

[21] Appl. No.: 83,443

[22] Filed: Jun. 29, 1993

[30] Foreign Application Priority Data

| Jun. 29, 1992 | [JP] | Japan | 4-170602 |
| Jul. 9, 1992 | [JP] | Japan | 4-182384 |
| Aug. 7, 1992 | [JP] | Japan | 4-211820 |
| Sep. 21, 1992 | [JP] | Japan | 4-251226 |
| Jun. 18, 1993 | [JP] | Japan | 5-147673 |

[51] Int. Cl.⁶ .................................................. G11C 7/00
[52] U.S. Cl. .................................... 365/222; 365/236
[58] Field of Search ........................... 365/222, 233.5, 365/233, 230.08, 236

[56] References Cited

U.S. PATENT DOCUMENTS 4,989,183  1/1991  Kumanoya .......................... 365/222

FOREIGN PATENT DOCUMENTS 3-149867  6/1991  Japan .

*Primary Examiner*—A. Zarabian
*Attorney, Agent, or Firm*—Staas & Halsey

[57] ABSTRACT

A semiconductor memory device has an oscillator unit for generating refresh pulses, a refresh address detection unit for detecting refreshed addresses and outputting a predetermined signal upon the completion of the refreshing of all addresses, and an output control unit for continuing a self-refresh mode to refresh all addresses according to the signal from the refresh address detection unit, before releasing the self-refresh mode in response to an external signal. Therefore, the refresh operation is continued until all cells are refreshed, thereby data stored in the semiconductor memory device is not lost and is correctly refreshed.

4 Claims, 41 Drawing Sheets

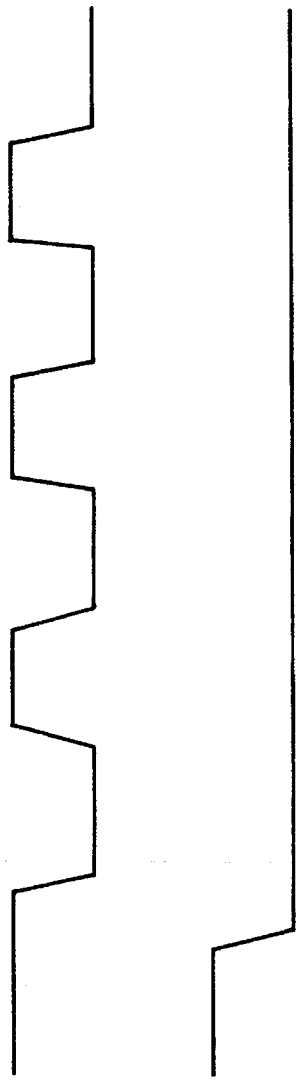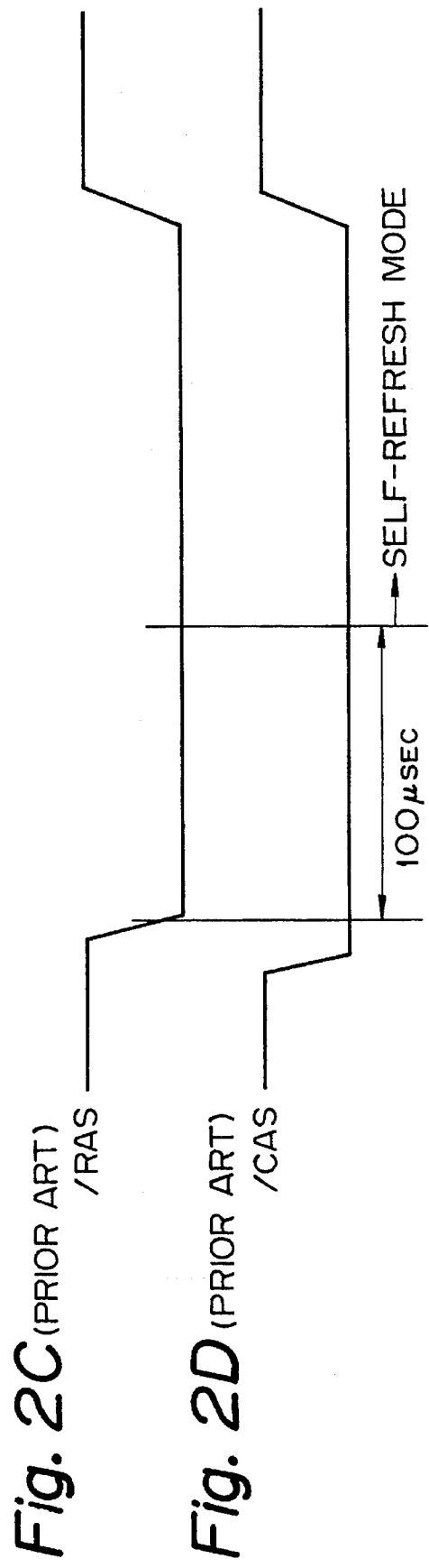
Fig. 2A (PRIOR ART) /RAS
Fig. 2B (PRIOR ART) /CAS
Fig. 2C (PRIOR ART) /RAS
Fig. 2D (PRIOR ART) /CAS

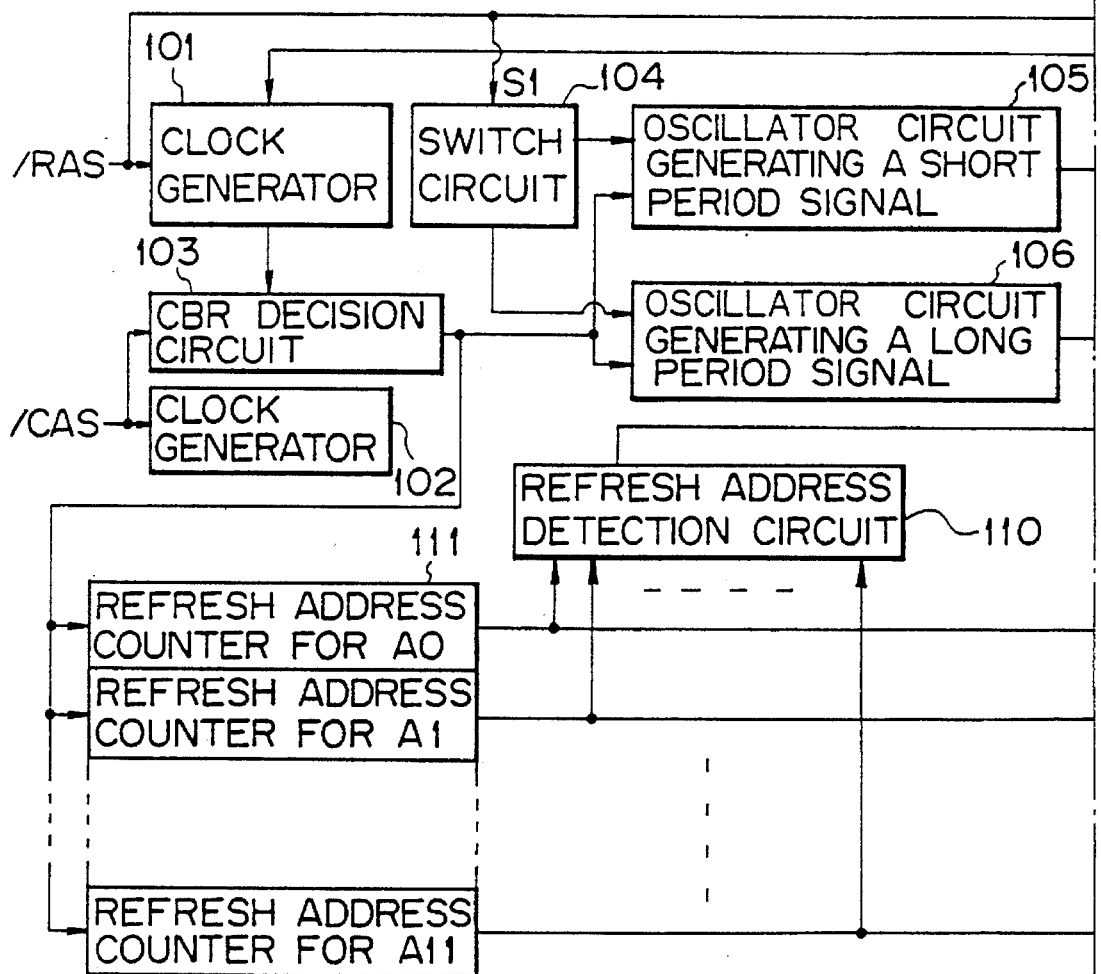

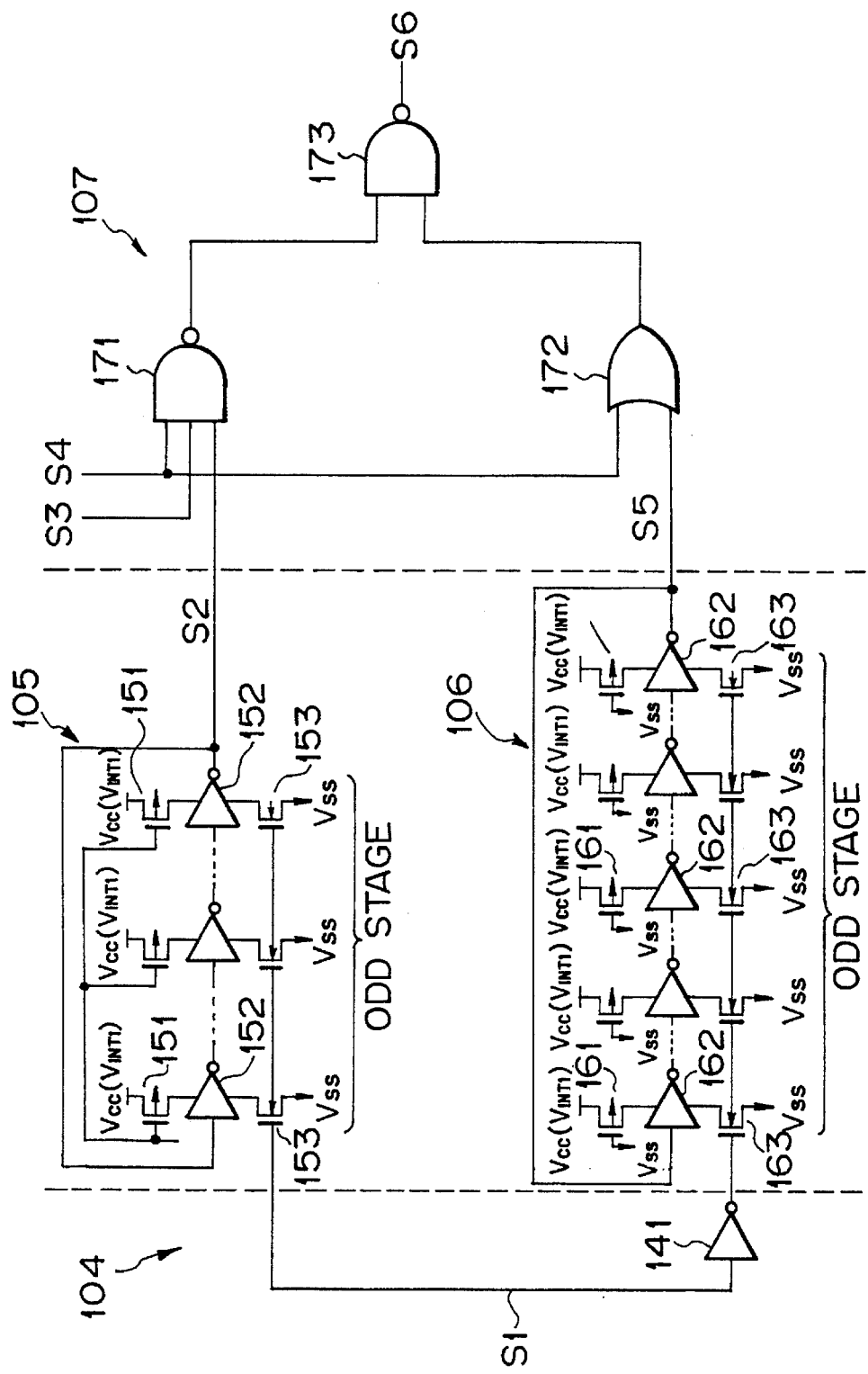

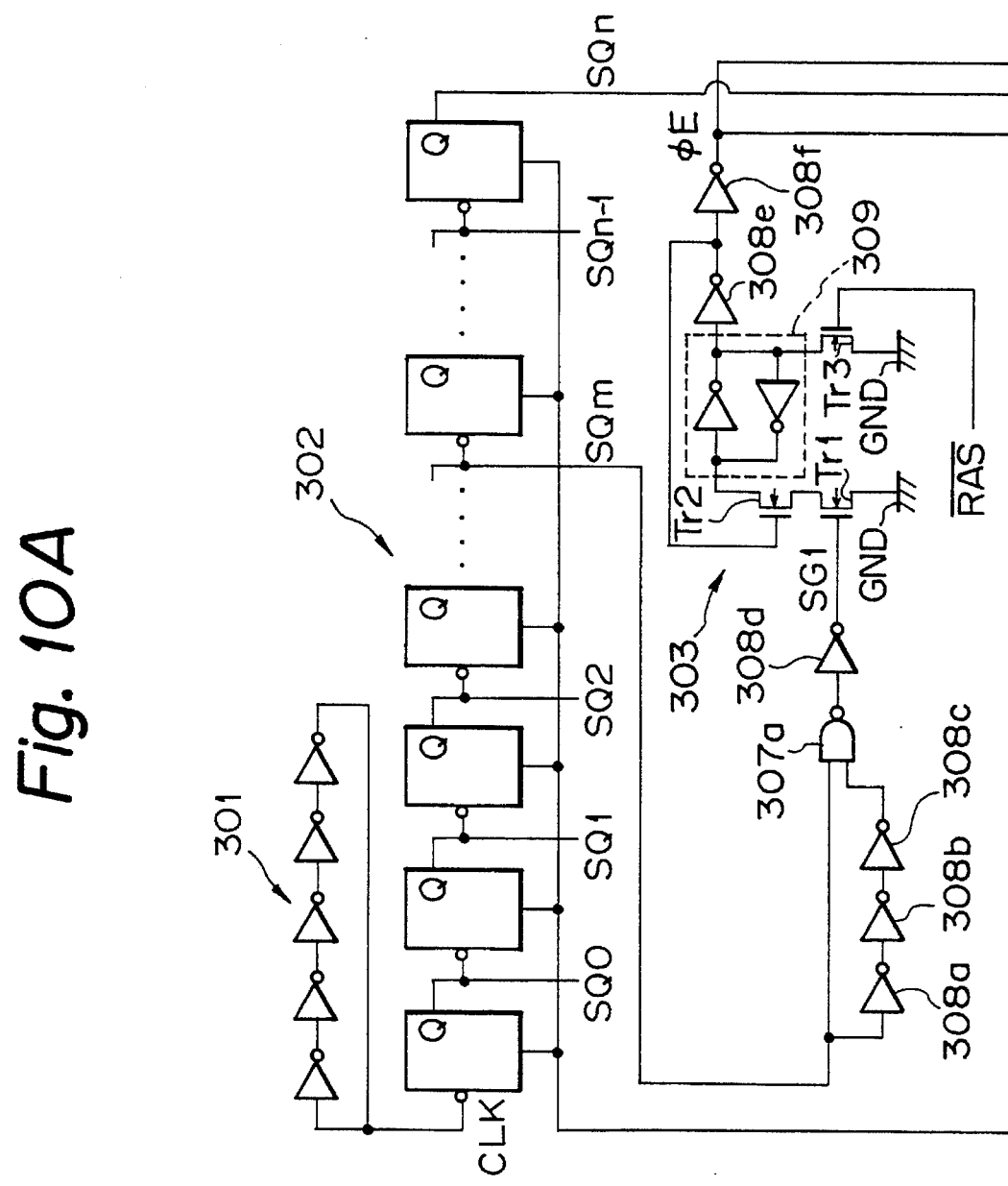

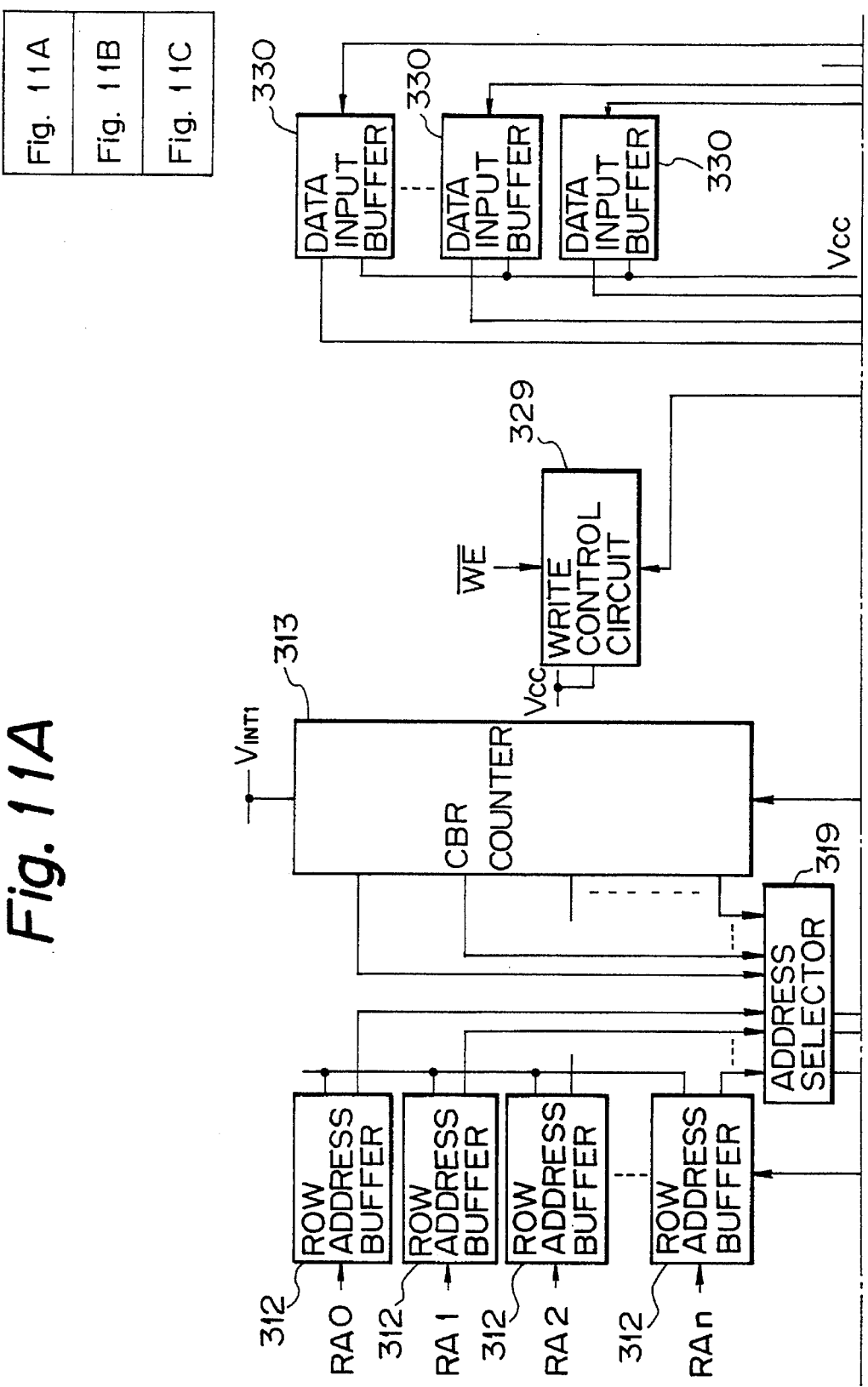

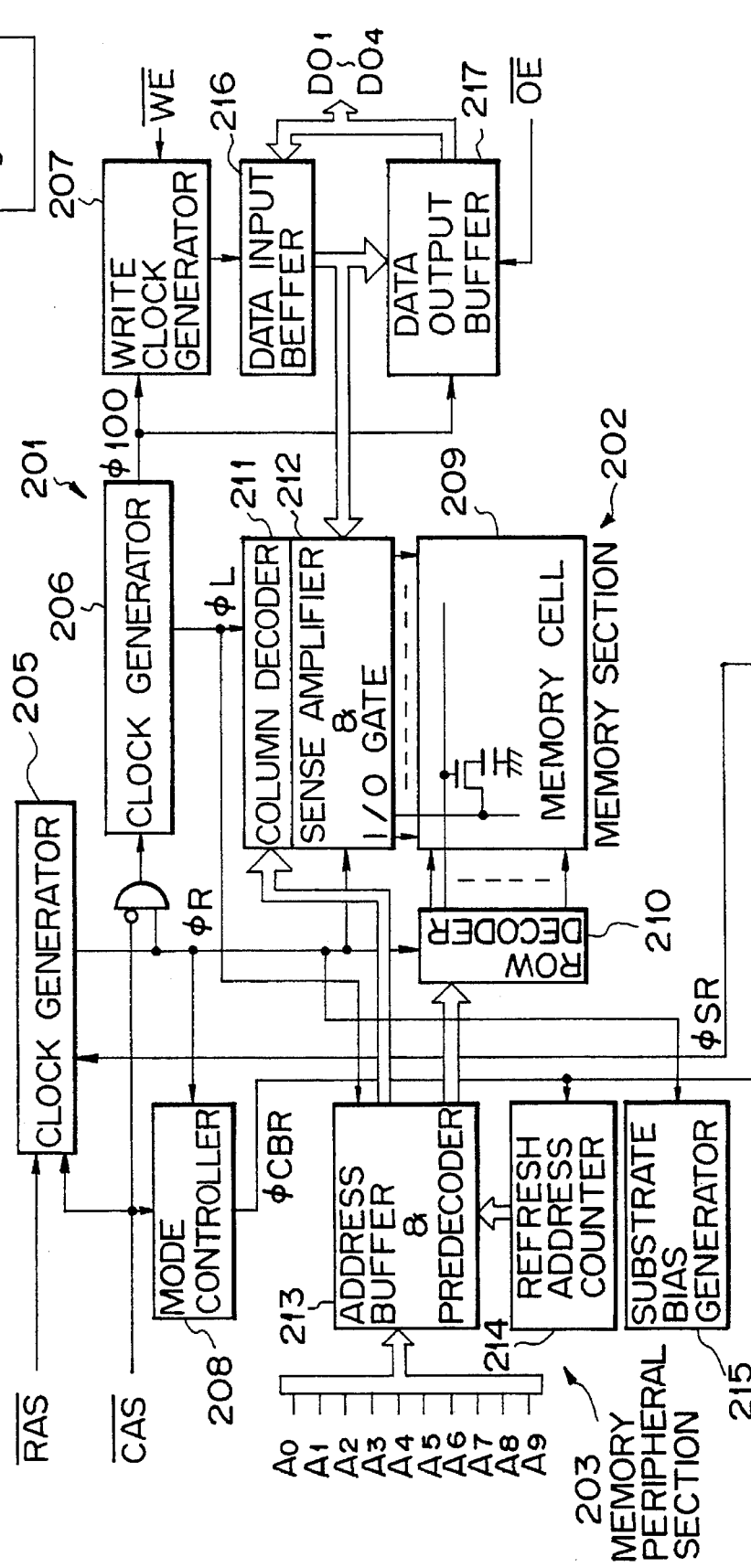

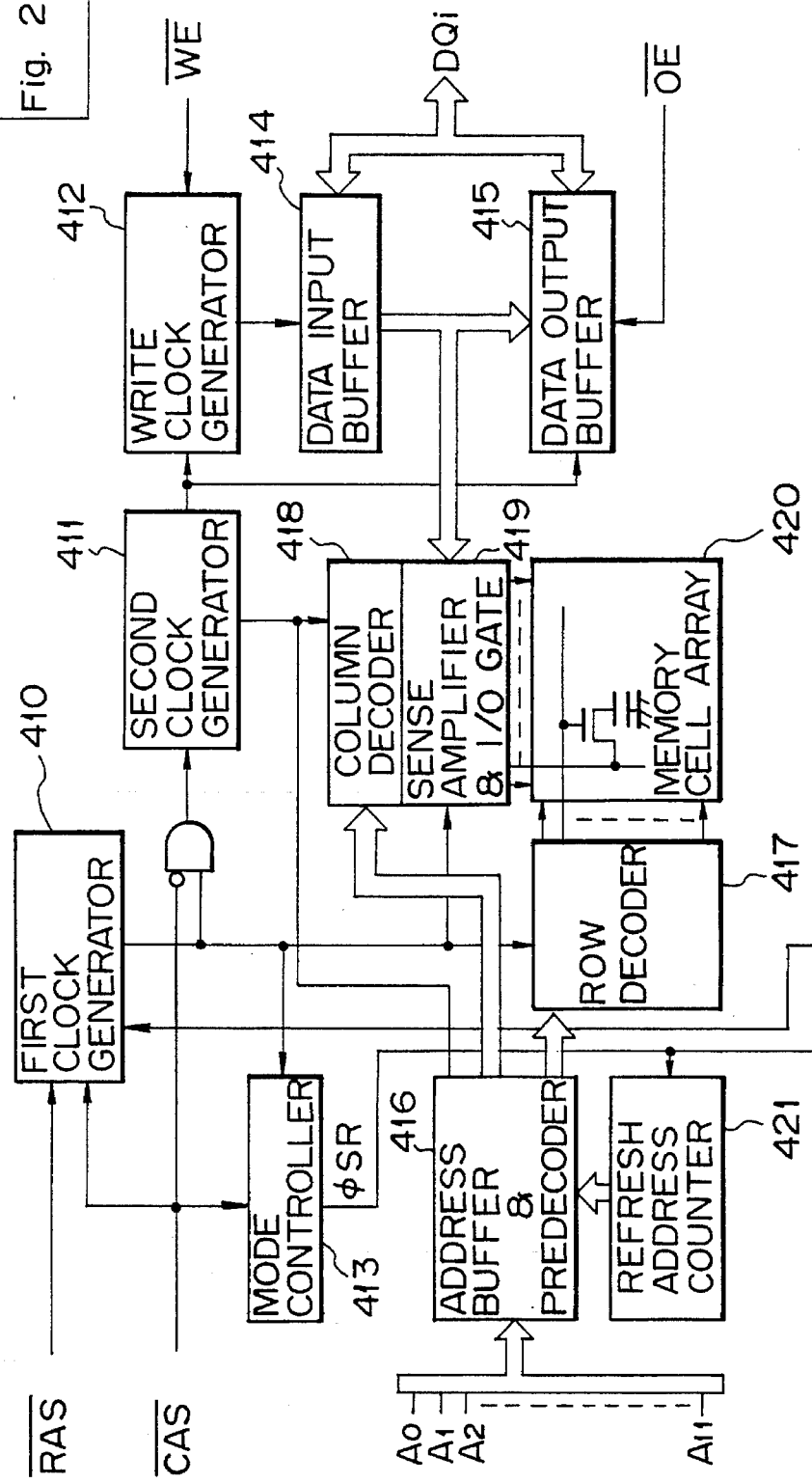

SEMICONDUCTOR MEMORY DEVICE HAVING SELF-REFRESH FUNCTION

BACKGROUND OF THE INVENTION

1. Field of the Invention

The present invention relates to a semiconductor memory device, and more particularly, to a dynamic random access memory (DRAM) having a self-refresh function.

2. Description of the Related Art

Recently, information processing devices having improved functions and high performances have begun to require dynamic semiconductor memories, such as DRAMs, that have large capacity and consume little power. Suitable devices have been developed as semiconductor memories for these information processing devices.

DRAMs are semiconductor memories having capacitors that accumulate charges depending on the data of ("1" and "0") that they are required to store. The DRAMs, unlike SRAMs (Static Random Access Memories), have no data storage mechanism using flip-flop circuits. One typical DRAM configuration is a one-transistor memory device configuration in which each one-bit memory cell is composed of two elements, i.e., a MOS transistor and a capacitor. If each memory cell of the DRAM is left as it is after data is written thereto, the data will disappear as time passes because of leakage currents. Accordingly, the DRAM requires a refresh operation to be carried out at predetermined intervals, to read stored data from the memory and to rewrite the data to the memory.

Nevertheless, each memory cell of the DRAMs occupies a small area, so that the DRAMs are economical because of their large data storage capacities. The DRAMs, therefore, are widely used as main memories in a variety of computers including general purpose large-sized computers and personal computers. Note, recent DRAMs used for portable personal computers have a self-refresh mode for keeping data in memory cells with no external control signals. Namely, recently, DRAMs having the self-refresh function for automatically refreshing memory cells have been proposed. For example, when the DRAMs are applied to a note type personal computer, which is driven by a battery, the consumption of power by the personal computer must be small. Therefore, the self-refresh mode of the DRAMs must be carried out at low power consumption.

In the prior art, Japanese Unexamined Patent Publication (Kokai) No. 3-149867 (Jun. 26, 1991) corresponding to U.S. patent application Ser. No. 07/957,055, now U.S. Pat. No. 5,309,040 issued May 3, 1994, and EP-A1-454859, which discloses a one-chip memory having a step-down circuit, has been published. Further, in the prior art, the following documents have been published: Nogami et al., "1-Mb virtually static RAM", IEEE J. Solid-State Circuits., vol. SC-21, 662. 1986; Yoshioka et al., "4Mb pseudo/virtually SRAM", in 1987 ISSCC Dig. Tech. Papers, 20. 1987; and Konishi et al., "A 38-ns 4-Mb DRAM with a battery-backup (BBU) mode", IEEE J. Solid-State Circuits, vol. 25, 1112. 1990.

SUMMARY OF THE INVENTION

An object of a first aspect of the present invention is to provide a semiconductor memory device (DRAM) for preventing errors in data stored in the semiconductor memory device. Further, an object of a second aspect of the present invention is to sufficiently reduce the power consumption of a semiconductor memory device having a self-refresh function. Further, an object of a third aspect of the present invention is to provide a semiconductor memory device capable of reducing the consumption of a current used for a self-refresh operation. In addition, an object of a fourth aspect of the present invention is to provide a step-down power source circuit having a simple arrangement that achieves low power consumption and provides positive temperature characteristics.

According to a first aspect of the present invention, there is provided a semiconductor memory device having a self-refresh mode for automatically refreshing memory cells, wherein the semiconductor memory device comprises an oscillator unit for generating refresh pulses, a refresh address detection unit for detecting refreshed addresses and outputting a predetermined signal upon the completion of the refreshing of all addresses, and an output control unit for continuing the self-refresh mode to refresh all addresses according to the signal from the refresh address detection unit, before releasing the self-refresh mode in response to an external signal.

The oscillator unit may comprise a first oscillator for generating pulses having a short period and a second oscillator for generating pulses having a long period, and the semiconductor memory device may further comprise a switch unit for switching the pulses from the first and second oscillators in response to an external signal for releasing the self-refresh mode, so that a refresh operation is automatically carried out with the short period, before and after the self-refresh mode.

The semiconductor memory device may further comprise refresh address output buffers for providing count values in respective refresh address counters to the outside of the semiconductor memory device. The refresh address output buffers may provide count values in the refresh address counters to the outside through respective address input terminals that receive addresses from the outside.

According to a second aspect of the present invention, there is provided a semiconductor memory device having a self-refresh mode for automatically refreshing memory cells, wherein the semiconductor memory device comprises a timer unit for providing first and second time-up signals, a self-refresh control unit for providing an output signal for selecting the self-refresh mode in response to the first time-up signal of the timer unit, a period signal generator unit for providing a refresh period signal for determining the period of a refresh operation in response to the second time-up signal of the timer unit and the output signal of the self-refresh control unit, a storage operation unit for self-refreshing cell data according to the refresh period signal, and a power source step-down unit for supplying a stepped down source voltage to the storage operation unit by dropping a voltage of a standard source line in response to the output signal of the self-refresh control unit.

The power source step-down unit may comprise a P-channel type MOS transistor and an N-channel type MOS transistor connected in parallel with each other between the standard source line and the storage operation unit, and the output signal of the self-refresh control unit may be applied to gates of the MOS transistors. The power source step-down unit may be provided for respective storage operation unit distributed in the semiconductor memory device, and the output signal of the self-refresh control unit may be supplied to each of the storage operation unit. Each of the power source step-down unit may comprise a P-channel type MOS transistor and an N-channel type MOS transistor connected in parallel with each other between the standard source line and the corresponding storage operation unit.

According to a third aspect of the present invention, there is provided a semiconductor memory device having a self-refresh mode for automatically refreshing memory cells, wherein the semiconductor memory device comprises a memory section including dynamic memory cells, a data write/read unit for writing and reading data to and from the dynamic memory cells, a self-refresh unit for refreshing data stored in the dynamic memory cells in a predetermined time, a source voltage supply unit for supplying a normal source voltage to the semiconductor memory device, and a first step-down unit for dropping (i.e., reducing) the source voltage supplied by the source voltage supply unit to the self-refresh unit.

The first step-down unit may provide the dropped voltage equal to the sum of a threshold voltage of a P-channel type MOS transistor and a threshold voltage of an N-channel type MOS transistor. The first step-down unit may provide the dropped voltage which is a little higher than higher one of a threshold voltage of a P-channel type MOS transistor or a threshold voltage of an N-channel type MOS transistor. During a self-refresh operation, the dynamic memory cells in the memory section and the data write/read unit may receive the normal source voltage output from the source voltage supply unit, and the self-refresh unit may receive the dropped voltage output from the first step-down unit.

The semiconductor memory device may further comprise a second step-down unit for dropping the source voltage supplied by the source voltage supply unit to the data write/read unit. During a self-refresh operation, the dynamic memory cells in the memory section may receive the normal source voltage output from the source voltage supply unit, the data write/read unit may receive the dropped voltage output from the second step-down unit, and the self-refresh unit may receive the dropped voltage output from the step-down unit.

The self-refresh unit may comprise an oscillator having an odd number of inverter circuits and a pull-up or pull-down resistor having a resistance higher than the impedance of the inverter circuits, the resistor being connected to a predetermined node of the inverter circuits, and the oscillator may operate with a source voltage that is lower than the sum of threshold voltages of the inverter circuits.

According to a fourth aspect of the present invention, there is provided a semiconductor integrated circuit having a step-down power source circuit for generating a stepped down source voltage that is lower than the potential of a first power source line and higher than the potential of a second power source line, wherein the stepped down source voltage generated by the step-down power source circuit is increased in accordance with an increase in the temperature of the semiconductor integrated circuit.

The step-down power source circuit may comprise a depletion MOS transistor and a resistor unit, a drain of the depletion MOS transistor being connected to the first power source line, a gate of the depletion MOS transistor being connected to the second power source line, and a source of the depletion MOS transistor being connected to the second power source line through the resistor unit. The step-down power source circuit may further comprise a diode connected enhancement MOS transistor, and the enhancement MOS transistor may be inserted between the depletion MOS transistor and the resistor unit.

The step-down power source circuit may comprise first to "n"th of n pieces of depletion MOS transistors, and first to "n"th of n pieces of resistor unit, drains of the n pieces of depletion MOS transistors being connected to the first power source line, respectively, sources of the n pieces of depletion MOS transistors being connected to the second power source line through the corresponding resistor unit, respectively, a gate of the first depletion MOS transistor being connected to the second power source line, and a gate of the "i"th ("i" being any one of 2 to n) depletion MOS transistor being connected to a source of the "i-1"th depletion MOS transistor.

The step-down power source circuit may further comprise a diode connected enhancement MOS transistor, and the enhancement MOS transistor may be inserted between the "n"th depletion MOS transistor and the corresponding resistor unit. Each source of the depletion and enhancement MOS transistors may be connected to substrate of the semiconductor integrated circuit. The semiconductor integrated circuit may constitute a dynamic random access memory, the stepped down source voltage generated by the step-down power source circuit may be supplied to a self-refresh circuit, the refresh period of the self-refresh circuit may be determined to be shorter in accordance with an increase in the temperature of the semiconductor integrated circuit.

The first power source line may be determined by a high potential power source line supplying a normal high voltage, and the second power source line may be determined by a low potential power source line supplying a normal low voltage. The first power source line may be determined by a super high potential power source line, supplying a super high voltage higher than a normal high voltage, and the second power source line may be determined by a low potential power source line supplying a normal low voltage.

The semiconductor integrated circuit may further comprise a constant current supplying unit connected to an output terminal for outputting the stepped down source voltage of the step-down power source circuit and, thereby, the stepped down source voltage generated by the step-down power source circuit may be maintained to be higher than a specific potential when the temperature is changed to be lower than a predetermined temperature. The constant current supplying unit may comprise a P-channel type MOS transistor.

BRIEF DESCRIPTION OF THE DRAWINGS

The present invention will be more clearly understood from the description of the preferred embodiments as set forth below with reference to the accompanying drawings, wherein:

FIGS. 2A to 2D are waveform diagrams for explaining the operations of the semiconductor memory device shown in FIG. 1;

FIG. 4 is a circuit diagram showing examples of the oscillator circuits and the output control circuit of the semiconductor memory device shown in FIG. 3;

DESCRIPTION OF THE PREFERRED EMBODIMENTS

First, the problems of the prior art in relation to a first aspect of the semiconductor memory device of the present invention will be explained with reference to FIG. 1 and FIGS. 2A to 2D.

Figure 1:
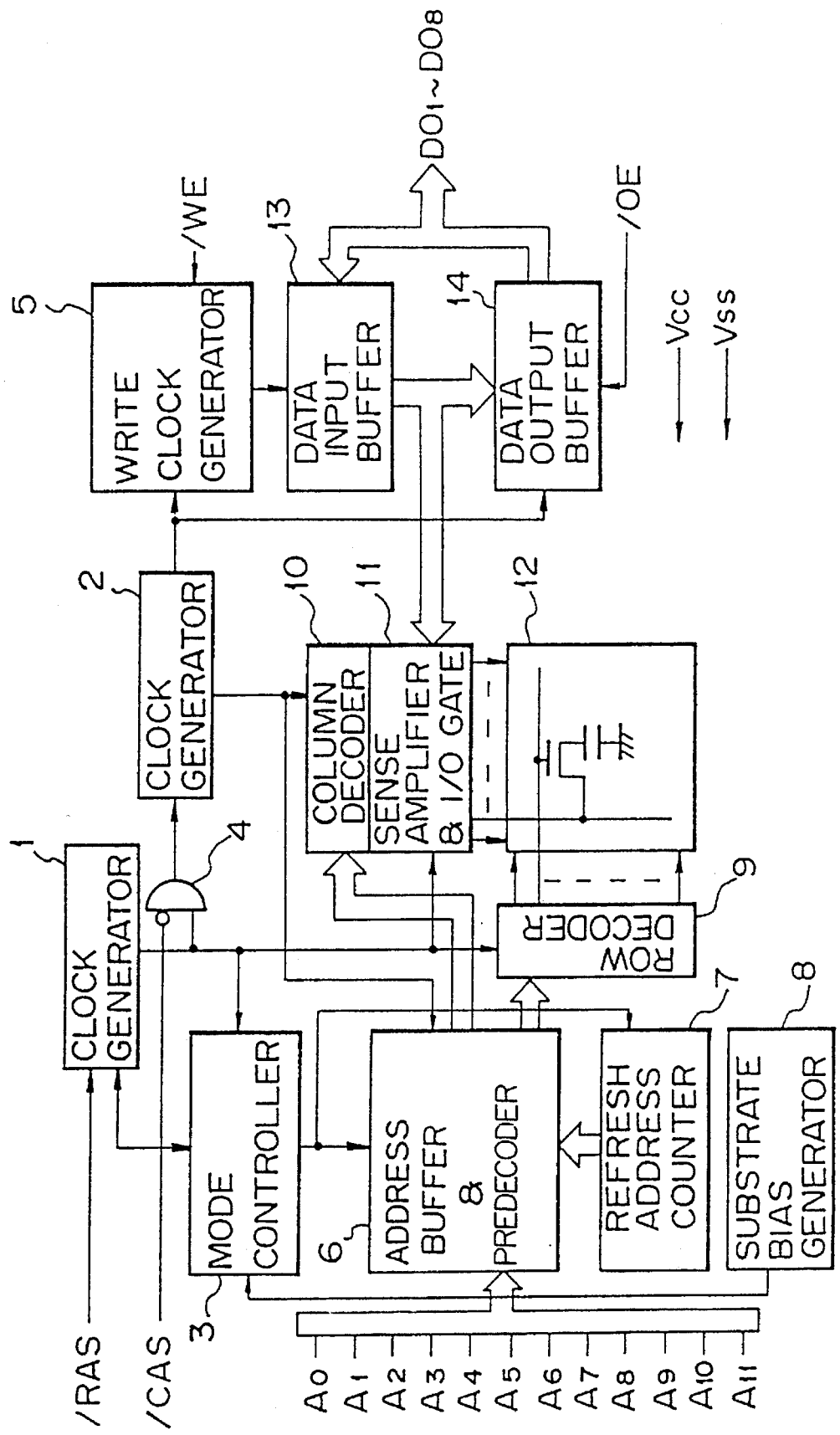
FIG. 1 is a block diagram showing an example of a standard semiconductor memory device according to the prior art.

FIG. 1 shows an example of a standard, or conventional, semiconductor memory device according to the prior art.

As shown in FIG. 1, the conventional semiconductor memory device has clock generators 1 and 2, a mode controller 3, a gate circuit 4, a write clock generator 5, an address buffer plus predecoder 6, a refresh address counter 7, a substrate bias generator 8, a row decoder 9, a column decoder 10, a memory cell array 12, a data input buffer 13, and a data output buffer 14.

FIGS. 2A to 2D show waveform diagrams for explaining the operations of the semiconductor memory device of FIG. 1. Note, FIGS. 2A and 2B show a usual refresh operation in the DRAM, and FIGS. 2C and 2D show a self-refresh operation of the DRAM according to a self-refresh function.

As shown in FIGS. 2A and 2B, a user refreshes cells of the conventional DRAM by causing a signal /CAS to fall at first and a signal /RAS (where, the mark "/" corresponds a top bar indicating an inverted signal) to sequentially change in predetermined periods.

In a system (for example, a personal computer) employing usual DRAMs, data stored in cells of the DRAMs will disappear when a power source is turned OFF. Accordingly, the stored data are saved in a separate storage medium (for example, a magnetic floppy disk) before the power source is turned OFF. Recently proposed DRAMs automatically carry out a refresh operation (a self-refresh operation) by themselves when power sources are turned OFF for all drivers except for the DRAMs. Data stored in such DRAMs having the self-refresh function, therefore, are not required to be saved in other storage media such as magnetic floppy disks.

In the DRAM having the self-refresh function and as shown in FIGS. 2C and 2D, a signal vCAS falls at first, a signal /RAS then falls, and a certain period (for example, 100 μsec.) after the fall of the signal /RAS, a self-refresh mode starts to automatically refresh cells. The mode controller 3 determines a CBR (CAS Before RAS) and the self-refresh mode. The refresh address counter 7 provides internal addresses to sequentially refresh the cells.

According to this conventional semiconductor memory device, a user is unable to tell which cells have been refreshed so far when turning ON a power source to start a system employing the memory. Accordingly, errors may happen in data stored in the DRAM depending on the situation of use.

Next, embodiments of a first aspect of a semiconductor memory device according to the present invention will be explained with reference to FIGS. 3 to 7.

Figure 3B:
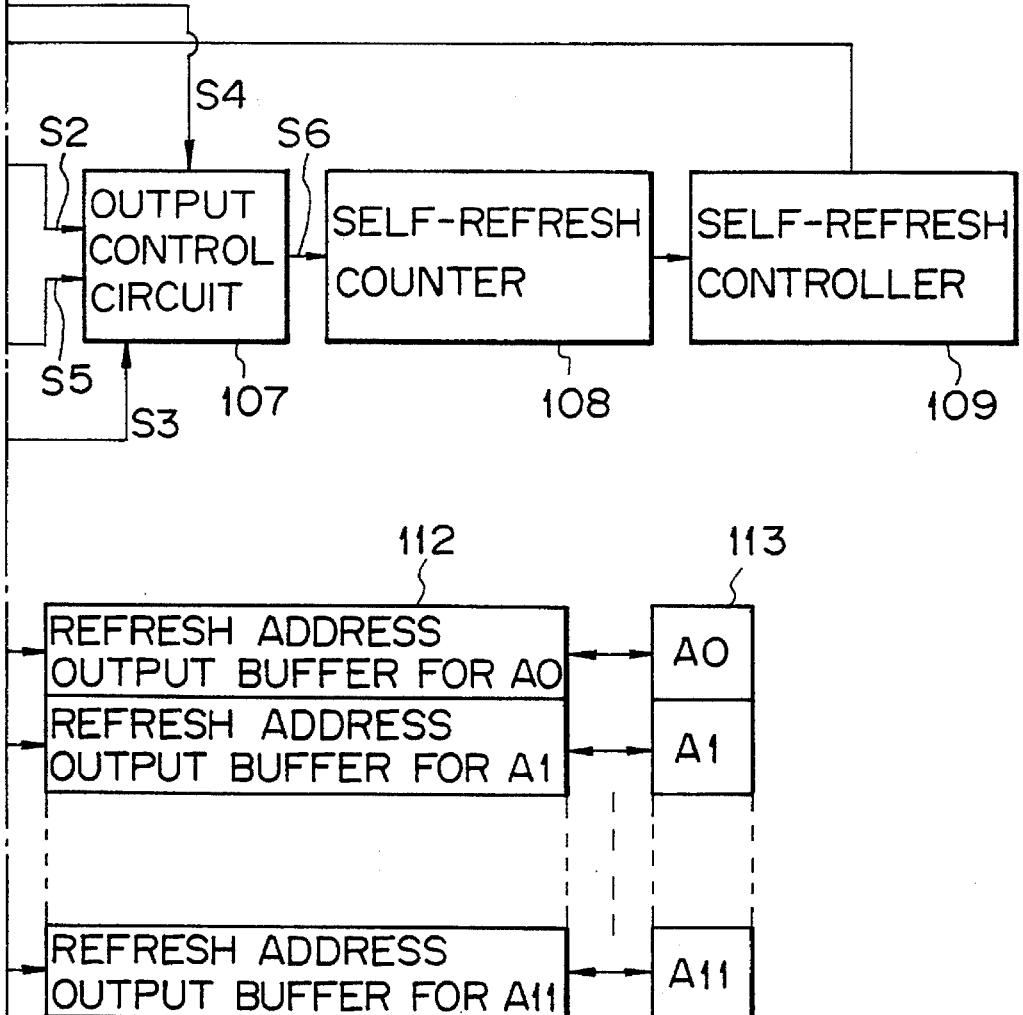
FIG. 3, consisting of FIGS. 3A and 3B, is a block diagram showing an embodiment of a first aspect of a semiconductor memory device according to the present invention.

FIG. 3, which consists of FIGS. 3A and 3B, shows an embodiment of the first aspect of the semiconductor memory device according to the present invention.

As shown in FIG. 3 (FIGS. 3A and 3B), the semiconductor memory device has clock generators 101 and 102, a CBR decision circuit 103, a switch circuit 104, oscillator circuits 105 and 106, an output control circuit 107, a self-refresh counter 108, a self-refresh controller 109, a refresh address detection circuit 110, refresh address counters 111, refresh address output buffers 112, and address input terminals 113.

The refresh address counters 111, refresh address output buffers 112, and address input terminals 113 are arranged for addresses A0 to A11, respectively. The oscillator circuit 105 generates a pulse signal having a short period. The oscillator circuit 106 generates a pulse signal having a long period. The self refresh counter 108 and self refresh controller 109 are conventional ones and are used to start or release a self refresh mode in response to an output of the output control circuit 107.

The CBR decision circuit 103 of the semiconductor memory device of this embodiment detects, for example, a fall of a signal /CAS and then a fall of a signal /RAS and determines a CBR (CAS Before RAS). The self-refresh counter 108 and self-refresh controller 109 detect an elapse of given time (for example, 100 μsec.) after the CBR and start a self-refresh mode. In the self-refresh mode, external addressing is blocked, and the refresh address counters 111 supply internal addresses to successively refresh cells. The refresh address detection circuit 110 detects counts in the refresh address counters 111 for addresses A0 to A11, respectively. The output control circuit 107 controls outputs of the two oscillator circuits 105 and 106 in response to an output signal S3 of the refresh address detection circuit 110.

During the self-refresh mode, the signal /RAS rises to level HIGH, thereby to release the self-refresh mode. If the last cell is not refreshed yet at this moment, the output control circuit 107 releases the self-refresh mode only after determining, according to the output signal S3 of the refresh address detection circuit 110, that all cells have been refreshed. The output signal S3 is changed to a given level (for example, level LOW) when cells at all addresses are refreshed. Before and after the self-refresh mode, the output control circuit 107 switches from the oscillator circuit 106 for generating a pulse signal having a long period to the oscillator circuit 105 for generating a pulse signal having a short period, to refresh cells.

In this way, when the signal /RAS rises to level HIGH to release the self-refresh mode, during the self-refresh mode, the output control circuit 107 of the semiconductor memory device according to the present invention continues the self-refresh mode until the output signal S3 of the refresh address detection circuit 110 indicates that all cells have been refreshed.

FIG. 4 shows examples of the oscillator circuits 105 and 106 and the output control circuit 107 of the semiconductor memory device shown in FIG. 3.

As shown in FIG. 4, the oscillator circuit 105 has PMOS (P-channel type Metal Oxide Semiconductor) transistors 151, inverters 152, and NMOS (N-channel type Metal Oxide Semiconductor) transistors 153. The oscillator circuit 106 has PMOS transistors 161, inverters 162, and NMOS transistors 163. In each of the oscillator circuits 105 and 106, the number of the inverters 152 (162) is odd and the inverters are connected in series. The number of the inverters 152 of the oscillator circuit 105 is smaller than the number of the inverters 162 of the oscillator circuit 106. The oscillator circuit 105 provides an output pulse signal S2, and the oscillator circuit 106 provides an output pulse signal S5. The period of the output signal S2 is shorter than that of the output signal S5.

The gates of the NMOS transistors 153 of the oscillator circuit 105 directly receive a signal S1 (for example, the signal /RAS). The gates of the NMOS transistors 163 of the oscillator circuit 106 receive an inversion of the signal S1 through an inverter 141. When the signal S1 is at low level, the oscillator circuit 106 is activated, and when it is at high level, the oscillator circuit 105 is activated.

The output control circuit 107 has NAND gates 171 and 173 and an OR gate 172. The output S2 of the oscillator circuit 105 is supplied to the 3-input NAND gate 171, and the output S5 of the oscillator circuit 106 is supplied to the 2-input OR gate 172. A signal S4 (for example, the signal /RAS) is supplied to the NAND gate 171 and OR gate 172. The output signal S3 of the refresh address detection circuit 110 is supplied to the other input of the NAND gate 171. Outputs of the NAND gate 171 and OR gate 172 are supplied to the 2-input NAND gate 173. An output S6 of the NAND gate 173 is supplied to the self-refresh counter 108.

Note, during the CBR and self-refresh operation, the signal S1 becomes level LOW to activate the oscillator circuit 106 so that the signal S6 corresponding to the output S5 of the oscillator circuit 106 is supplied to the self-refresh counter 108. When the signal S1 becomes level HIGH, the oscillator circuit 105 is activated. Only when the signal S3 is at level HIGH, the signal S6 corresponding to the output S2 of the oscillator circuit 105 is supplied to the self-refresh counter 108. When the signal S3 (the output signal of the refresh address detection circuit 110) is at level HIGH, the output S2 of the oscillator circuit 105 is not supplied as the signal S6. The signals S1 and S4 become level LOW only for the CBR and self-refresh operation and become level HIGH in other occasions.

Figure 5:
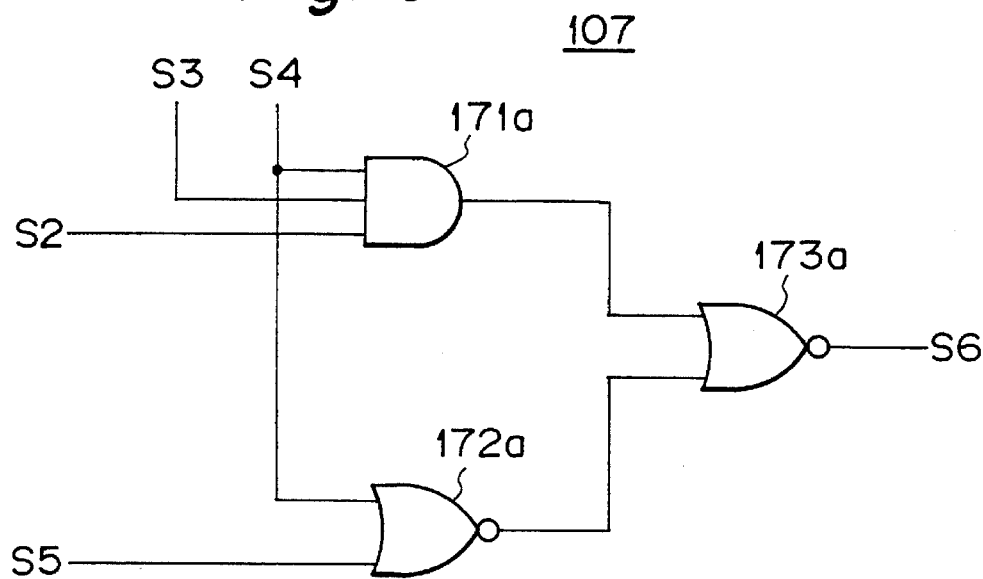
FIG. 5 is a circuit diagram showing another example of the output control circuit of the semiconductor memory device shown in FIG. 3.

FIG. 5 shows an example of an output control circuit of the semiconductor memory device shown in FIG. 3.

As shown in FIG. 5, the output control circuit 107 has an AND gate 171a, a NOR gate 172a, and a NOR gate 173a. These gates correspond to the NAND gate 171, OR gate 172, and NAND gate 173 of FIG. 4. The operation of the circuit of FIG. 5 is the same as that of FIG. 4.

Figure 6:
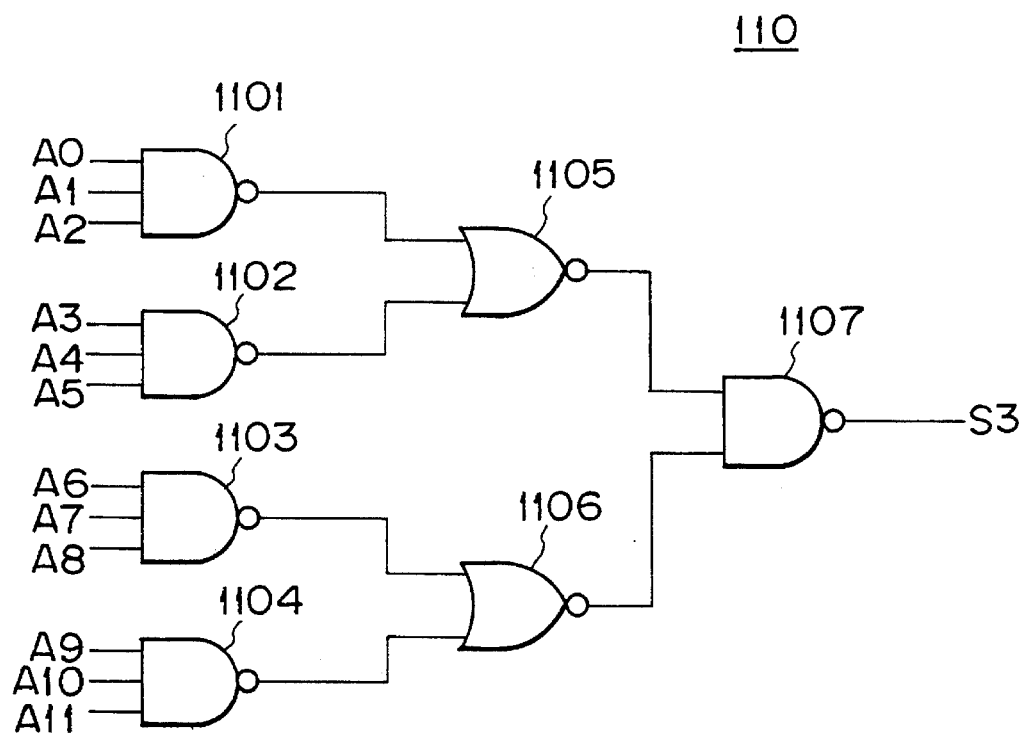
FIG. 6 is a circuit diagram showing an example of the refresh address detection circuit of the semiconductor memory device shown in FIG. 3.

FIG. 6 shows an example of the refresh address detection circuit of the semiconductor memory device shown in FIG. 3.

As shown in FIG. 6, the refresh address detection circuit 110 has four 3-input NAND gates 1101, 1102, 1103, and 1104, two NOR gates 1105 and 1106, and a NAND gate 1107. The NAND gates 1101 to 1104 receive outputs of the refresh address counters 111 for the addresses A0 to A11. Accordingly, the output signal S3 of the refresh address detection circuit 110 will be at level HIGH if at least one of the signals A1 to A11 (the outputs of the refresh address counters 111) supplied to the NAND gates 1101 to 1104 is at level LOW.

Figure 7:
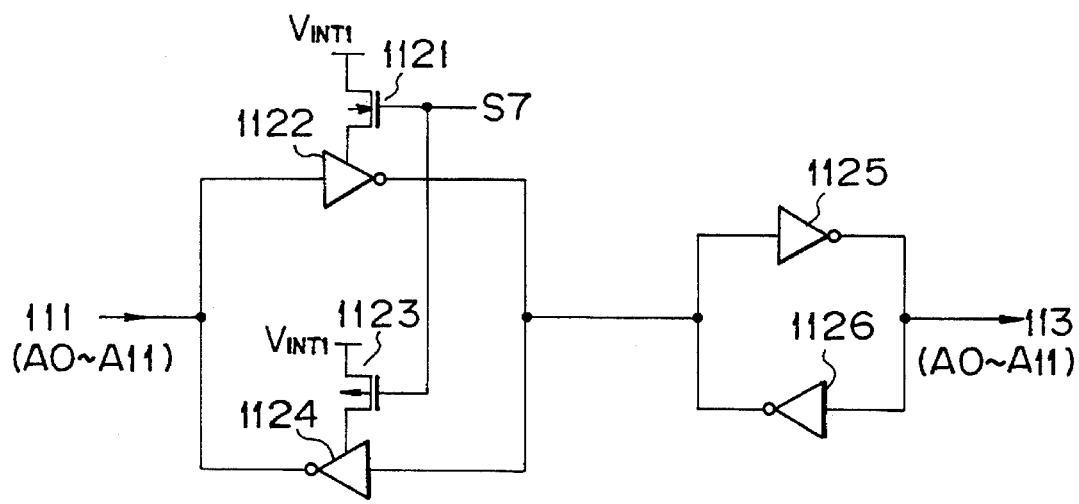
FIG. 7 is a circuit diagram showing an example of the refresh address output buffer of the semiconductor memory device shown in FIG. 3.

FIG. 7 shows another an example of the refresh address output buffer of the semiconductor memory device shown in FIG. 3.

The refresh address buffers 112 are disposed between the refresh address counters 111 for the addresses A1 to A11 and the address input terminals 113. Each refresh address output buffer 112 has an NMOS transistor 1121, an PMOS transistor 1123, and inverters 1122, 1124, 1125, and 1126. A signal S7 is supplied to the gates of the transistors 1121 and 1123 to switch a terminal 113 to receive an address signal or a refresh address. The signal S7 becomes HIGH for the CBR and self refresh operation and becomes LOW for other occasions.

Namely, when the signal S7 is at level LOW, the inverter 1124 is activated to transfer an address input signal, supplied to the input terminal 113, to the inside. When the signal S7 is at level HIGH, the inverter 1122 is activated to transfer a refresh address for a self-refresh operation to the outside through the terminal 113.

Therefore, the semiconductor memory device according to the embodiment of the present invention automatically activates the oscillator circuit 105 having a short period to completely refresh all cells before releasing a self-refresh mode or when the cells are not completely refreshed. The address input terminals 113 are used commonly for input and output operations, so that it is possible to inform outside which cells have been refreshed so far.

As explained above, according to the first aspect of the semiconductor memory device of the present invention, there is provided a semiconductor memory device that automatically refreshes all cells when the cells are not completely refreshed. Namely, the semiconductor memory device of the present invention continues a refresh operation until all cells are refreshed and informs outside which cells have been refreshed, thereby preventing errors in data stored in the DRAM.

Next, the problems of the prior art and embodiments of a second aspect of the semiconductor memory device according to the present invention will be explained.

Figure 8:
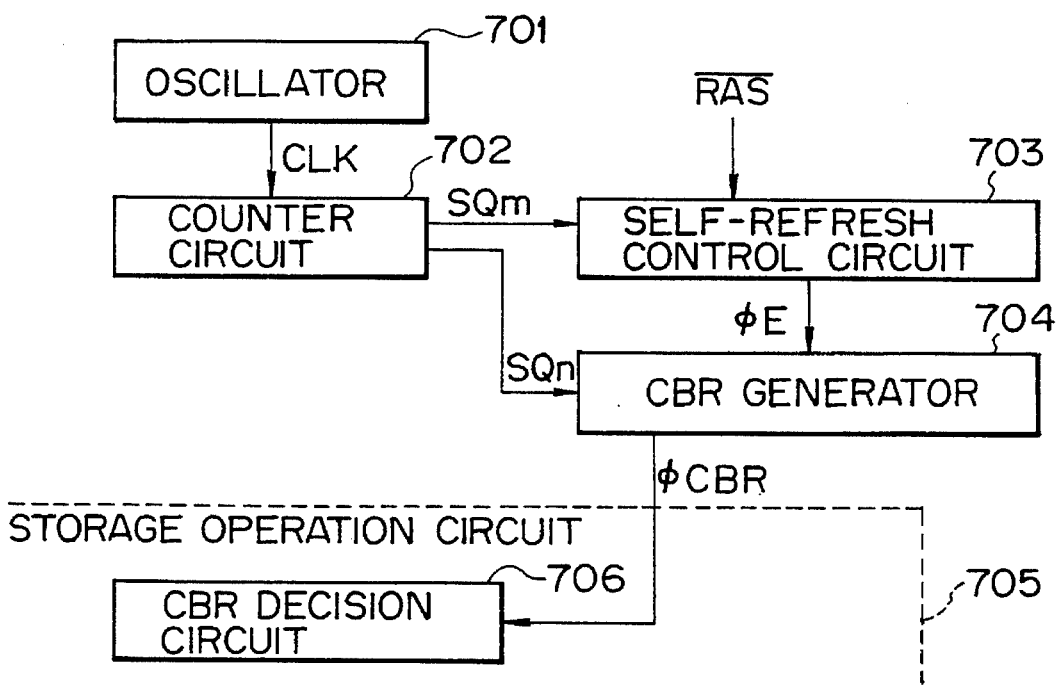
FIG. 8 is a block diagram showing a part of the semiconductor memory device according to the prior art.

FIG. 8 shows a part of the semiconductor memory device (DRAM) according to the prior art. In FIG. 8, reference numeral 701 denotes an oscillator, 702 denotes a counter circuit, 703 denotes a self-refresh control circuit, 704 denotes a CBR generation circuit, 705 denotes a storage operation circuit, and 706 denotes a CBR decision circuit.

The oscillator 701 provides a counter circuit 702 with a clock signal CLK having a constant frequency. When the counter circuit 702 counts a predetermined number of pulses of the clock signal CLK, it provides a self-refresh control circuit 703 with an output signal SQm and a CBR generator 704 with an output signal SQn.

The output signal SQm activates the self-refresh control circuit 703 to start a self-refresh mode. The output signal SQn sets a period of the refresh operation of memory cells. When receiving the output signal SQm of the counter circuit 702 as well as a control signal /RAS of level LOW, the self-refresh control circuit 703 provides the CBR generator 704 with a self-refresh mode signal $\phi E$.

When receiving the output signal SQn of the counter circuit 702 as well as the self-refresh mode signal $\phi E$, the CBR generator 704 provides a CBR decision circuit 706 with a refresh period signal $\phi CBR$ according to the timing determined by the output signal SQn. The CBR decision circuit 706 is one of peripheral circuits disposed in a DRAM 705.

According to the refresh period signal $\phi CBR$, the CBR decision circuit 706 drives the peripheral circuits of the DRAM 705, so that the memory cells are refreshed within the period of the refresh period signal $\phi CBR$.

In order to reduce the power consumption of a self-refresh operation of the DRAM, it is necessary to extend the period of the refresh period signal $\phi CBR$, to thereby extend intervals of refreshing the memory cells. If the refresh period is extended beyond a specified value, cell data will not be correctly kept. Accordingly, the elongation of the refresh period is not suitable for reducing the power consumption.

Figure 9:
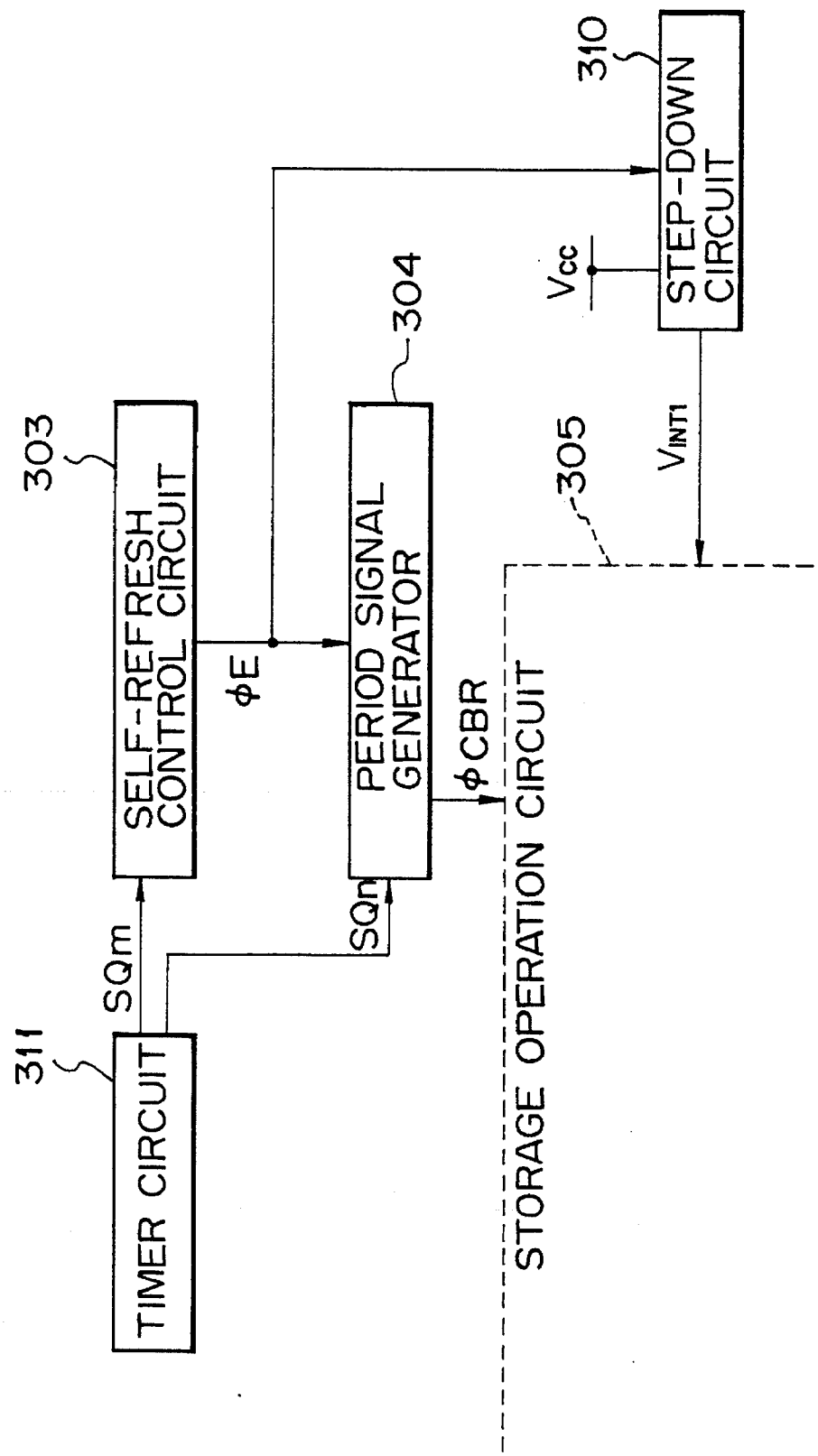
FIG. 9 is a block diagram showing a principle of a second aspect of a semiconductor memory device according to the present invention.

FIG. 9 shows a principle of a second aspect of a semiconductor memory device according to the present invention. As shown in FIG. 9, the semiconductor memory device has a timer circuit 311, a self-refresh control circuit 303, a period signal generator 304, a storage operation circuit 305. The timer circuit 311 is used to provide first and second time-up signals SQm and SQn, and the self-refresh control circuit 303 is used to provide an output signal $\phi E$ for selecting a self-refresh mode in response to the first time-up signal SQm of the timer circuit 311. The period signal generator 304 is used to provide a refresh period signal $\phi CBR$ for determining the period of a refresh operation, in response to the second time-up signal SQn of the timer circuit 302 and the output signal of the self-refresh control circuit 303, and the storage operation circuit 305 is used to self-refresh cell data according to the refresh period signal φCBR. The semiconductor memory device further has a power source step-down circuit 310, which is used to supply a stepped down source voltage $V_{INT^1}$ to the storage operation circuit 305 by dropping a standard source voltage Vcc in response to the output signal φE of the self-refresh control circuit 303.

Figure 10B:
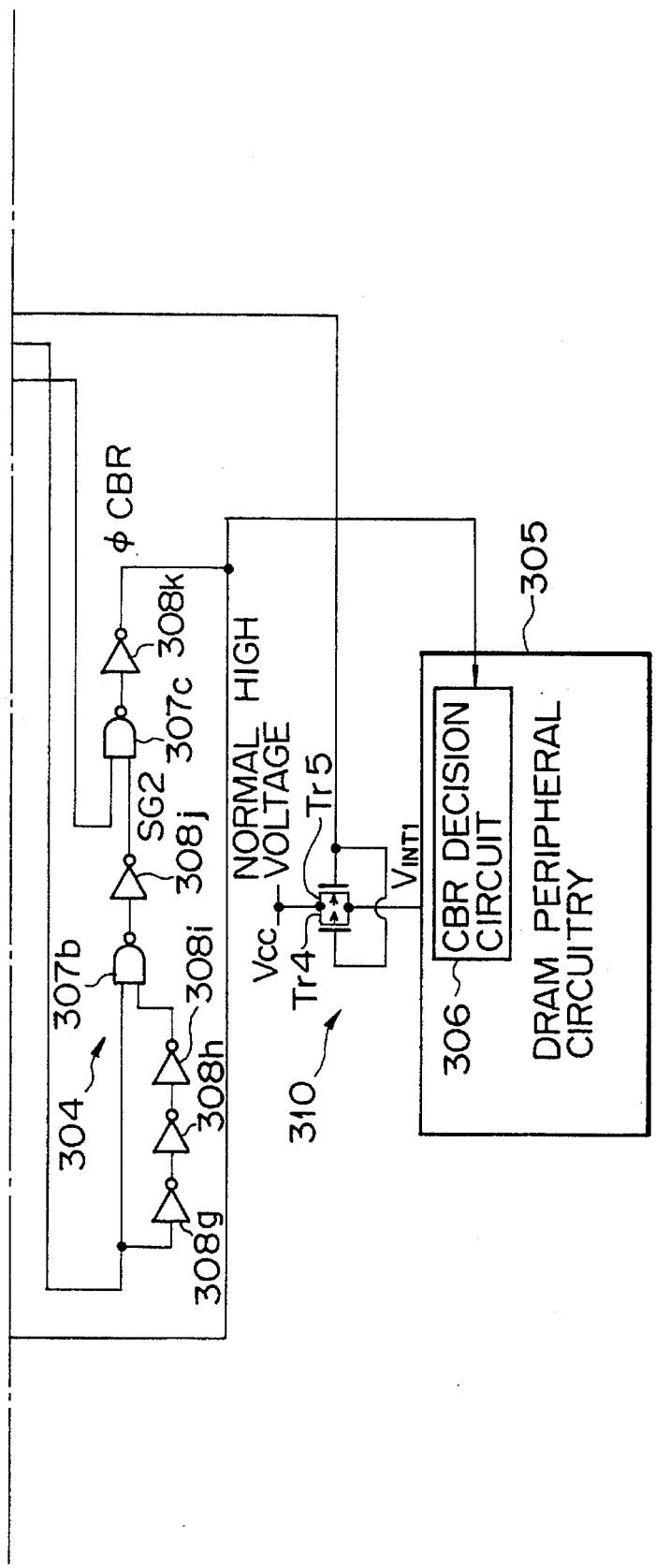
FIG. 10, consisting of FIGS. 10A and 10B, is a circuit diagram showing an embodiment of a second aspect of a semiconductor memory device according to the present invention.

FIG. 10, which consists of FIGS. 10A and 10B, shows an embodiment of a second aspect of a semiconductor memory device according to the present invention. In FIGS. 10A and 10B, the oscillator 301 is a ring oscillator having an odd number of inverter circuits connected to one another in a ring shape. An output signal of the oscillator is supplied as a clock signal CLK to a counter circuit 302. The counter circuit 302 is a shift register involving multiple stages of flip-flop circuits connected in series. The first flip-flop circuit receives the clock signal CLK.

Output signals SQ0 to SQn of the flip-flop circuits sequentially become level HIGH in response to pulses of the clock signal CLK. Accordingly, the oscillator 301 and counter circuit 302 form a timer circuit. The output signals SQ0 to sQn of the flip-flop circuits may be properly picked up to provide different time-up signals. The output signal SQm of the "m"th 30 flip-flop circuit in the counter circuit 302 is provided to a self-refresh control circuit 303. Namely, in the self-refresh control circuit 303, an input terminal of a NAND circuit 307a receives the output signal SQm, while the other input terminal of the NAND circuit 307a receives the output signal SQm through an odd number of inverter circuits 308a to 308c.

The NAND circuit 307a and inverter circuits 308a to 308c form a one-shot pulse generator. When the output signal SQm of the counter circuit 302 rises from level LOW to level HIGH, the NAND circuit 307a provides a pulse signal of level LOW having a pulse width corresponding to a delay time due to the inverter circuits 308a to 308c.

The output signal of the NAND circuit 307a is provided to the gate of an N-channel type MOS transistor Tr1 through an inverter circuit 308d. The source of the transistor Tr1 is connected to a ground GND, and the drain of the transistor Tr1 is connected to the source of an N-channel type MOS transistor Tr2. The drain of the transistor Tr2 is connected to a latch circuit 309. An output signal of the latch circuit 309 is supplied to the gate of the transistor Tr2 through an inverter 308e. An output signal of the inverter 308e is supplied to an inverter circuit 308f, which provides a self-refresh mode signal φE. An output terminal of the latch circuit 309 is connected to the drain of an N-channel type MOS transistor Tr3. The gate of the transistor Tr3 receives a control signal /RAS, and the source thereof is connected to the ground GND.

The self-refresh control circuit 303 is arranged in this way. When the control signal /RAS falls from level HIGH to level LOW to turn OFF the transistor Tr3 and when the output signal SQm of the counter circuit 302 rises from level LOW to level HIGH, the inverter circuit 308d provides a pulse signal SG1 of level HIGH having a pulse width determined by the delay time of the inverter circuits 308a to 308c. Then, the transistors Tr1 and Tr2 are turned ON to provide the latch circuit 309 with a signal of level LOW. This maintains the output of the latch circuit 309 at level HIGH. The output of the inverter circuit 308e becomes LOW to turn OFF the transistor Tr2. Then, the output signal φE of the inverter circuit 308f becomes HIGH.

The output signal SQn of the "n"th flip-flop circuit in the counter circuit 302 and the output signal φE of the self-refresh control circuit 303 are provided to a CBR generator 304. The output signal φE is also supplied to the power source step-down circuit 310. In the CBR generator 304, an input terminal of a NAND circuit 307b receives the output signal SQn, and the other input terminal thereof receives the same output signal sQn through an odd number of inverter circuits 308g to 308i.

The NAND circuit 307b and inverter circuits 308g to 308i form a one-shot pulse generator. When the output signal SQn of the counter circuit 302 rises from level LOW to level HIGH, the NAND circuit 307b provides a pulse signal of level LOW having a pulse width corresponding to a delay time due to the inverter circuits 308g to 308i. The output signal of the NAND circuit 307b is supplied to an input terminal of a NAND circuit 307c through an inverter circuit 308j. The output signal φE of the self-refresh control circuit 303 is supplied to the other input terminal of the NAND circuit 307c.

When receiving a pulse signal SG2 of level HIGH from the inverter circuit 308j as well as the output signal φE of level HIGH, the NAND circuit 307c provides a pulse signal of level LOW. Then, an inverter circuit 308k provides a CBR decision circuit 306 in a DRAM peripheral circuitry (peripheral circuits of DRAM) 305 with a pulse signal of level HIGH as a refresh period signal φCBR. The power source step-down circuit 310 has a P-channel type MOS transistor Tr4 and an N-channel type MOS transistor Tr5 connected in parallel with each other between a power source Vcc and the DRAM peripheral circuitry 305. The gates of the transistors Tr4 and Tr5 receive the output signal φE from the self-refresh control circuit 303.

When the output signal φE rises to level HIGH, the transistor Tr5 is turned ON, so that the DRAM peripheral circuitry 305 receives a stepped down source voltage $V_{INT^1}$ derived by dropping the source voltage Vcc by the threshold of the transistor Tr5. When the output signal φE falls to level LOW, the transistor Tr4 is turned ON so that the source voltage Vcc is substantially supplied to the DRAM peripheral circuitry 305.

Figure 11B:
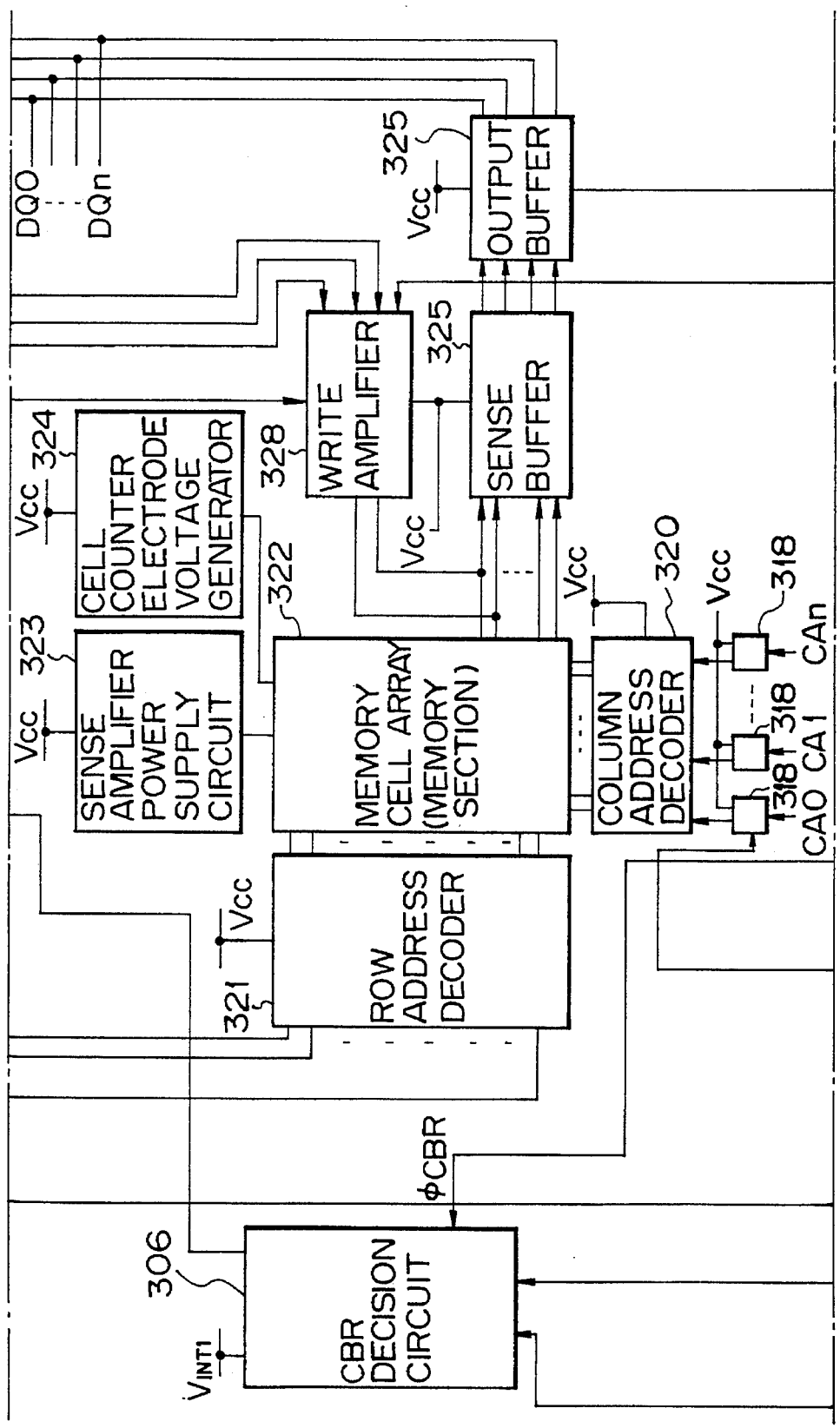
FIG. 11, consisting of FIGS. 11A to 11C, is a block diagram showing peripheral circuits of the semiconductor memory device shown in FIG. 10.
Figure 11C:
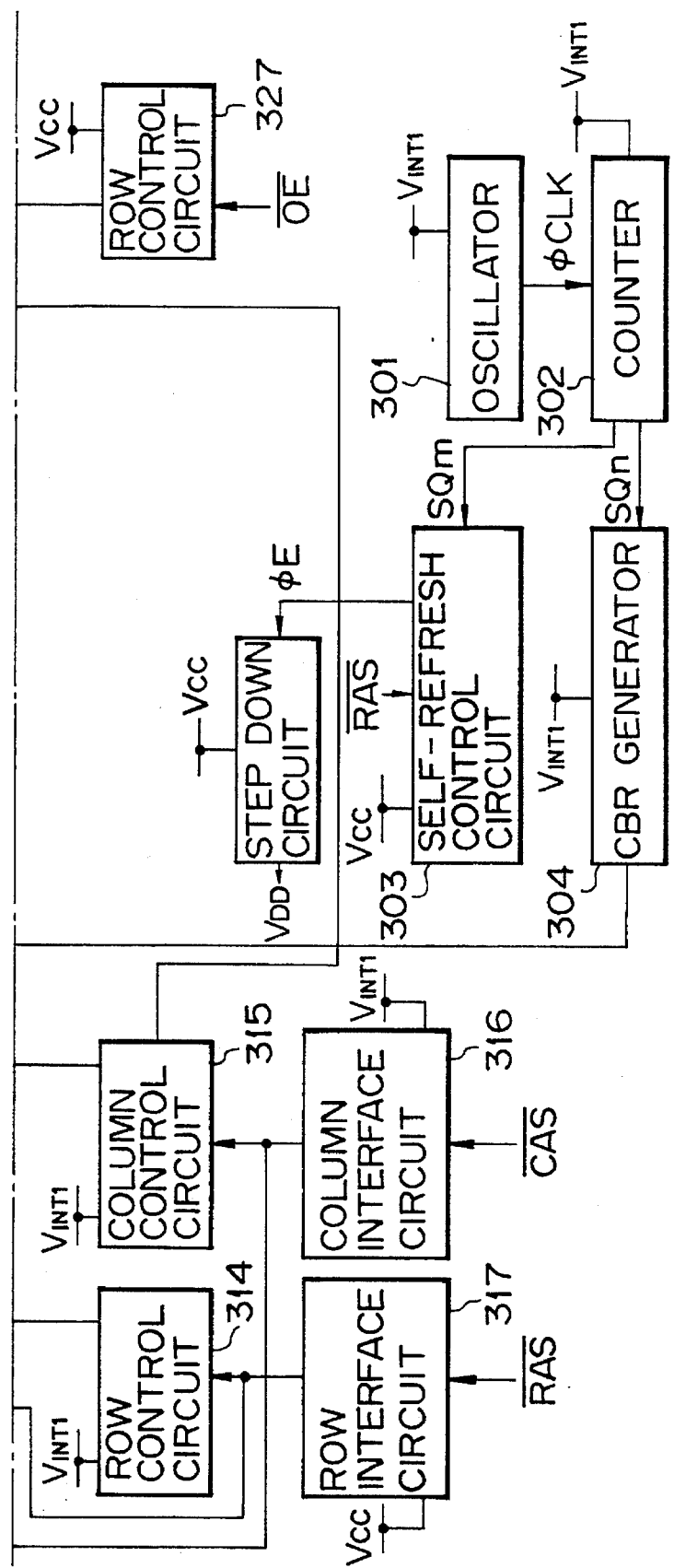

FIG. 11, which consists of FIGS. 11A to 11C, shows peripheral circuits of the semiconductor memory device (DRAM peripheral circuitry 305) shown in FIG. 10. In a self-refresh operation, the power source step-down circuit 310 provides the stepped down source voltage $V_{INT^1}$ to row address buffers 312, a CBR counter 313, the CBR decision circuit 306, a row control circuit 314, a column control circuit 315, and a column interface circuit 316. The remaining circuits receive the source voltage Vcc.

The operations of the DRAM peripheral circuitry 305 will be explained. A row interface circuit 317 converts the control signal /RAS into a signal of CMOS level, which is supplied to the row control circuit 314 and CBR decision circuit 306. The column interface circuit 316 converts a control signal/CAS into a signal of CMOS level, which is supplied to the column control circuit 315 and CBR decision circuit 306. The row control circuit 314 determines the status of the control signal /RAS and provides an output signal to the row address buffers 312. When the control signal /RAS falls to level LOW, the row address buffers 312 latch row address signals RA0 to RAn according to the output signal of the row control circuit 314 and provides the row address signals to an address selector 319.

The column control circuit 315 determines the status of the control signal /CAS and provides an output signal to column address buffers 318. When the control signal /CAS falls to level LOW, the column address buffers 318 latch column address signals CA0 to CAn in response to the output signal of the column control circuit 315 and provides the column address signals to a column address decoder 320.

According to the output signals of the column interface circuit 316 and row interface circuit 317, the CBR decision circuit 306 determines whether or not it is a self-refresh mode. When it is the self-refresh mode, the CBR decision circuit 306 provides an output signal to the CBR counter 313 according to the refresh period signal φCBR.

According to the output signal of the CBR decision circuit 306, the CBR counter 313 provides the address selector 319 with an address signal for carrying out a self-refresh operation. In the self-refresh mode, the address selector 319 provides a row address decoder 321 with the address signal provided by the CBR counter 313.

In a normal write or read operation, the address selector 319 provides the row address decoder 321 with address signals RA0 to RAn provided by the row address buffers 312. A memory cell array (memory section) 322 includes many memory cells and sense amplifiers. The sense amplifiers are arranged for columns, respectively. Output signals from the row address decoder 321 and column address decoder 20 select the memory cells in the memory cell array 322. In the normal write or read operation, the memory cells in the memory cell array 322 are selected according to the externally provided address signals RA0 to RAn.

In a self-refresh mode, the memory cells in the memory cell array 322 are sequentially selected according to the address signals provided by the CBR counter 313 and are self-refreshed. The memory cell array 322 is connected to a sense amplifier power supply circuit 323. The sense amplifier power supply circuit 323 supplies the source voltage Vcc to sense amplifiers when data are read out of selected memory cells to bit lines.

The sense amplifiers to which the power source Vcc is supplied amplify the read cell data and latch the same. The latched data are provided to a sense buffer 325. The memory cell array 322 is connected to a cell counter electrode voltage generator 324, which provides a counter potential of Vcc/2 to a charge accumulation node of each memory cell. The sense buffer 325 amplifies the cell data read from the memory cell array 322 and provides the amplified data to an output buffer circuit 326. The output buffer circuit 326 operates according to an output signal of an output control circuit 327. The output control circuit 327 controls the output buffer circuit 326 according to an output control signal /OE.

In the read operation, the read cell data are provided as output data DQ0 to DQn from the output buffer circuit 326 under the control of the output control circuit 327. The memory cell array 322 is connected to a write amplifier 328, which is connected to a write control circuit 329. The write control circuit 329 receives a write control signal /WE. According to the write control signal /WE, the write control circuit 329 controls the write amplifier 328.

In a write operation, write data DQ0 to DQn are externally provided to the write amplifier 328 through data input buffers 330. Under the control of the write control circuit 329, the write amplifier 328 writes the write data DQ0 to DQn to selected memory cells.

Figure 12:
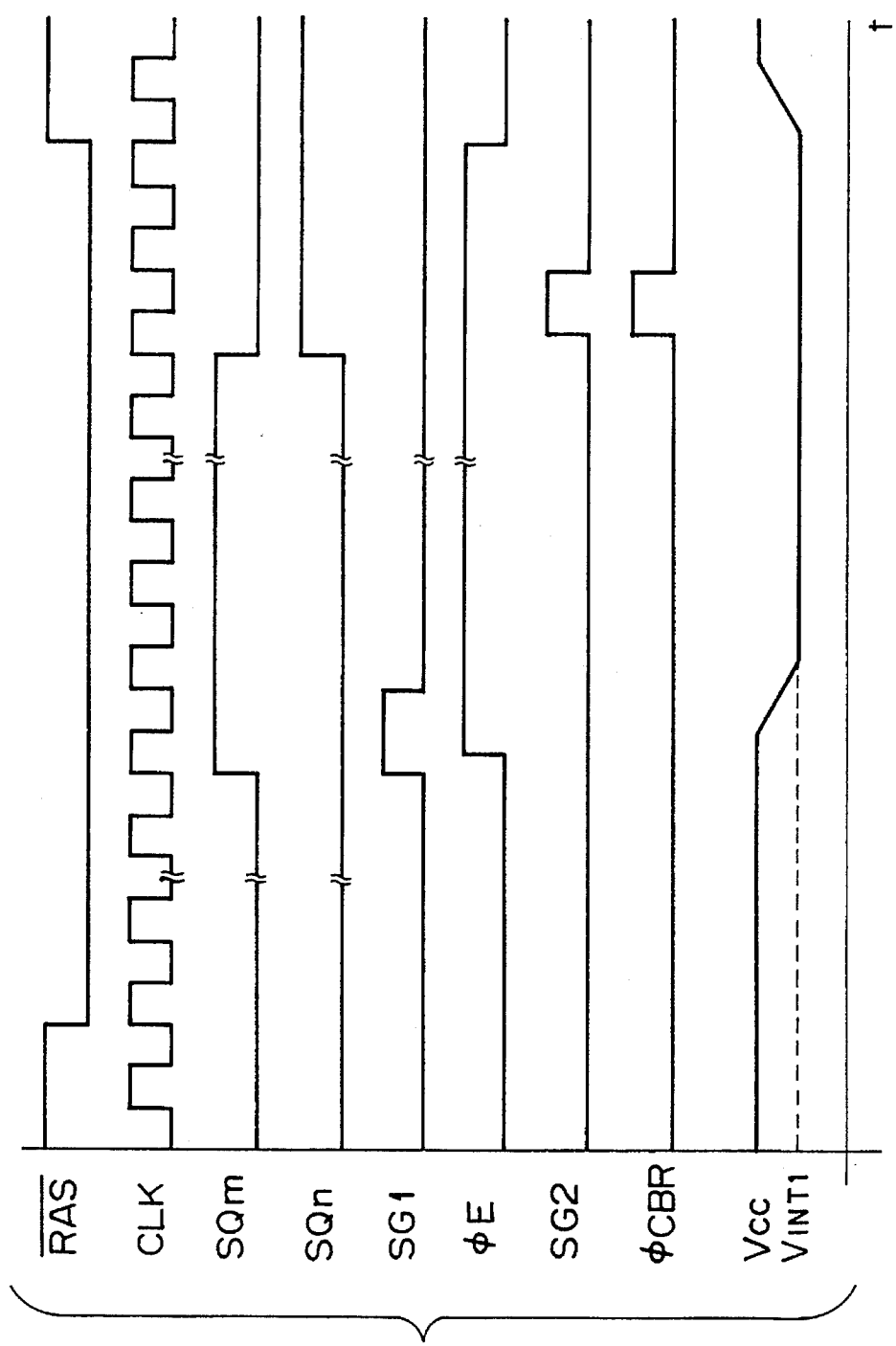
FIG. 12 is a waveform diagram for explaining the operation of the embodiment of the second aspect according to the present invention.

FIG. 12 is a waveform diagram for explaining the operation of the embodiment of the second aspect according to the present invention. A self-refresh operation of the DRAM having such an arrangement will be explained with reference to FIG. 12.

When the control signal /RAS to the self-refresh control circuit 303 rises to level HIGH to turn ON the transistor Tr3, the latch circuit 309 provides an output signal of level LOW. As a result, the output signal φE of the self-refresh control circuit 303 falls to level LOW, and the refresh period signal φCBR provided by the CBR generator 304 is fixed at level LOW. In the power source step-down circuit 310, only the transistor Tr4 is turned ON to supply the source voltage Vcc to the DRAM peripheral circuitry 305. When the self-refresh operation is not carried out, the source voltage Vcc is supplied to the DRAM peripheral circuitry 305, to write or read data to or from the memory cells.

When the control signal /RAS falls to level LOW to turn OFF the transistor Tr3, the self-refresh control circuit 303 is activated. The counter circuit 302 counts pulses of the clock signal CLK provided by the oscillator 301 and provides the self-refresh control circuit 303 with an output signal SQm of level HIGH. The inverter circuit 308d of the self-refresh control circuit 303 provides a pulse signal SG1 of level HIGH. The latch circuit 309 latches the pulse signal SG1, and the output signal φE rises to level HIGH. In the power source step-down circuit 310, only the transistor Tr5 is turned ON to supply the stepped down source voltage $V_{INT^1}$ to the DRAM peripheral circuitry 305. The stepped down source voltage $V_{INT^1}$ is lower than the source voltage Vcc by the threshold of the transistor Tr5.

In response to the output signal φE of the self-refresh control circuit 303, the CBR generator 304 is activated. In response to an output signal SQn of level HIGH provided by the counter circuit 302, the CBR generator 304 provides a pulse signal of level HIGH, i.e., the refresh period signal φCBR. In response to the refresh period signal φCBR, the DRAM peripheral circuitry 305 self-refreshes the memory cells with use of the stepped down source voltage $V_{INT^1}$ provided by the power source step-down circuit 310.

According to the refresh period signal φCBR, the output signals SQo to SQn of the flip-flop circuits of the counter circuit 302 are each reset to level LOW, to start counting again. When the counter circuit 302 again counts n pulses of the clock signal CLK, the refresh period signal φCBR is again provided. According to intervals of the refresh period signal φCBR, cell data in the memory cells of the DRAM are refreshed.

In this way, the DRAM starts a refresh mode with the control signal /RAS falling to level LOW and with the DRAM peripheral circuitry 305 receiving the stepped down source voltage $V_{INT^1}$ derived by dropping the source voltage Vcc.

The DRAM peripheral circuitry 305 carries out a refresh operation according to the stepped down source voltage $V_{INT^1}$, so that the power consumption thereof is small. Although the operation speed of the DRAM peripheral circuitry 305 operating according to the stepped down source voltage $V_{INT^1}$ may become slower, such a decrease in the operation speed will not cause a serious problem in the self-refresh operation.

In the above embodiment of the second aspect according to the present invention, the power source step-down circuit 310 having the P-channel type MOS transistor Tr4 and N-channel type MOS transistor Tr5 supplies power to the DRAM peripheral circuitry 305.

Figure 13:
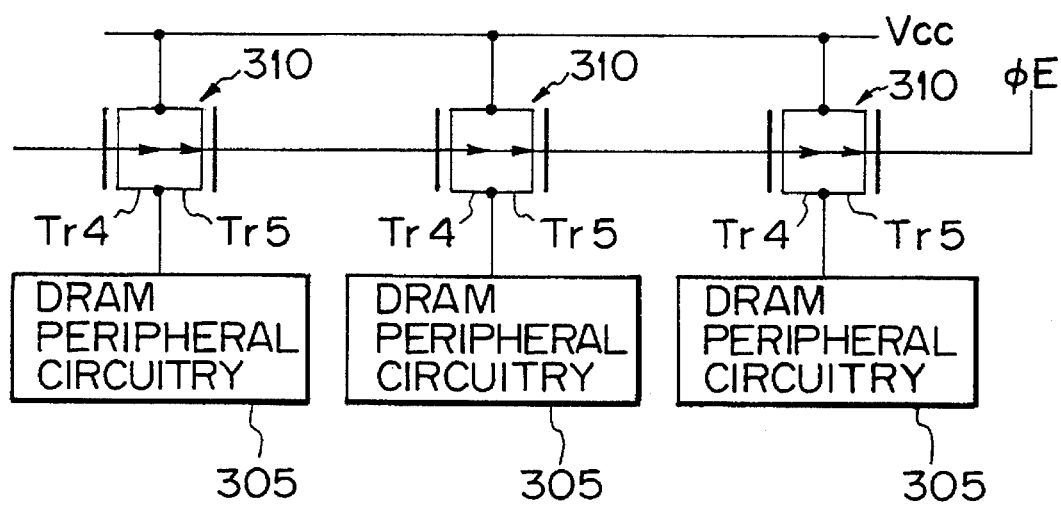
FIG. 13 is a circuit diagram showing another embodiment of a second aspect of a semiconductor memory device according to the present invention.

FIG. 13 shows another embodiment of a second aspect of a semiconductor memory device according to the present invention.

Alternatively, the power source step-down circuit 310 may have an arrangement of FIG. 13. In FIG. 13, there are a plurality of DRAM peripheral circuitry blocks 305 each receiving power from a corresponding power source step-down circuit 310. This arrangement secures sufficient power supply to the respective DRAM peripheral circuitry blocks 305 when a self-refresh mode is switched to a normal mode. Namely, power supply to the respective DRAM peripheral circuitry blocks 305 is quickly switched to a power source Vcc, thereby maintaining an operation speed.

As explained above in detail, according to the second aspect of the present invention, the power consumption of a DRAM having a self-refresh function can be sufficiently reduced.

Next, the problems of the related art and embodiments of a third aspect of the semiconductor memory device according to the present invention will be explained.

Figure 14A:
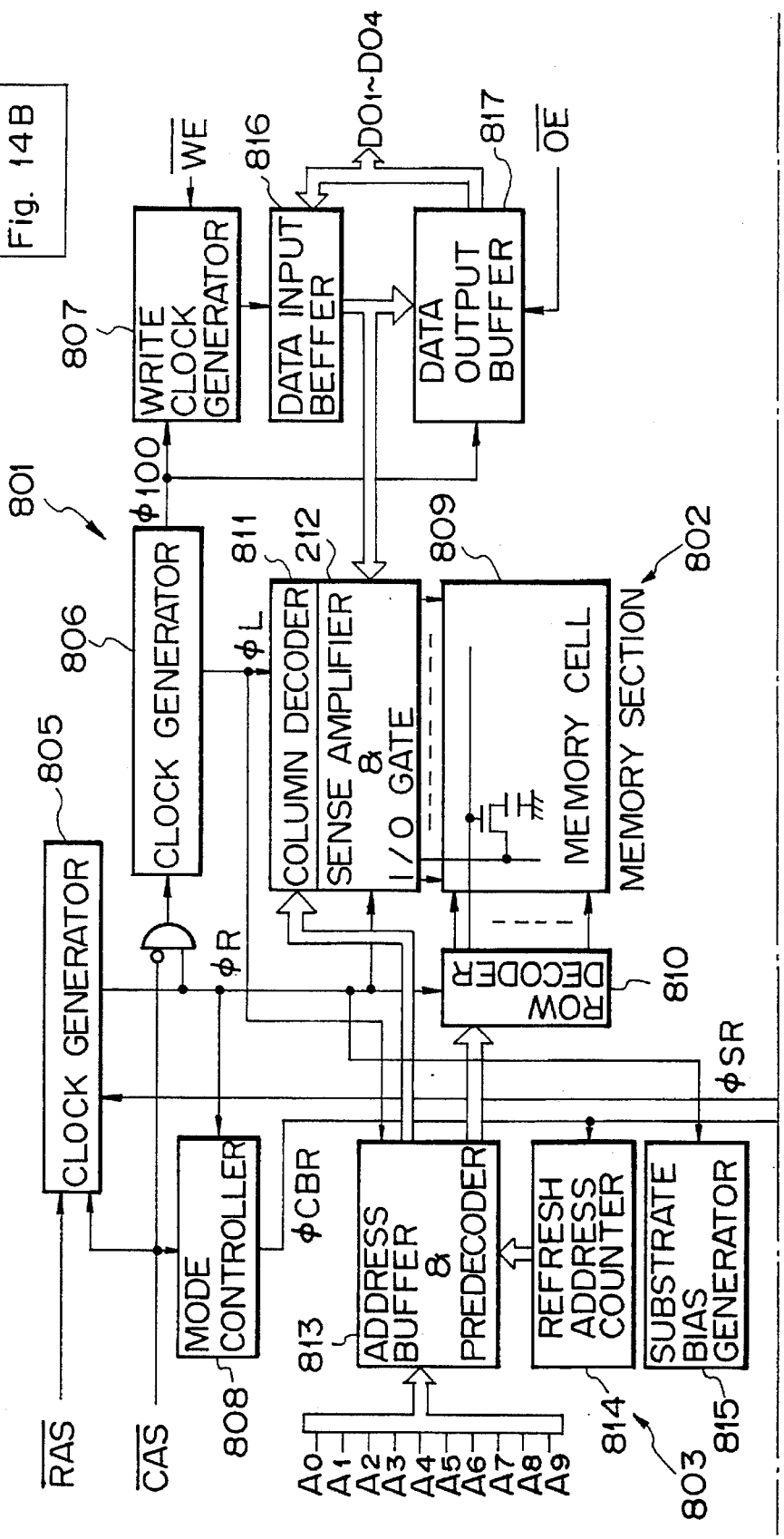
FIG. 14, consisting of FIGS. 14A and 14B, is a block diagram schematically showing a semiconductor memory device according to the related art.
Figure 14B:
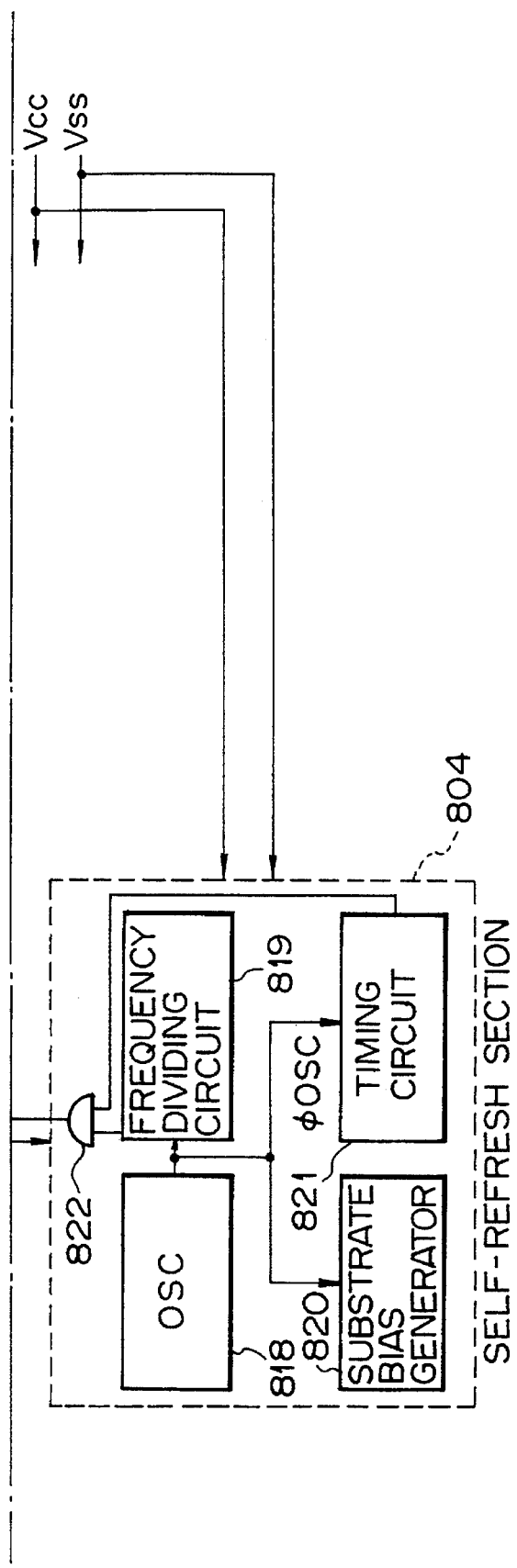

FIG. 14, which consists of FIGS. 14A and 14B, shows a semiconductor memory device of the related art. As shown in FIGS. 14A and 4B, the semiconductor memory device of the related art includes a clock generation section 801, a memory section 802, a memory peripheral section 803, and a self-refresh section 804. The clock generation section 1 includes clock generators 805 and 806, a write clock generator 807, and a mode controller 808. The memory section 802 includes memory cells 809, a row decoder 810, a column decoder 811, and a sense amplifier plus I/O gate 812. The memory peripheral section 803 includes an address buffer plus predecoder 813, a refresh address counter 814, a substrate bias generator 815, a data input buffer 816, and a data output buffer 817. The self-refresh section 804 includes an oscillator 818, a frequency dividing circuit 819, a substrate bias generator 820, a timing circuit 821, and an AND gate 822.

Figure 15:
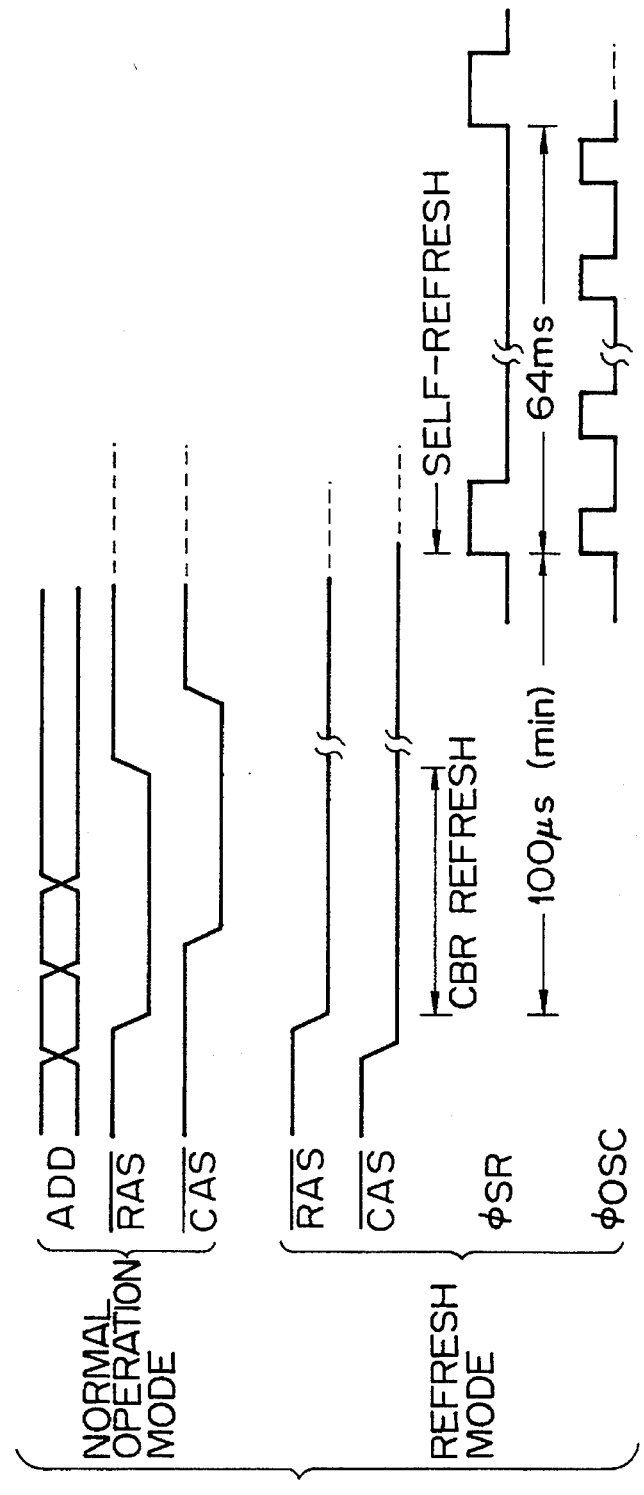
FIG. 15 is a timing chart for explaining the operation of the semiconductor memory device shown in FIG. 14.

FIG. 15 is a timing chart for explaining the operation of the semiconductor memory device shown in FIG. 14.

As shown in FIG. 15, in a normal operation mode, a signal /RAS (where, the mark "/" corresponds a top bar indicating an inverted signal) becomes level LOW, a signal /CAS becomes level LOW, and then a clock signal is supplied.

On the other hand, in a refresh mode, the signal /CAS falls to level LOW at first and then the signal /RAS falls to level LOW to start a CBR (CAS before RAS) refresh mode. This state is kept for a period of 100 μ sec., and then a self-refresh mode is started. This semiconductor memory device employs the same power source voltage Vcc for the self-refresh section 804 as well as for the other circuits, to cause the following problem.

The self-refresh operation is usually carried out with power supplied from a backup power source such as a secondary battery. It is important, therefore, to reduce the consumption of a current during the self-refresh operation, to maintain data for a long time. In practice, the self-refresh section 804 uses the source voltage Vcc that is also used by the other circuits (the clock generation section 801, memory section 802, and memory peripheral section 803), so that the self-refresh operation consumes much power.

Figure 16B:
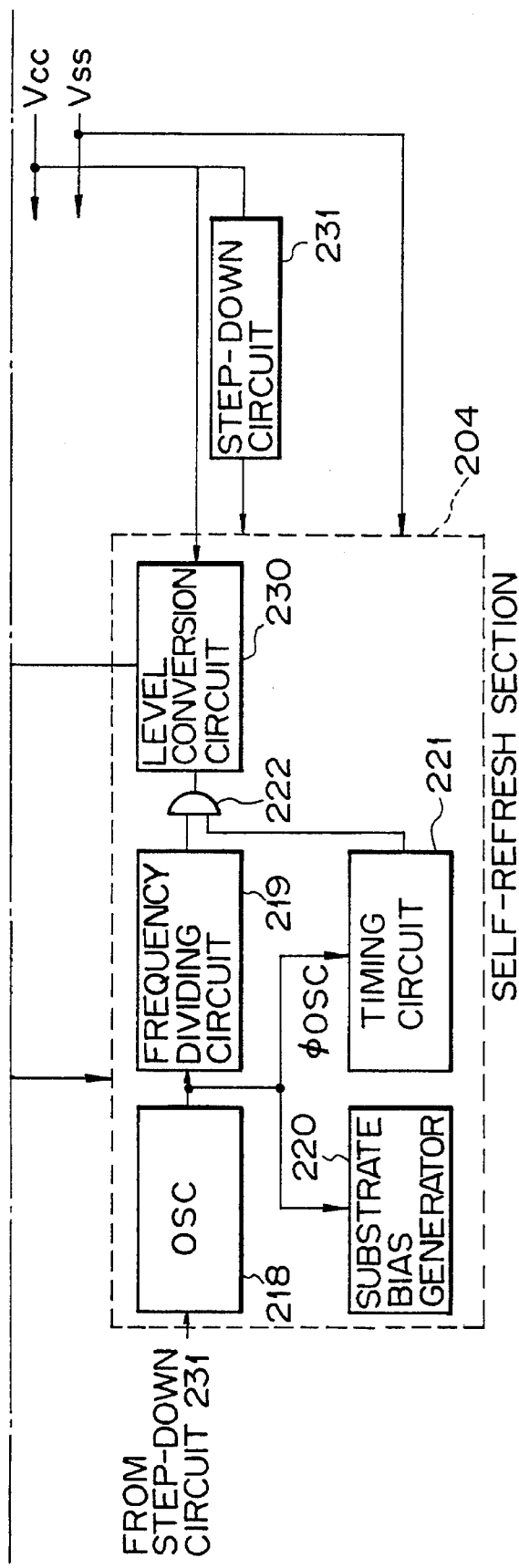
FIG. 16, consisting of FIGS. 16A and 16B, is a block diagram schematically showing an embodiment of a third aspect of a semiconductor memory device according to the present invention.

FIG. 16, which consists of FIGS. 16A and 16B, shows an embodiment of a third aspect of a semiconductor memory device according to the present invention. In FIGS. 16A and 16B, reference numeral 201 denotes a clock generation section, 202 denotes a memory section, 203 denotes a memory peripheral section, and 204 denotes a self-refresh section. The clock generation section 201 includes clock generators 205 and 206, a write clock generator 207, and a mode controller 208. The memory section 202 includes memory cells 209, a row decoder 210, a column decoder 211, and a sense amplifier plus I/O gate 212. The memory peripheral section 203 includes an address buffer plus predecoder 213, a refresh address counter 214, a substrate bias generator 215, a data input buffer 216, and a data output buffer 217. Note, these configurations of the semiconductor memory device (dynamic semiconductor memory device, or DRAM) of the third aspect are similar to that of the semiconductor memory device shown in FIGS. 14A and 14B.

As shown in FIGS. 16A and 16B, the self-refresh section 204 includes an oscillator 218, a frequency dividing circuit 219, a substrate bias generator 220, a timing circuit 221, an AND gate 222, and a level conversion circuit 230. Note, in FIGS. 16A and 16B, a reference numeral 231 denotes a step-down circuit for dropping a source voltage supplied to the self-refresh section 204. Note, during the self-refresh operation, it is not required for the self-refresh section 204 to realize a high speed operation, and the stepped down source voltage (dropped voltage) of the step-down circuit 231 is applied to the self-refresh section 204 to decrease the consumption power thereof.

Figure 17:
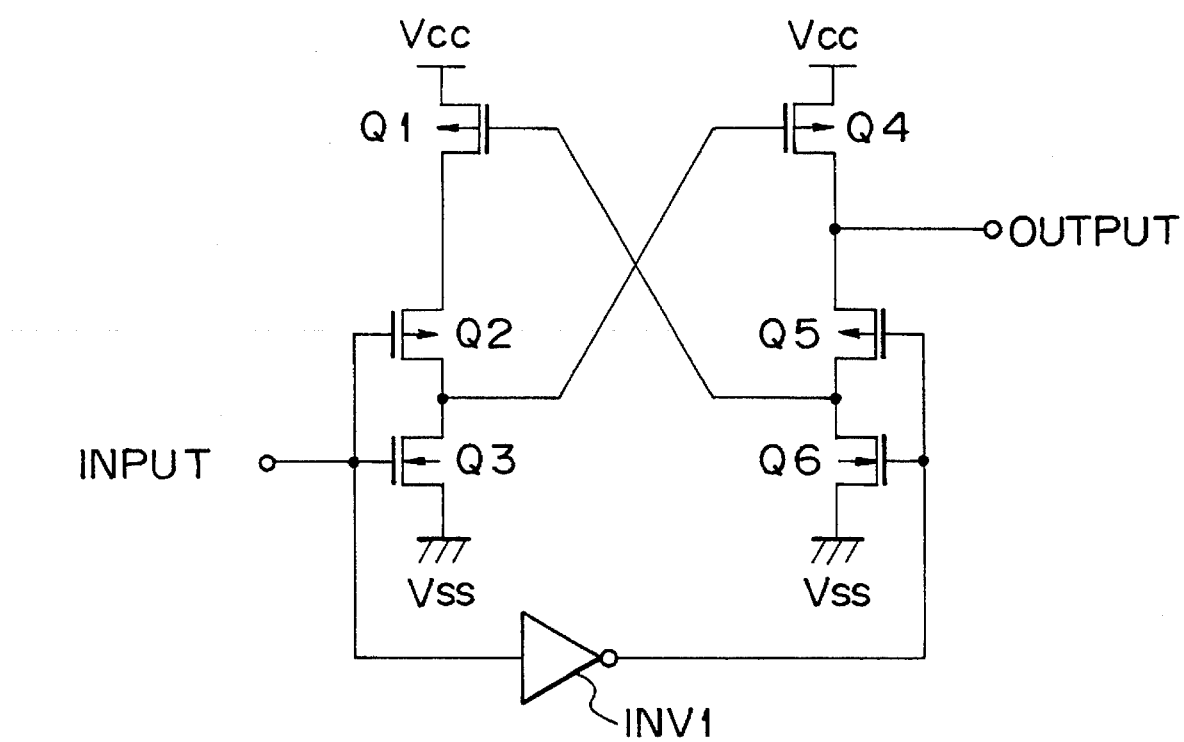
FIG. 17 is a circuit diagram showing an example of the level conversion circuit shown in FIG. 16.

FIG. 17 shows an example of the level conversion circuit shown in FIG. 16.

As shown in FIG. 17, the level conversion circuit 230 includes P-channel type MOS transistors Q1, Q2, Q4, and Q5, N-channel type MOS transistors Q3 and Q6, and an inverter INV1. When a signal of level HIGH is provided to an input end, the transistors Q2 and Q3 are turned ON, and the transistors Q5 and Q6 are turned OFF. Accordingly, the transistor Q1 is turned OFF and the transistor Q4 is turned ON, so that an output end provides a signal of level HIGH.

Note, the level HIGH of the input signal is lower than the level of a high potential source voltage Vcc, but the level HIGH of the output signal becomes equal to the level of the high potential source voltage Vcc.

Figure 18:
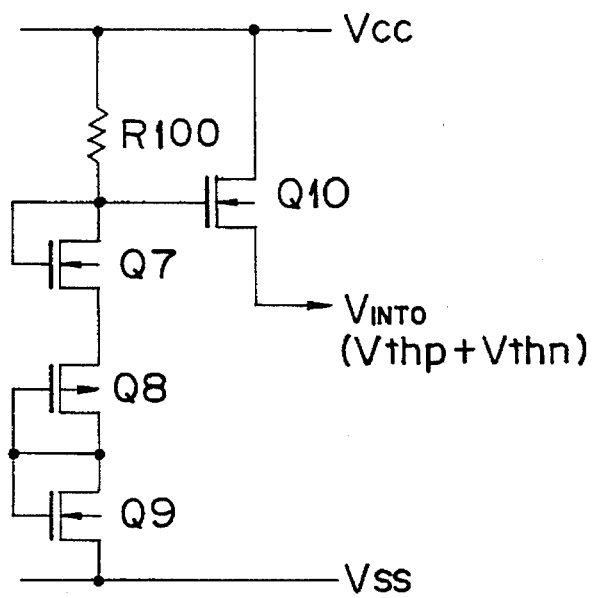
FIG. 18 is a circuit diagram showing an example of the step-down circuit shown in FIG. 16.

FIG. 18 shows an example of the step-down circuit shown in FIG. 16.

As shown in FIG. 18, the step-down circuit 231 includes a resistor R100, N-channel type MOS transistors Q7, Q9, and Q10, and a P-channel type MOS transistor Q8. The step-down circuit 231 provides a high potential source voltage $V_{INT^0}$ according to the external high potential source voltage Vcc. The dropped voltage $V_{INT^0}$ is equal to the sum of a threshold voltage Vthp of the P-channel type MOS transistor and a threshold voltage Vthn of the N-channel type MOS transistors.

The stepped down source voltage $V_{INT^0}$ (=Vthp+Vthn) is supplied to a CMOS inverter composed of P-channel type and N-channel type MOS transistors. At this time, no direct current flows to these transistors.

Figure 19:
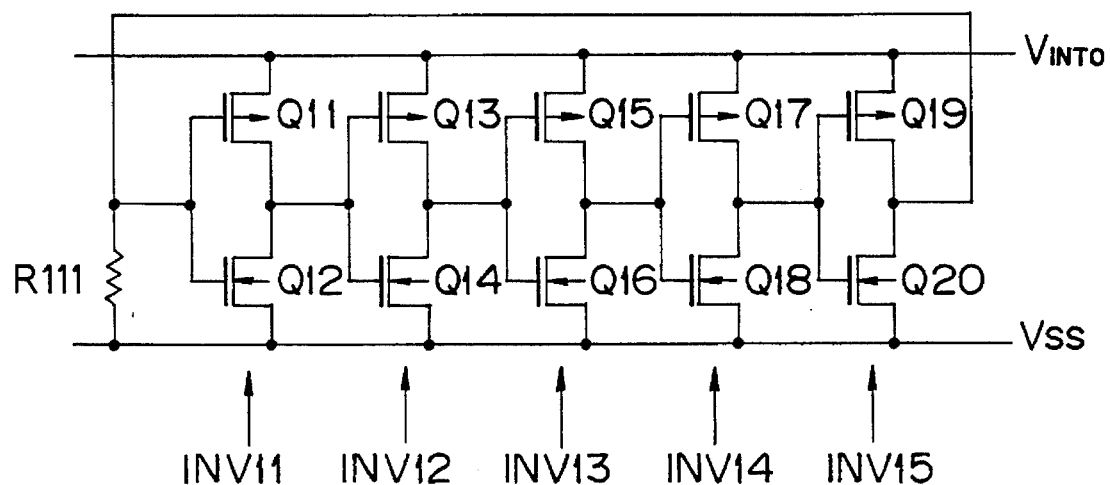
FIG. 19 is a circuit diagram showing an example of the oscillator shown in FIG. 16.

FIG. 19 shows an example of the oscillator shown in FIG. 16.

As shown in FIG. 19, the oscillator 218 has an odd number (five in this example) of inverter circuits INV11 to INV15.

As explained above, the oscillator 218 receives the stepped down source voltage (dropped voltage) $V_{INT^0}$ from the step-down circuit 231. No direct current flows to the inverter circuit INV11 formed of a P-channel type MOS transistor Q11 and an N-channel type MOS transistor Q12. The P-channel type MOS transistor Q11 and N-channel type MOS transistor Q12, however, may be turned OFF. If the P-channel type MOS transistor Q11 and N-channel type MOS transistor Q12 are turned OFF, the oscillator 218 will not operate.

Accordingly, the oscillator 218 of FIG. 19 breaks the balanced state with a pull-down resistor R111 connected to a predetermined node of the oscillator 218. The resistance of the pull-down resistor is higher than the impedance of the inverter circuit INV11. This prevents the P-channel type MOS transistor Q11 and N-channel type MOS transistor Q12 from turning OFF. Note, the resistor R111 is not only provided for a pull-down resistor, but is provided for a pull-up resistor having a resistance higher than the impedance of the inverter INV11.

Figure 20:
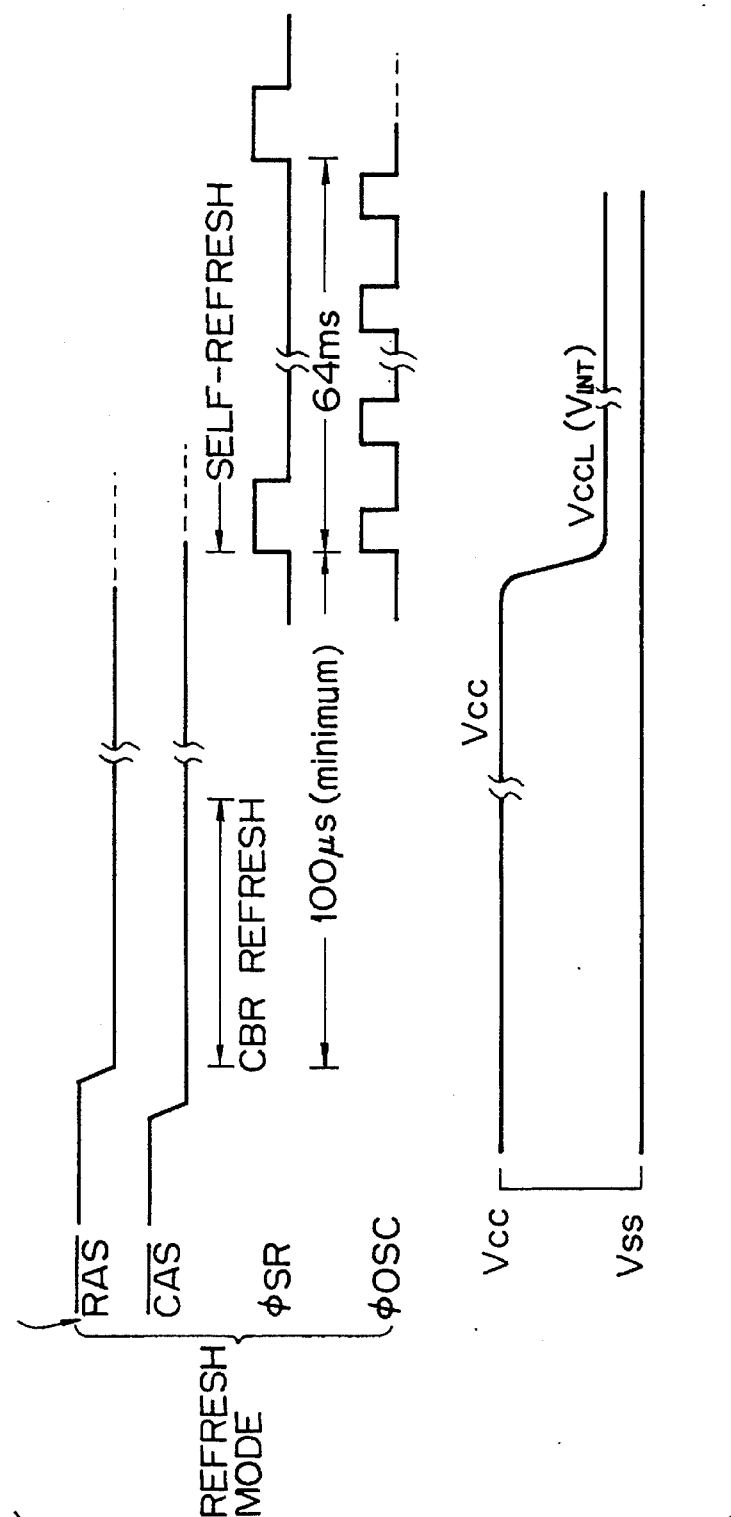
FIG. 20 is a timing chart for explaining the operation of the semiconductor memory device shown in FIG. 16.

FIG. 20 is a timing chart for explaining the operation of the semiconductor memory device shown in FIG. 16.

As shown in FIG. 20, the signal /CAS falls to level LOW at first and then the signal /RAS falls to level LOW to start a CBR refresh mode. This state is kept for a period of 100 μsec. (minimum time), and then a self-refresh mode is started. Note, when the self-refresh mode is started, the step-down circuit 231 drops the source voltage Vcc supplied to the self-refresh section 204 to the voltage $V_{INT^0}$, to decrease the consumption of a current in the self-refresh section 204.

Figure 21:
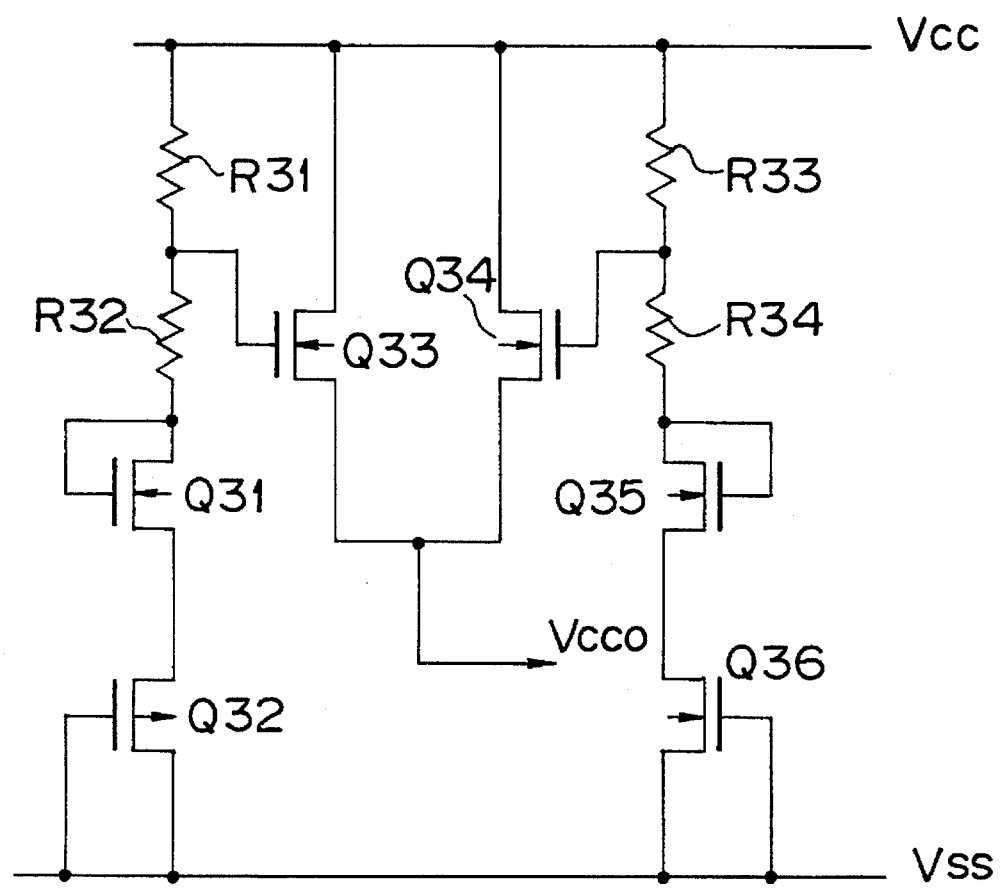
FIG. 21 is a circuit diagram showing another example of the step-down circuit shown in FIG. 16.

FIG. 21 shows another example of the step-down circuit shown in FIG. 16.

As shown in FIG. 21, the step-down circuit 231 includes resistors R31, R32, R33, and R34, N-channel type MOS transistors Q31, Q33, Q34, Q35, and Q36, and a P-channel type MOS transistor Q32. The step-down circuit 231 provides a high potential source voltage (dropped voltage) $V_{INT^0}$ according to the external high potential source voltage Vcc. The dropped voltage $V_{INT^0}$ is a little higher than higher one of a threshold voltage Vthp of the P-channel type MOS transistor or a threshold voltage Vthn of the N-channel type MOS transistors.

Namely, in the case that the threshold voltage Vthp of the P-channel type MOS transistor is higher than the threshold voltage Vthn of the N-channel type MOS transistors, the dropped voltage $V_{INT^0}$ is determined to the voltage higher than the threshold voltage Vthp. On the other hand, in the case that the threshold voltage Vthn is higher than the threshold voltage Vthp, the dropped voltage $V_{INT^0}$ is determined to the voltage higher than the threshold voltage Vthn. Note, the little value of the dropped voltage $V_{INT^0}$ higher than the threshold voltage Vthp or Vthn is determined by the resistor R32 or R34.

Figure 22A:
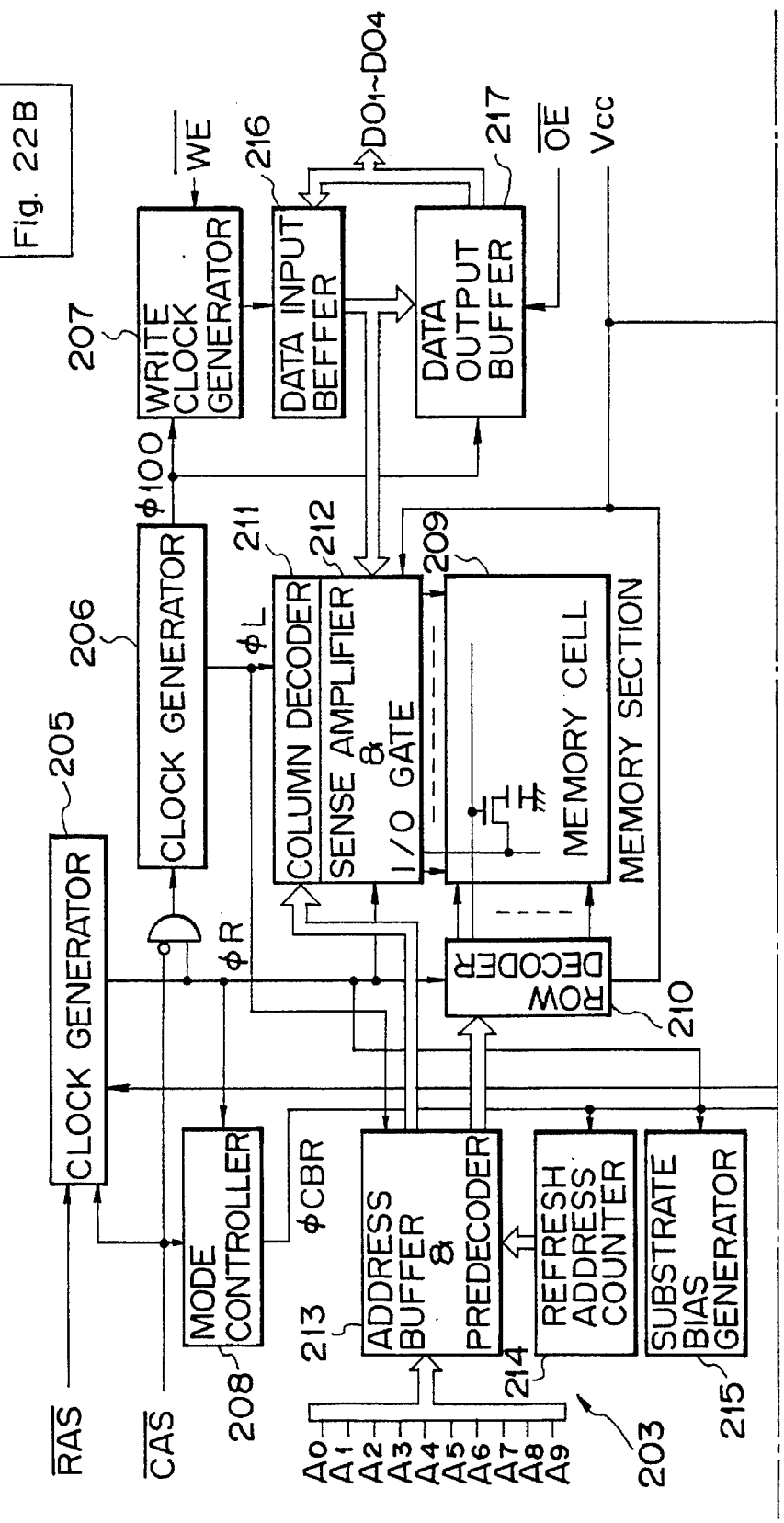
FIG. 22, consisting of FIGS. 22A and 22B, is a block diagram schematically showing a modification of the semiconductor memory device shown in FIG. 16.
Figure 22B:
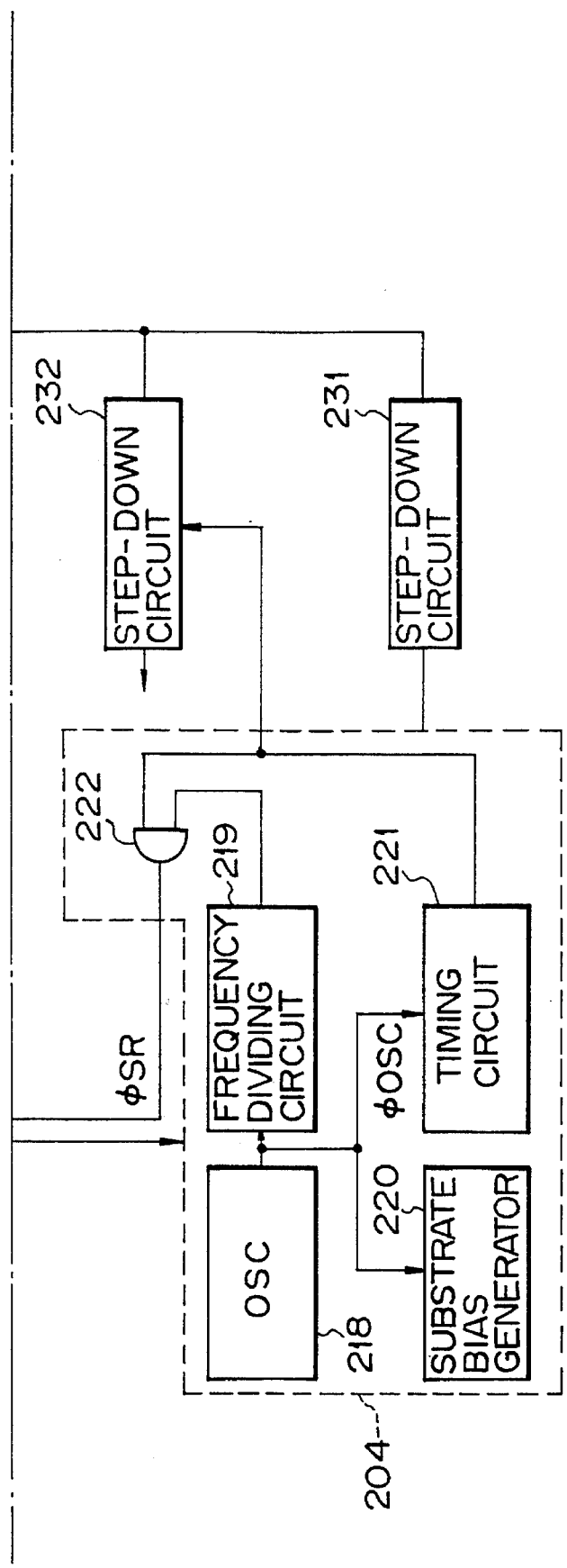

FIG. 22, which consists of FIGS. 22A and 22B, shows a modification of the semiconductor memory device shown in FIG. 16. In FIGS. 22A and 22B, parts having the same reference numerals as those of FIG. 16 are like parts.

In a self-refresh operation, a self-refresh section 204 and peripheral circuits are not required to operate at high speed. Accordingly, the self-refresh section 204 of this embodiment has no level conversion circuit 230. A step-down circuit 232 is arranged to drive not only the self-refresh section 204 but also the peripheral circuits with a low voltage.

Word and bit lines of a memory section 202 must operate at high speed even in the self-refresh operation, so that they receive a high potential source voltage Vcc. In this way, this embodiment drives the peripheral circuits too with the lower voltage during the self-refresh operation. This embodiment, therefore, further reduces the consumption of a current, compared with the previous embodiment.

As explained above, this embodiment of the third aspect reduces the consumption of a current in a self-refresh operation. Accordingly, a dynamic semiconductor memory device according to this embodiment consumes little power. To break a balanced state of an oscillator, the above embodiments provide the oscillator with a pull-down resistor. Instead, a pull-up resistor may be employed to break the balanced state.

According to the third aspect of the present invention, the step-down unit drops a source voltage supplied to a self-refresh unit, thereby reducing the quantity of a current consumed by the self-refresh unit. Further, dynamic memory cells are self-refreshed by unchanging a source voltage supplied to the dynamic memory cells and a data write/read unit and by dropping a source voltage supplied to a self-refresh unit, thereby reducing the power consumption of the self-refresh unit and maintaining a data write/read speed. In addition, a self-refresh unit has an oscillator operating with a source voltage that is lower than the sum of threshold values of inverter circuits. This arrangement secures the operation even with reduced power consumption.

Next, the problems of the related art and embodiments of a fourth aspect of the semiconductor memory device according to the present invention will be explained.

Figure 23:
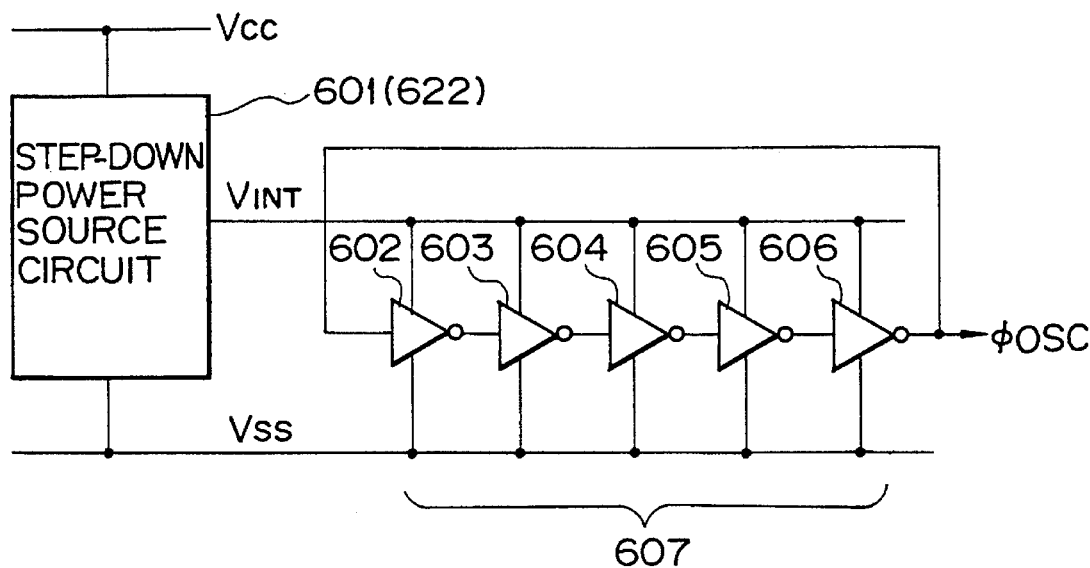
FIG. 23 is a block circuit diagram showing an example of a step-down power source circuit.

FIG. 23 shows a block circuit diagram of an example of a step-down power source circuit.

In FIG. 23, the step-down power source circuit 601 (622) generates a stepped down voltage $V_{INT}$. This voltage is constant and lower than an externally supplied high source voltage Vcc but higher than a low source voltage Vss. The voltage $V_{INT}$ is applied to a + (plus) power source line of a ring oscillator 607, which includes multistage inverter gates 602 to 606 (the number of the gates is only an example). The voltage Vss is applied to a − (minus) power source line of the inverter gates 602 to 606.

The frequency φOSC of the ring oscillator 607 is used to control the refresh time of DRAMs, PSRAMs, or VSRAMs. The frequency is expressed as follows:

$$\phi OSC = 1/\{N(t_{pLH} + t_{pHL})\} \tag{1}$$

where N is the number of the inverter gates 602 to 605, $t_{pLH}$ is a delay time from when an input falls to level LOW until it causes an output to rise to level HIGH, and $t_{pHL}$ is a delay time from when the input rises to level HIGH until it causes the output to fall to level LOW. The delay time is sensitive to fluctuations in source voltages and temperatures.

Figure 24:
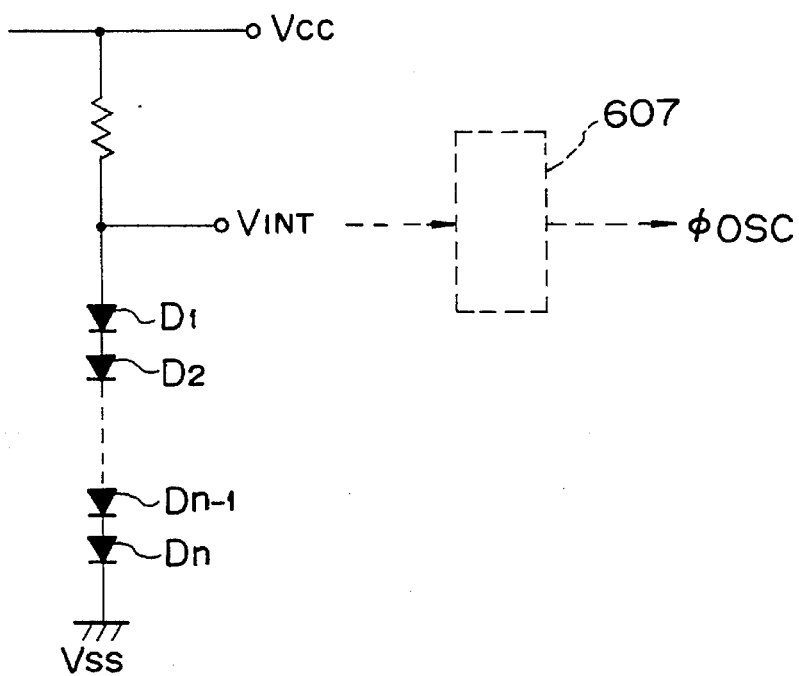
FIG. 24 is a block circuit diagram showing an example of a step-down power source circuit according to the related art.

FIG. 24 shows an example of the step-down power source circuit. This example includes PN diodes $D_1, D_2, \ldots, D_{n-1}$, Dn connected in series. A stepped down voltage $V_{INT}$ of this circuit is given as follows:

$$V_{INT} = V_{FR} \times M \tag{2}$$

where $V_{FR}$ is a forward voltage of each diode and M is the number of the diodes.

This circuit may be formed of a small number of parts. Each diode, however, has a negative temperature dependency of about 2 mV/degree centigrade (when the temperature increases, the $V_{FR}$ decreases). In particular, this step-down power source circuit causes the following inconvenience when it is combined with the ring oscillator 607 for controlling a refresh time.

Figure 25:
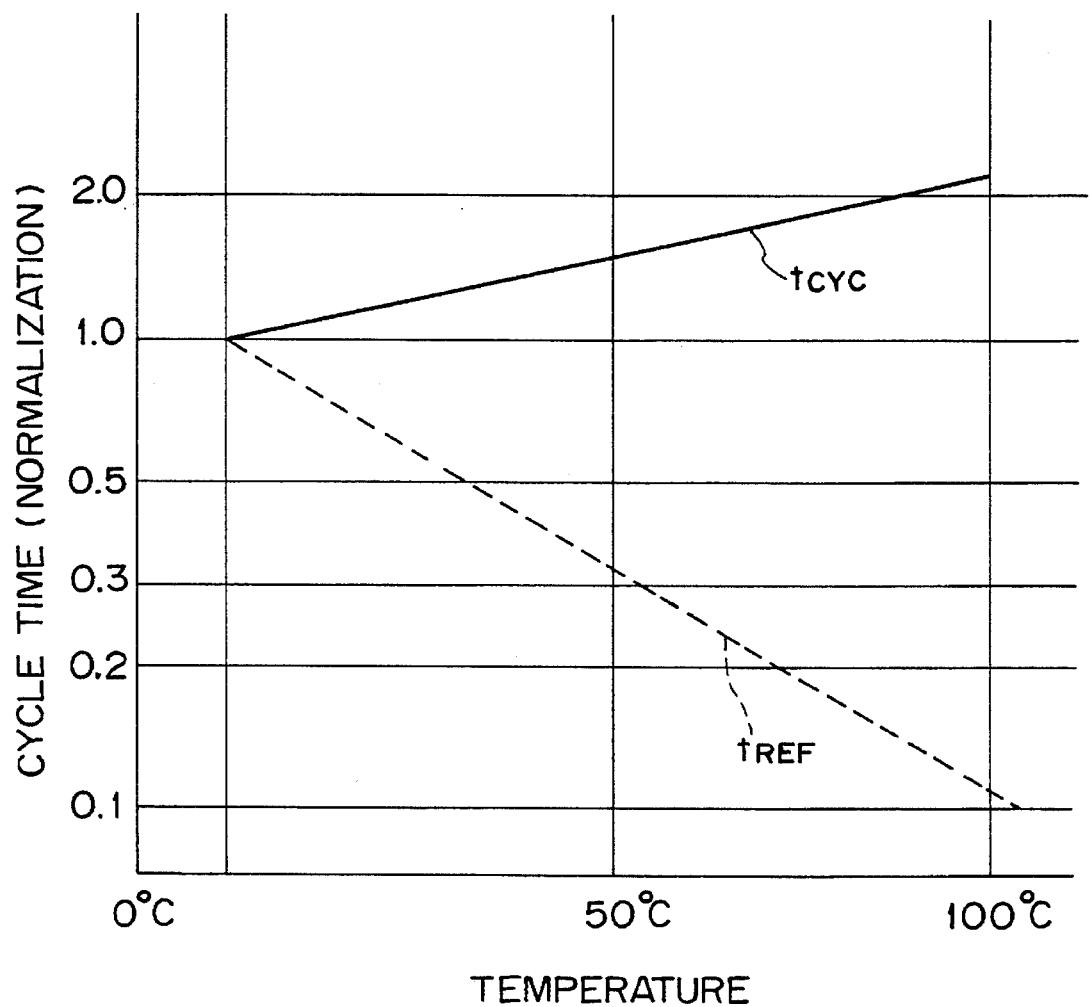
FIG. 25 is a diagram showing a relationship between a required refresh cycle and a cycle time of an output of a ring oscillator in the step-down power source circuit shown in FIG. 23.

Generally, the refresh time of DRAMs, PSRAMs, VSRAMs, etc., becomes shorter as the temperature increases. This is because charges in a cell are easily lost under high temperature. Namely, a proper refresh cycle (that is, storage maintaining time (or required refresh cycle)) $t_{REF}$ for cells becomes shorter as the temperature increases, as shown in FIG. 25. For example, the refresh cycle involves a difference of "1: 1/10" between 0 and 100 degrees centigrade.

A cycle time (an actual refresh cycle) $t_{CYC}$ of the φOSC that determines a refresh time is dependent on a change in the $V_{INT}$ due to a temperature change. Namely, the cycle time $t_{CYC}$ becomes longer as the temperature increases due to the negative temperature dependency of the diodes $D_1$ to $Dn$. For example, the cycle time involves a difference of "1:2" between 0 and 100 degrees centigrade. FIG. 25 shows changes in the $t_{CYC}$. These changes are opposite to changes in the $t_{REF}$. In particular, the refresh cycle delays behind the cycle time in middle and high temperature regions. This causes a critical problem of losing data stored in cells.

To solve this problem, a prior art sets the φOSC to a high frequency side so that the $t_{CYC}$ becomes nearly equal to the $t_{REF}$ in the worst high temperature region (for example, at 100 degrees centigrade).

This technique may optimize the number of refresh operations in the high temperature region. It, however, excessively sets the numbers of refresh operations in the middle and low temperature regions. Since these middle and high temperature regions are usually used, power consumption will greatly increases.

Figure 26:
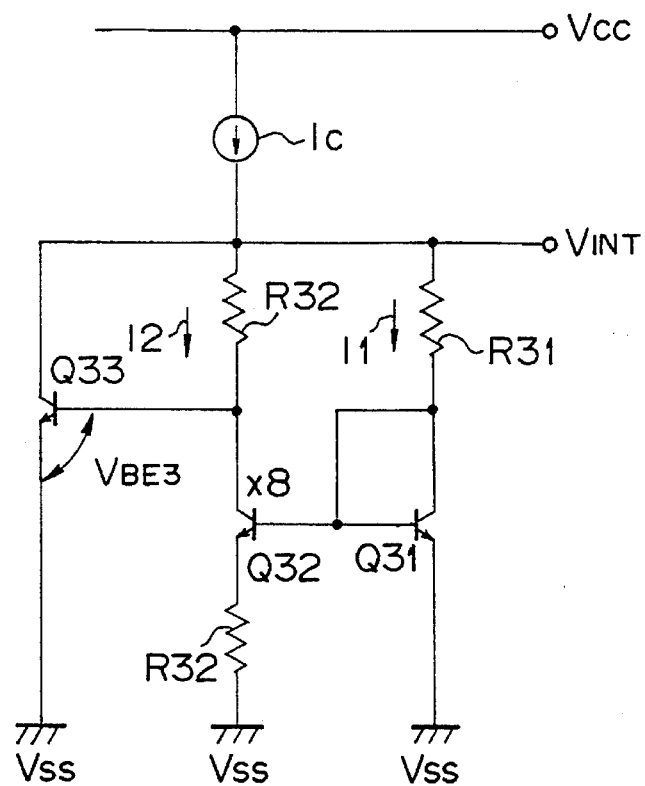
FIG. 26 is a circuit diagram showing another example of a step-down power source circuit according to the related art.

FIG. 26 shows a band gap voltage reference circuit that is employable as a step-down power source circuit. In the figure, Q31 to Q33 are npn bipolar transistors, R31 to R33 are resistors, and Ic is a constant current source. An output voltage $V_{INT}$ is a sum of a base-emitter voltage $V_{BE3}$, of the Q33 and a terminal voltage I2R32 of the load resistor R32. The $V_{BE3}$ has a negative temperature coefficient and the I2R32 has a positive temperature coefficient. Accordingly, a ratio of the $V_{BE3}$ and I2R32 may be optimized to provide temperature characteristics that increase the $V_{INT}$ as the temperature increases. This results in rightwardly declining the $t_{CYC}$ to approximate the inclination of the $t_{REF}$. This technique, however, is unable to reduce power consumption because it employs the bipolar transistors.

Figure 27:
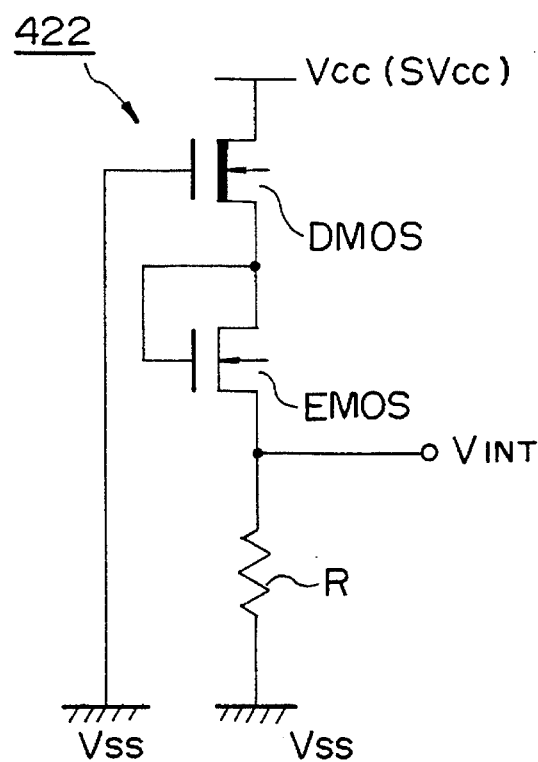
FIG. 27 is circuit diagram showing a principle configuration of a step-down power source circuit in a semiconductor integrated circuit (semiconductor memory device) of a fourth aspect of the present invention.

FIG. 27 is circuit diagram showing a principle configuration of a step-down power source circuit in a semiconductor integrated circuit of a fourth aspect of the present invention.

As shown in FIG. 27, the semiconductor integrated circuit of the fourth aspect of the present invention has a step-down power source circuit 622 for generating a stepped down source voltage $V_{INT}$ that is lower than the potential Vcc (SVcc) of a first power source line and higher than the potential (Vss) of a second power source line. The stepped down source voltage $V_{INT}$ generated by the step-down power source circuit 622 is increased in accordance with an increase in the temperature of the semiconductor integrated circuit. Further, the step-down power source circuit 622 has a depletion MOS transistor DMOS and a resistor element R. As shown in FIG. 27, a drain of the depletion MOS transistor DMOS is connected to the first power source line, a gate of the depletion MOS transistor is connected to the second power source line, and a source of the depletion MOS transistor is connected to the second power source line through the resistor element R.

According to the fourth aspect of the present invention, a gate-source voltage of the depletion MOS transistor (hereinafter referred to as the DMOS transistor) appears at both ends of the resistance element and is provided as a stepped down voltage.

The gate-source voltage $V_{GS}$ of the DMOS transistor is constant with the source having positive polarity if the gate serves as a reference. The DMOS transistor is a so-called normally ON element that maintains an ON state until negative potential lower than the constant potential is applied to the gate. The constant potential corresponds to a threshold value of the enhancement MOS transistor (hereinafter referred to as the EMOS transistor). Although the term "threshold value" is usually used in connection with the EMOS transistor, this specification uses the term also for the DMOS transistor for the sake of convenience. The threshold value of the DMOS transistor has positive temperature dependency, so that the stepped down voltage provided by the above example increases its potential as the temperature rises.

Accordingly, the stepped down voltage may be used for, for example, an oscillator circuit for determining a refresh time. In this case, the period of an oscillator frequency φOSC of the oscillator circuit may be corrected to become shorter as the temperature rises. This results in optimizing the number of refresh operations of DRAMs, PSRAMs, VSRAMs, etc., according to environmental temperatures. It is preferable to increase the number of DMOS transistors because it increases the changing width, i.e., temperature sensitivity of a stepped down voltage with respect to temperatures. When EMOS transistors are also employed, a temperature coefficient (negative) of them corrects the stepped down voltage toward a decreasing side. This helps increase the number of DMOS transistors, to further improve the temperature sensitivity.

Below, embodiments of the fourth aspect of the present invention will be explained with reference to FIGS. 28 to 41.

FIGS. 28 to 36 show a first embodiment of a semiconductor integrated circuit (DRAM) according to the fourth aspect of the present invention.

Figure 28B:
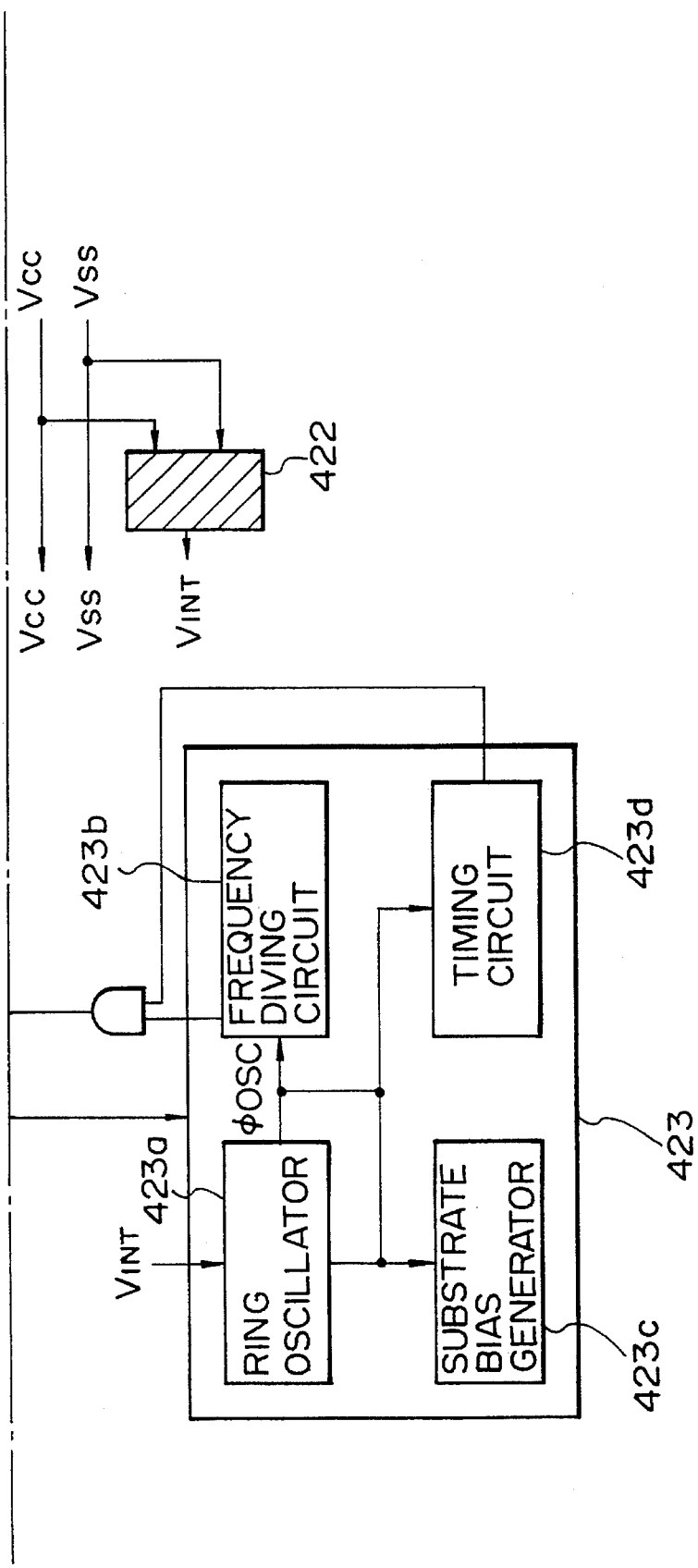
FIG. 28, consisting of FIGS. 28A and 28B, is a block diagram showing a total configuration of an embodiment in a semiconductor integrated circuit according to a fourth aspect of the present invention.

An arrangement of the embodiment will be explained. In FIG. 28 consisting of FIGS. 28A and 28B, reference numeral 410 denotes a first clock generator, 411 denotes a second clock generator, 412 denotes a write clock generator, 413 denotes a mode control circuit, 414 denotes a data input buffer, 415 denotes a data output buffer, 416 denotes an address buffer (including a predecoder), 17 is a row decoder, 18 is a column decoder, 419 denotes a sense amplifier (including an I/O gate), 420 denotes a memory cell array, 421 denotes a refresh address counter, 422 denotes a step-down power source circuit, and 423 denotes a self-refresh circuitry. The self-refresh circuitry 423 includes a ring oscillator 423a, a frequency divider circuit 423b, a substrate bias generator 423c, and a timing circuit 423d.

Note, /RAS (where, the mark "/" corresponds a top bar indicating an inverted signal) is a row address strobe signal, /CAS is a column address strobe signal, /WE is a write enable signal, /OE is an output enable signal, $A_0$ to $A_{11}$ are address signals, DQi is input/output data, Vcc is a high potential power source, Vss is a low potential power source, $V_{INT}$ is a stepped down power source, and φSR is a refresh cycle mode signal.

In this arrangement, the signals $A_1$ to $A_{11}$ are fetched as row addresses when the signal /RAS falls. When the signal /CAS falls, the signals $A_1$ to $A_{11}$ are fetched as column addresses. With these addresses, the memory cell array (memory section) 420 is accessed. When the signal /WE is active, data is written to the memory cell array, and when the signal /OE is active, data is read out of the memory cell array.

The contents of the memory cells of the DRAM must be refreshed at predetermined intervals (refresh time). If a read cycle, a write cycle, or a read modify write cycle is carried out within the refresh time, the objective cells of the cycle in question are automatically refreshed. In other occasions, the memory cells must always be refreshed.

When the mode control circuit 413 detects that no read/write operation has been carried out within the refresh time, the circuit 413 provides the signal φSR. In response to this signal, the refresh address counter 421 generates internal refresh addresses. At the same time, the self-refresh circuitry 423 starts to operate. The ring oscillator 423a provides the signal φOSC. The frequency of this signal is divided by the frequency divider circuit 423b. An AND of the frequency divided output of the frequency divider circuit 423b and the output of the timing circuit 423d is applied to the first clock generator 410, to start a self-refresh operation.

Figure 29:
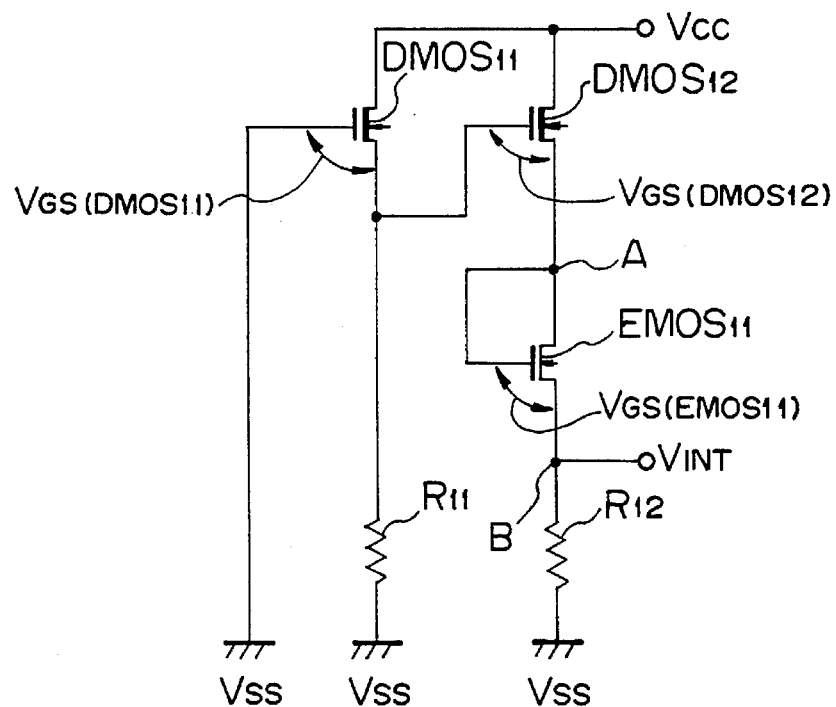
FIG. 29 is a circuit diagram showing a first embodiment of a step-down power source circuit in a semiconductor integrated circuit according to the fourth aspect of the present invention.

FIG. 29 shows the step-down power source circuit 422. The step-down power source circuit 422 has two depletion MOS transistors $DMOS_{11}$ and $DMOS_{12}$ having drains connected to the high potential power source (high potential power source line) Vcc that receives external power; a resistor (a resistance element) $R_{11}$ connected between the source of the $DMOS_{11}$ and the low potential power source (low potential power source line) Vss; and a diode connected enhancement MOS transistor $EMOS_{11}$ connected with a resistor (a resistance element) $R_{12}$ between the source of the $DMOS_{12}$ and the Vss. The gate of the $DMOS_{11}$ is connected to the Vss.

In this arrangement, the $DMOS_{11}$ and $DMOS_{12}$ are normally ON elements that are turned OFF when the potential of their gates becomes lower than the potential of their sources by a "given level." The given level is a voltage corresponding to a threshold value $V_{TH}$ of the EMOS transistor (a normally OFF element). If the gate potential serves as a reference (0 V), the given level will be negative source potential for the EMOS transistor and positive source potential for the DMOS transistor (when the transistors are N-channel type MOS transistors).

Figure 30:
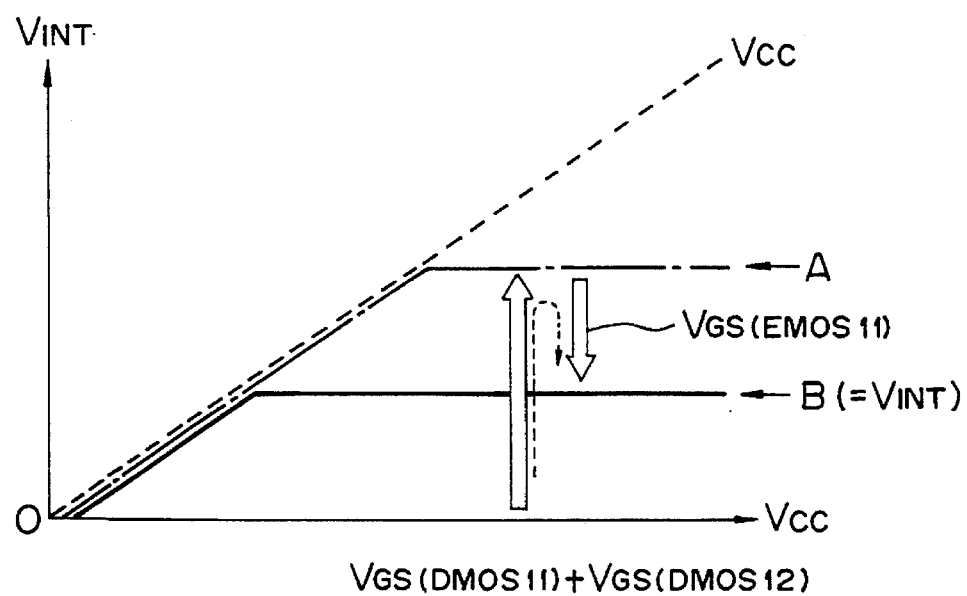
FIG. 30 is a diagram showing the potential levels of stepped down voltages of the step-down power source circuit shown in FIG. 29.

The threshold value (absolute) of each of the $DMOS_{11}$, $DMOS_{12}$, and $EMOS_{11}$ is, for example, 0.5 V. A gate-source voltage $V_{GS(DMOS^{12})}$) of the $DMOS_{11}$ and a gate-source voltage $V_{GS(EMOS^{11})}$) of the $EMOS_{11}$ will be $-0.5$ V of opposite polarity. With the gate potential (Vss) of the $DMOS_{11}$ serving as a reference, the source potential of the $DMOS_{11}$ will be $+0.5$ V ($=V_{GS(DMOS^{11})}$), the source potential of the DMOS transistor $DMOS_{12}$ will be $-1.0$ V ($=V_{GS(DMOS^{11})}+V_{GS(DMOS^{12})}$), and the source potential of the $EMOS_{11}$ will be $+0.5$ V ($=V_{GS(DMOS^{11})}+V_{GS(DMOS^{12})}+V_{GS(EMOS^{11})}$). As shown in FIG. 30, the $V_{INT}$ settles at a level B ($+0.5$ V) that is lower than a level A ($+1.0$ V) of (0 V+$V_{GS(DMOS^{11})}+V_{GS(DMOS^{12})}$) by $V_{GS(EMOS^{11})}$.

The threshold value of the DMOS transistor has a positive temperature coefficient, while the threshold value of the EMOS transistor has a negative temperature coefficient. Namely, the threshold value of the DMOS transistor increases as the temperature increases, while the threshold value of the EMOS transistor decreases as the temperature increases. The $V_{INT}$ is expressed as follows:

$$V_{INT}=|V_{TH(DMOS^{11})}+V_{TH(DMOS^{12})}+2\Delta V_{THD}|$$

$$-V_{TH(DMOS^{11})}+V_{TH(EMOS^{11})} \quad (3)$$

where the $\Delta V_{THD}$ is a change in the threshold value of the DMOS transistor with respect to a change in temperature, and the $\Delta V_{THE}$ is a change in the threshold value of the EMOS transistor with respect to the change in temperature. Accordingly, an increase of $2\Delta V_{THD}+V_{THE}$ will be expected. FIG. 30 shows temperature characteristics of levels A and B ($=V_{INT}$). A difference in the slope of the characteristic curves is caused by a difference in the temperature coefficients of the DMOS and EMOS transistors.

As explained above, this embodiment adds the threshold value of the two EMOS transistors to the level (0 V) of the Vss, subtracts the threshold value of the EMOS transistor from the added result, and provides the subtracted result as $V_{INT}$ from both ends of the resistor $R_{12}$. This stepped down voltage $V_{INT}$ is suitable for the ring oscillator that determines a refresh period of the DRAM.

The potential of the stepped down voltage $V_{INT}$ increases as the temperature rises, so that the output φOSC of the ring oscillator 423a (with reference to FIGS. 28A and 28B) shifts toward a high frequency side as the temperature rises. As a result, the $t_{CYC}$ of FIG. 25 leftwardly inclines to reduce a difference with respect to the $t_{REF}$. Namely, the φOSC changes according to required refresh cycles, and therefore, the refresh cycles are always properly controlled with respect to temperatures ranging from low to high degrees. In particular, excessive refresh operations in an ordinary temperature area are avoidable to decrease power consumption. The step-down power source circuit 422 of the present invention uses MOS transistors and no bipolar transistors that require a bias current. Accordingly, the circuit 422 consumes little power.

The above embodiment employs two DMOS transistors and one EMOS transistor. If a low stepped down voltage $V_{INT}$ is acceptable, one DMOS transistor will do. Namely, the source of the DMOS may provide the $V_{INT}$. In this case, the $V_{INT}$ is higher than the Vss by the threshold value of the $DMOS_{11}$.

Figure 32:
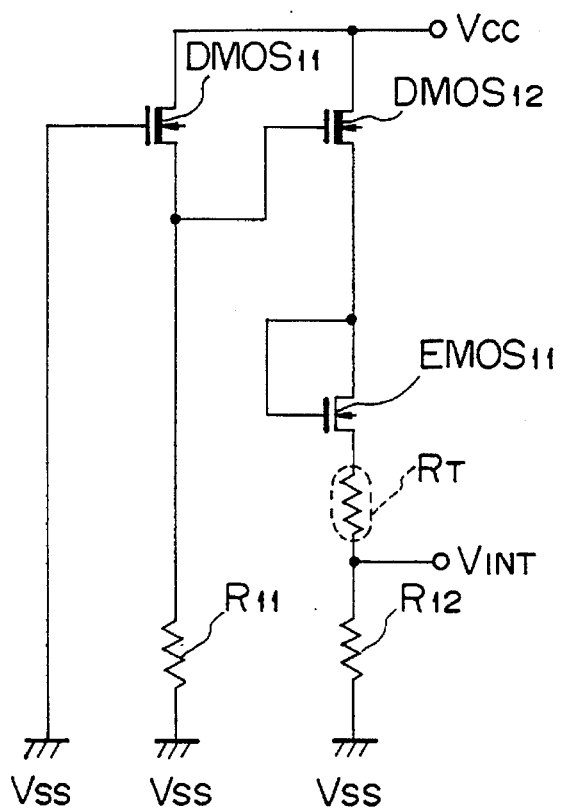
FIG. 32 is a circuit diagram showing a first modification of the step-down power source circuit in the semiconductor integrated circuit of the fourth aspect of the present invention.

The threshold values of the DMOS and EMOS transistors will slightly fluctuate due to fluctuations in process parameters. Such fluctuations may be corrected by trimming an adjusting resistor $R_T$ which is disposed between the source of the $EMOS_{11}$ and the resistor $R_{12}$, as shown in FIG. 32.

Figure 33:
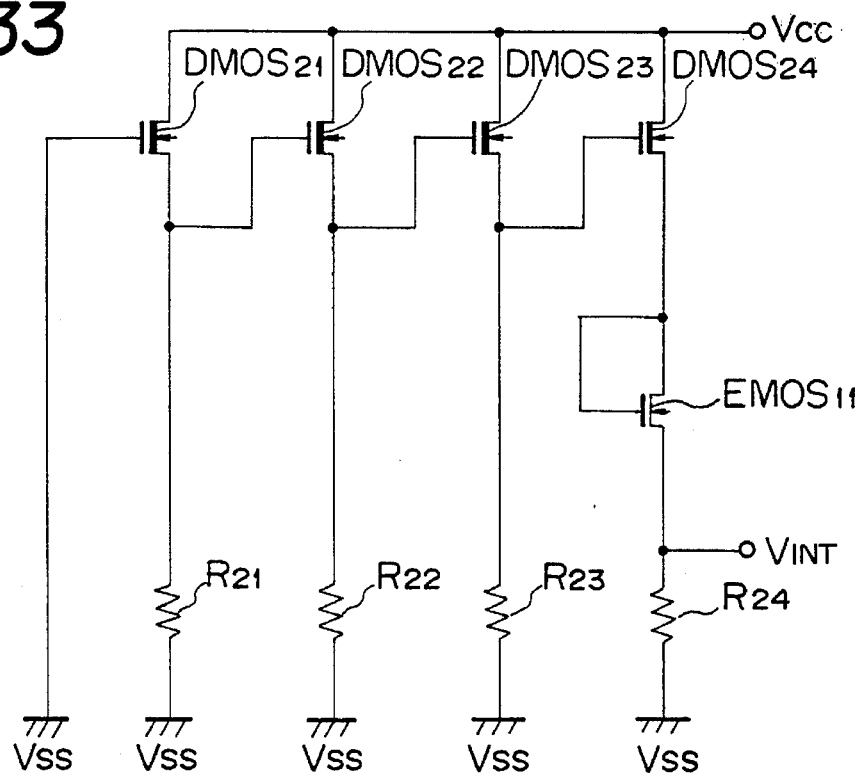
FIG. 33 is a circuit diagram showing a second modification of the step-down power source circuit in the semiconductor integrated circuit of the fourth aspect of the present invention.

The DMOS transistors may be arranged in multiple stages as shown in FIG. 33. When there are four DMOS transistors $DMOS_{21}$ to $DMOS_{24}$ as shown in the figure, the potential of $V_{INT}$ will be four times a threshold value ($+2$ V for the four stages with one stage being $+0.5$ V) minus a threshold value of an EMOS transistor. In FIG. 33, $R_{21}$ to $R_{24}$ are resistors (resistance elements).

Figure 34:
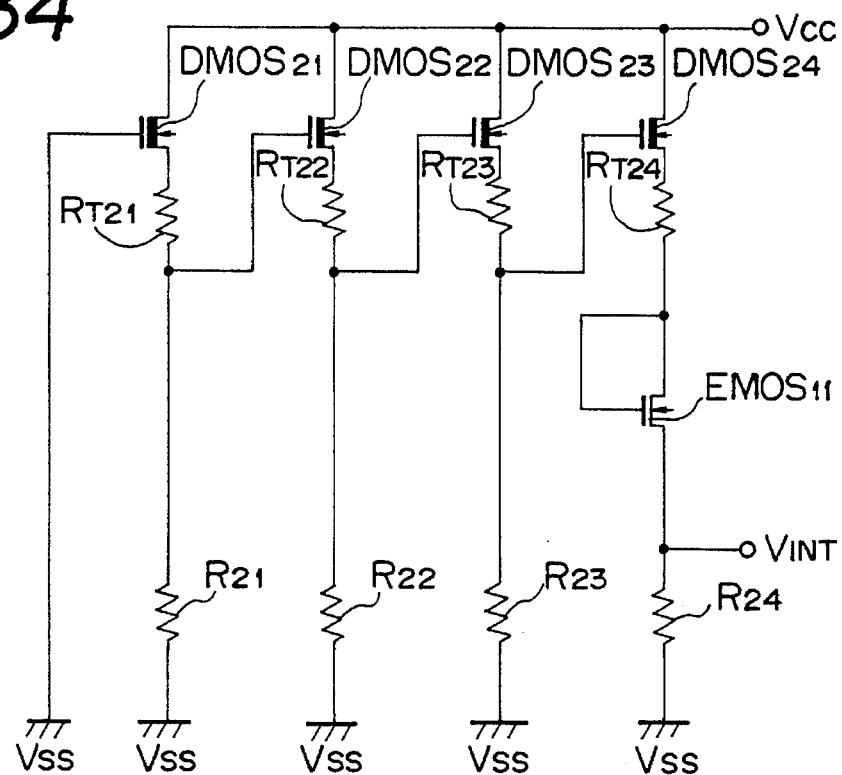
FIG. 34 is a circuit diagram showing a third modification of the step-down power source circuit in the semiconductor integrated circuit of the fourth aspect of the present invention.

If threshold values fluctuate depending on process parameters, a required level of $V_{INT}$ will not be obtained. In this case, trimming resistors $R_{T21}$ to $R_{T24}$ may be connected to the sources (or drains, or both of them) of the $DMOS_{21}$ to $DMOS_{24}$, as shown in FIG. 34.

Figure 35:
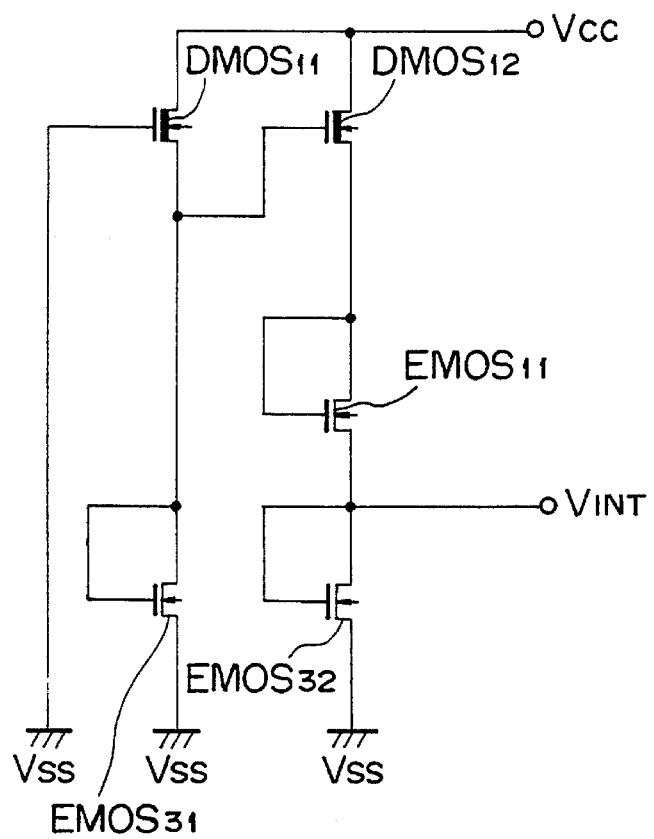
FIG. 35 is a circuit diagram showing a fourth modification of the step-down power source circuit in the semiconductor integrated circuit of the fourth aspect of the present invention.

Alternatively, diode connected $EMOS_{31}$ and $EMOS_{32}$ (or bipolar transistors) may be employed as resistance elements, as shown in FIG. 35.

Figure 36:
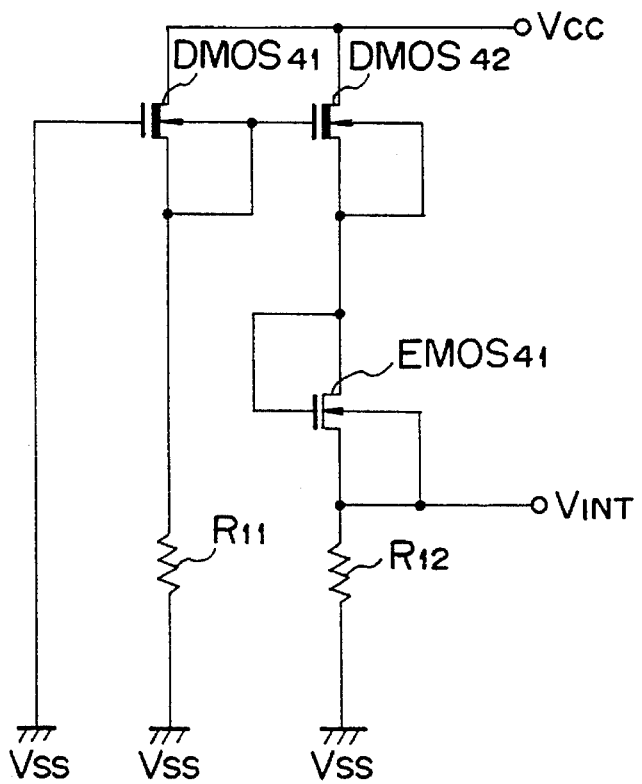
FIG. 36 is a circuit diagram showing a fifth modification of the step-down power source circuit in the semiconductor integrated circuit of the fourth aspect of the present invention.

Further, in FIG. 36, the substrate potential of each of transistors ($DMOS_{41}$, $DMOS_{42}$, and $EMOS_{41}$, in FIG. 36) may be equal to the source potential thereof. This eliminates the influence of back bias. Namely, according to the step-down power source circuit shown in FIG. 36, threshold voltage of each of the depletion and enhancement MOS transistors $DMOS_{41}$, $DMOS_{42}$; $EMOS_{41}$ can be exactly determined and the temperature characteristics of the step-down power source circuit can be correctly designed, and thereby a preferable temperature compensation can be obtained.

Figure 37:
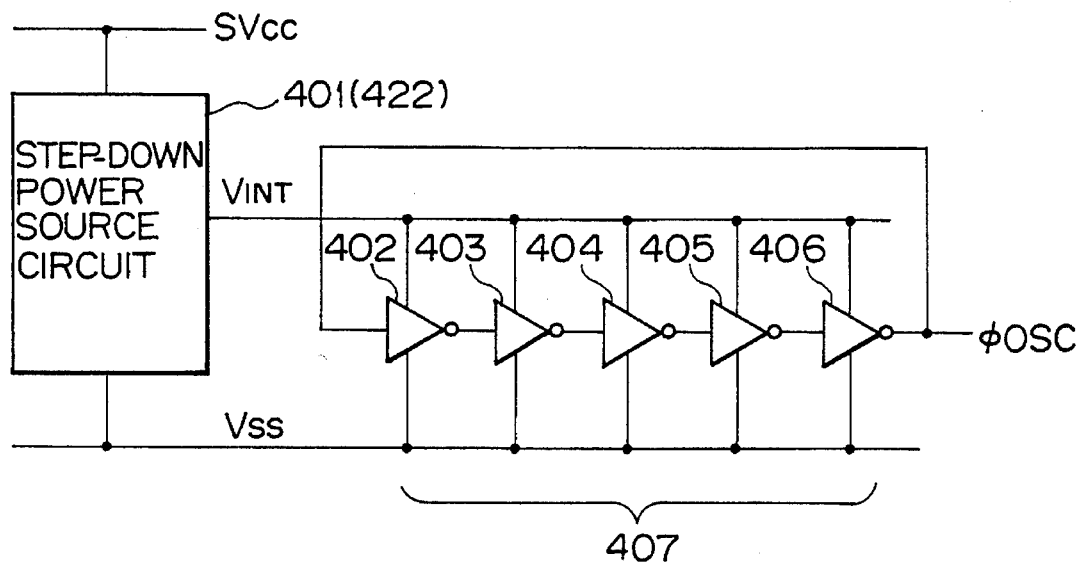
FIG. 37 is a circuit diagram showing a second embodiment of a step-down power source circuit in a semiconductor integrated circuit of the fourth aspect of the present invention.

FIGS. 37 to 41 show a second embodiment of the semiconductor integrated circuit according to the fourth aspect of the present invention, and FIG. 37 shows a diagram for explaining the second embodiment of the step-down power source circuit of the present invention.

As shown in FIG. 37, an output (stepped down source voltage) $V_{INT}$ of a second embodiment step-down power source circuit 401 (422) is supplied to a ring oscillator 407 having a plurality of inverters 402 to 406 similar to the step-down power source circuit 601 (622) shown in FIG. 23. Nevertheless, in this second embodiment, a super high voltage SVcc higher potential power source line.

Namely, in the second embodiment step-down power source circuit 401 (422), a first power source line is used to supply the super high voltage SVcc higher than the normal high voltage Vcc, and a second power source line is used to supply a normal low voltage Vss.

Figure 38:
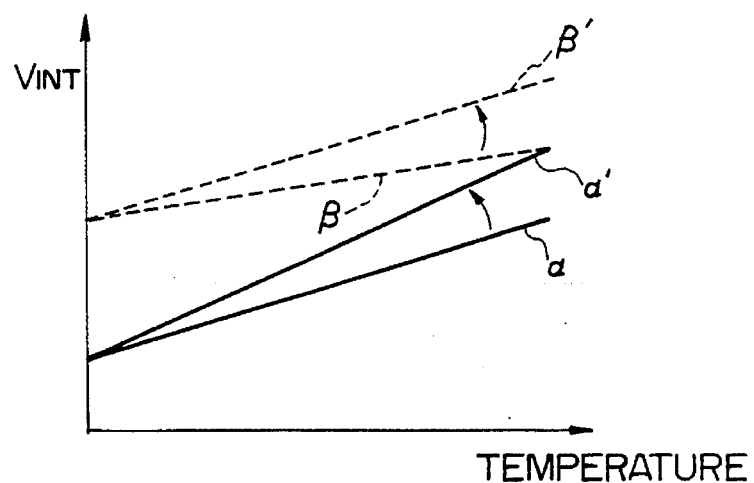
FIG. 38 is a diagram showing the temperature characteristics of the step-down power source circuit shown in FIG. 37.

FIG. 38 shows the temperature characteristics of the step-down power source circuit shown in FIG. 37. As shown in FIG. 38, in the step-down power source cirsuit of FIG. 37, the temperature characteristics α when applying the normal high voltage Vcc is changed to the temperature characteristics α" when applying the super high voltage SVcc higher than the normal high voltage Vcc. Similarly, the temperature characteristics β when applying the normal high voltage Vcc is changed to the temperature characteristics β" when applying the super high voltage SVcc. Therefore, the potential of the stepped down voltage (stepped down source voltage) $V_{INT}$ of using the super high voltage SVcc can be changed until the higher voltage than that of using the normal high voltage Vcc. Namely, the refresh cycle (output φOSC of the ring oscillator) can be used in much shorter period, and the temperature compensation can be effective in much broader range.

Figure 39:
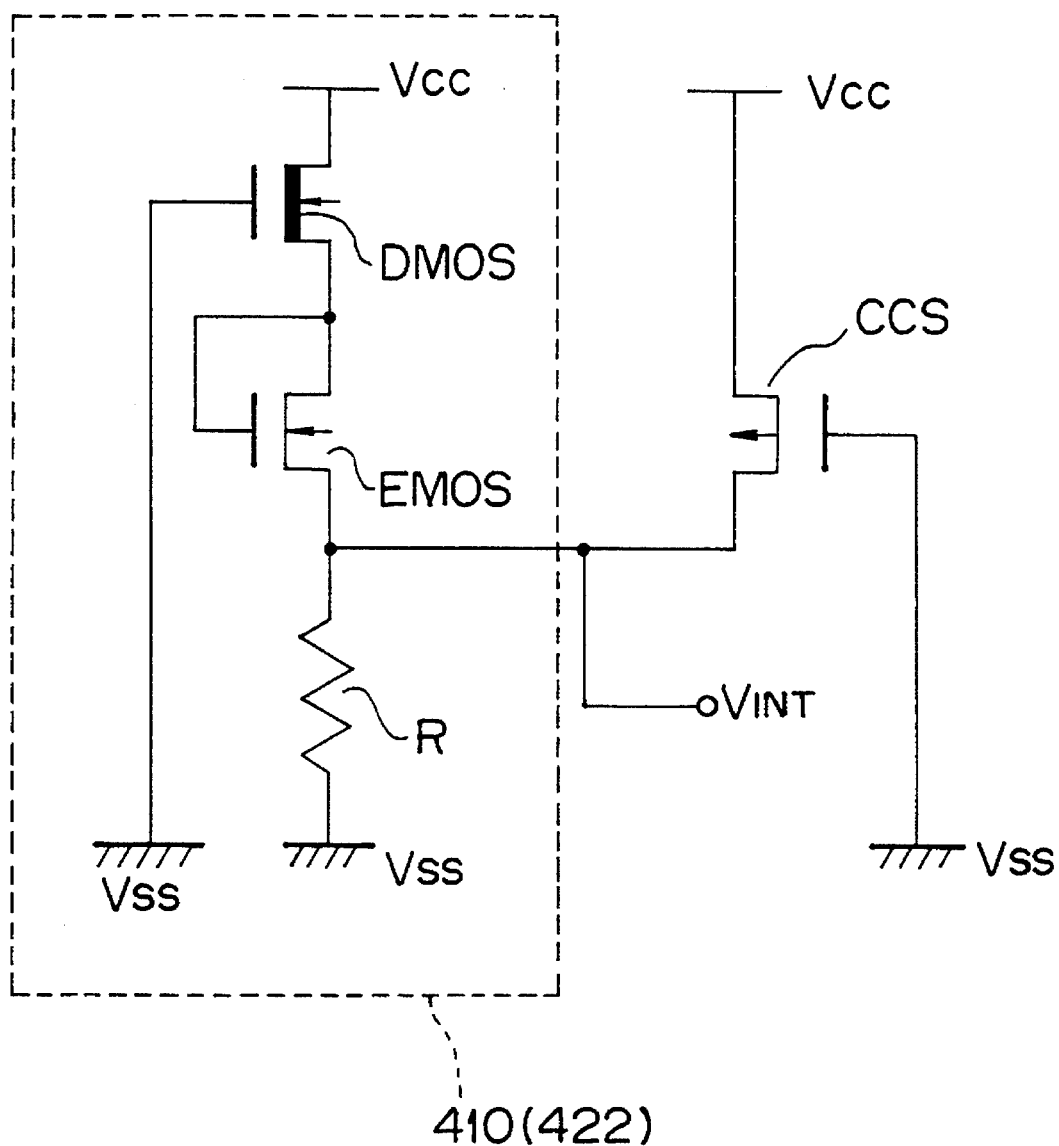
FIG. 39 is a circuit diagram showing a third embodiment of a step-down power source circuit in a semiconductor integrated circuit of the fourth aspect of the present invention.

FIG. 39 shows a circuit diagram of a third embodiment of a step-down power source circuit in a semiconductor integrated circuit according to the present invention. In FIG. 39, a reference numeral 410 corresponds to the step-down power source circuit 422 shown in FIG. 27.

As shown in FIG. 39, in the third embodiment of the present invention, a P-channel type MOS transistor, which is used for a constant current supplying element CCS, is connected to an output terminal for outputting the stepped down source voltage $V_{INT}$ of the step-down power source circuit 422. Namely, a source of the P-channel type MOS transistor is connected to the high potential power source line (Vcc), a gate thereof is connected to the low potential power source line (Vss), and a drain thereof is connected to the output terminal ($V_{INT}$) of the step-down power source circuit. Therefore, a constant current flows from the high potential power source line (Vcc) to the low potential power source line (Vss) through the P-channel type MOS transistor (CCS) and the resistor (R), and thereby the stepped down source voltage $V_{INT}$ generated by the step-down power source circuit can be maintained to be higher than a specific potential, when the temperature is changed to be lower than a predetermined temperature.

Figure 40:
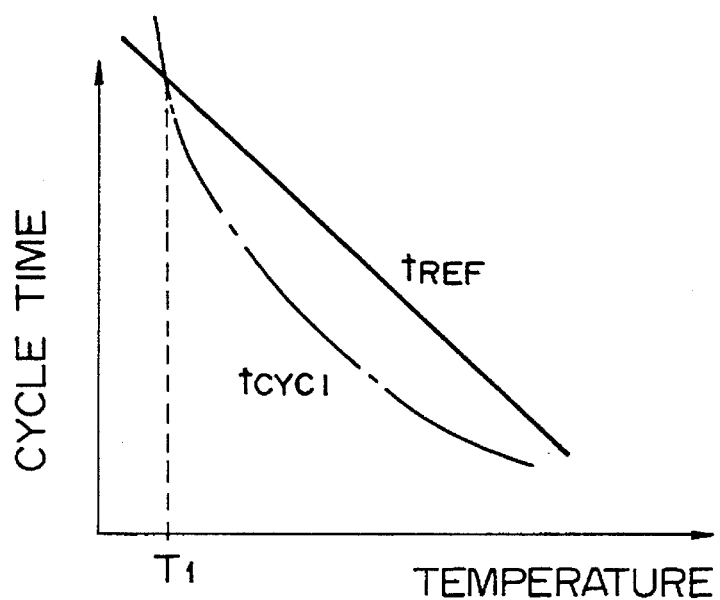
FIG. 40 is a diagram showing a relationship between a required refresh cycle and a cycle time of an output of a ring oscillator in a step-down power source circuit.
Figure 41:
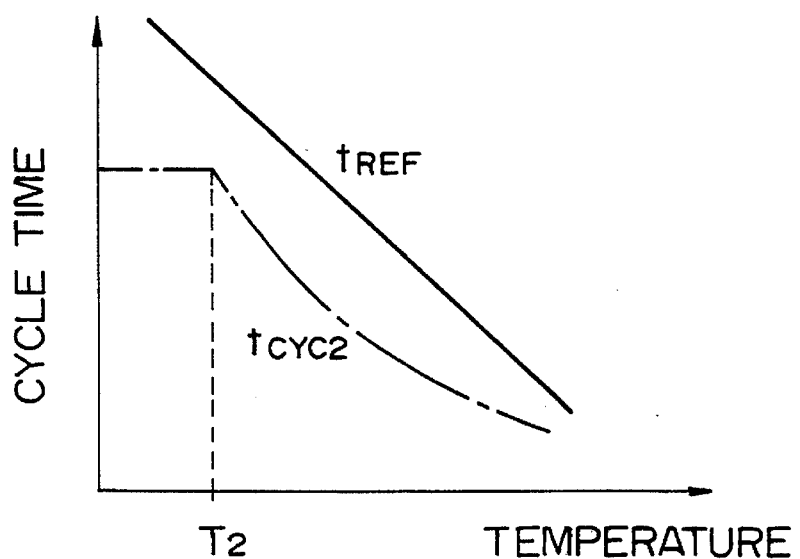
FIG. 41 is a diagram showing a relationship between a required refresh cycle and a cycle time of an output of a ring oscillator in the step-down power source circuit shown in FIG. 39.

FIG. 40 shows a relationship between a required refresh cycle $t_{REF}$ and a cycle time $t_{CYC^1}$ of an output φOSC of a ring oscillator in a step-down power source circuit, and FIG. 41 shows a relationship between a required refresh cycle $t_{REF}$ and a cycle time $t_{CYC^2}$ of an output φOSC of a ring oscillator in the step-down power source circuit shown in FIG. 39.

First, as shown in FIG. 40, when the self-refresh operation of the DRAM is carried out by supplying the output voltage ($V_{INT}$) of the step-down power source circuit 422 shown in FIG. 27 to the ring oscillator (7), under the temperature $T_1$, the cycle time (refresh cycle) $t_{CYC^1}$ of the output φOSC of the ring oscillator becomes longer than the required refresh cycle $t_{REF}$, and thus the maintenance of the stored data may be broken. Namely, the temperature compensation must be carried out under the temperature $T_1$, and this means that the established temperature range of the temperature compensation becomes small.

On the other hand, as shown in FIG. 41, when the self-refresh operation of the DRAM is carried out by supplying the output voltage of the step-down power source circuit 410 shown in FIG. 39 to the ring oscillator (407), the stepped down voltage $V_{INT}$ is maintained at the potential higher than a constant level due to the constant current is flown through the resistor R by the P-channel type MOS transistor CCS. Namely, the refresh cycle $t_{CYC^2}$ is not prolonged when the temperature is changed to be lower than a predetermined temperature $T_2$, and the refresh cycle is always shorter than the required refresh cycle $t_{REF}$, so that the maintenance of the stored data can be surely carried out. That is, according to the third embodiment of the present invention, the established temperature range of the temperature compensation can be enlarged.

Figure 42:
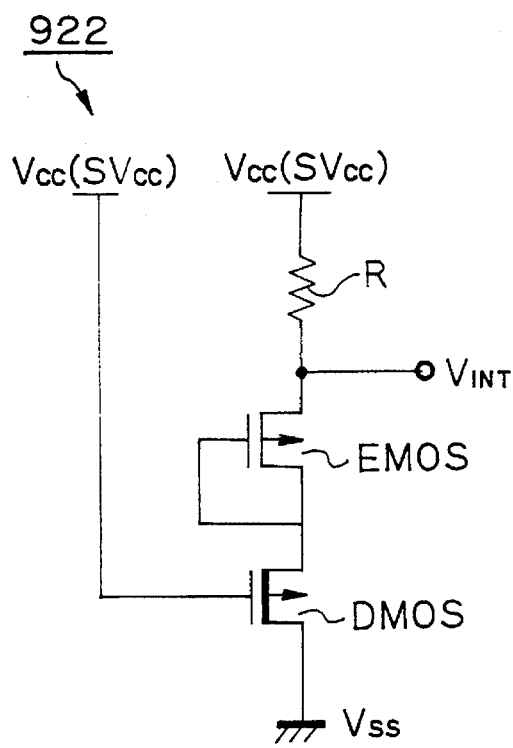
FIG. 42 is circuit diagram showing a basic modification of a step-down power source circuit in a semiconductor integrated circuit (semiconductor memory device) of the present invention.
Figure 43:
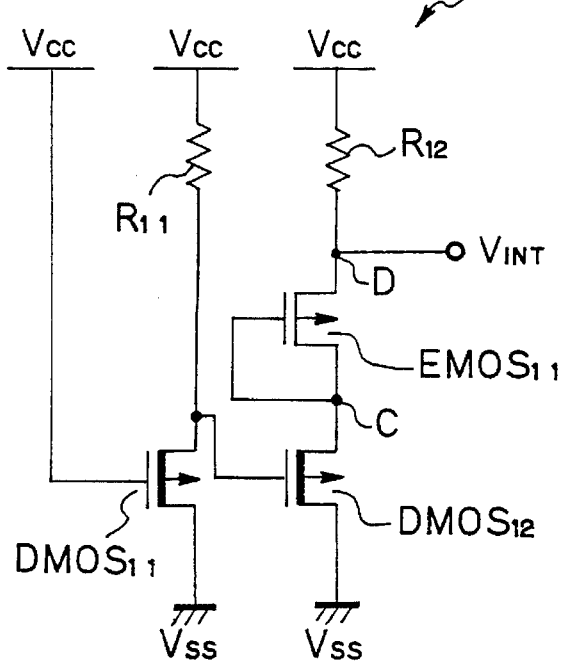
FIG. 43 is a circuit diagram showing an embodiment of a step-down power source circuit applying the modification shown in FIG. 42.

FIG. 42 shows a basic modification of a step-down power source circuit in a semiconductor integrated circuit (semiconductor memory device) of the present invention, and FIG. 43 shows an embodiment of a step-down power source circuit applying the modification shown in FIG. 42.

In the embodiment of the fourth aspect of the present invention shown in FIGS. 27 to 38, the depletion MOS transistors (DMOS transistors) and the enhancement MOS transistors (EMOS transistors) of the step-down power source circuit are constituted by N-channel type MOS transistors. Nevertheless, in the semiconductor integrated circuit (step-down power source circuit) of the present invention cannot only constituted by N-channel type MOS transistors, but also the step-down power source circuit can be constituted by P-channel type MOS transistors.

Namely, in the step-down power source circuit 422 of FIG. 27, a drain of an N-channel type depletion MOS transistor DMOS is connected to a first power source line (high potential power source line) Vcc, a gate of the depletion MOS transistor is connected to the second power source line (low potential power source line) Vss, and a source of the depletion MOS transistor is connected to the second power source line Vss through a diode connected N-channel type enhancement MOS transistor EMOS and a resistor R. Further, an output (dropped voltage) $V_{INT}$ is output from the connection portion between the enhancement MOS transistor EMOS and the resistor R.

On the other hand, in the step-down power source circuit 922 of FIG. 42, a drain of a P-channel type depletion MOS transistor DMOS is connected to a first power source line (low potential power source line) Vss, a gate of the depletion MOS transistor is connected to the second power source line (high potential power source line) Vcc, and a source of the depletion MOS transistor is connected to the second power source line Vcc through a diode connected P-channel type enhancement MOS transistor EMOS and a resistor R. Further, an output (dropped voltage) $V_{INT}$ is output from the connection portion between the enhancement MOS transistor EMOS and the resistor R.

The step-down power source circuit 922 of FIG. 43 corresponds to that shown in FIG. 29. As shown in FIG. 43, in the step-down power source circuit 922, the N-channel type depletion MOS transistors $DMOS_{11}$ and $DMOS_{12}$ of FIG. 29 are constituted by P-channel type depletion MOS transistors, and the N-channel type enhancement MOS transistor $EMOS_{11}$ of FIG. 29 is constituted by P-channel type enhancement MOS transistor. Note, as shown in FIG. 43, drains of the depletion MOS transistor $DMOS_{11}$ and $DMOS_{12}$ are connected to the low potential power source line (first power source line) Vss, a source of the depletion MOS transistor $DMOS_{11}$ is connected to the high potential power source line (second power source line) Vcc through a resistor $R_{11}$, and a source of the depletion MOS transistor $DMOS_{12}$ is connected to the high potential power source line (second power source line) Vcc through a diode connected enhancement MOS transistor $EMOS_{11}$ and a resistor $R_{12}$.

Figure 44:
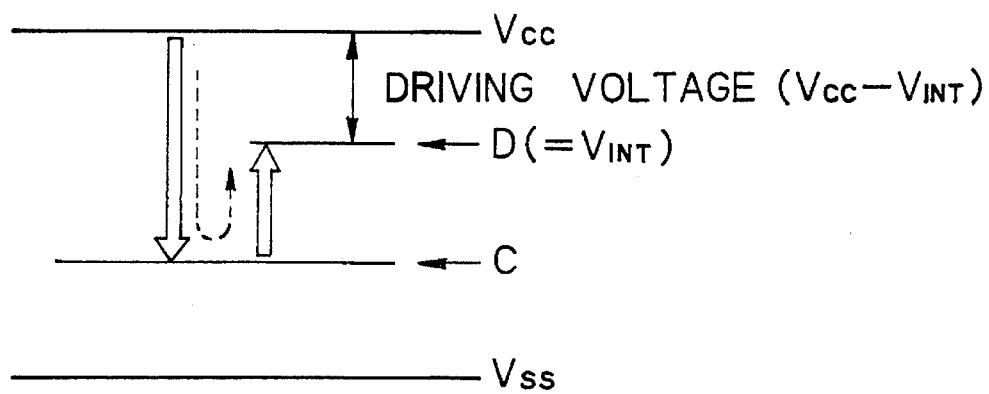
FIG. 44 is a diagram showing the potential levels of stepped down voltages of the step-down power source circuit shown in FIG. 43.

FIG. 44 shows the potential levels of stepped down voltages of the step-down power source circuit shown in FIG. 43, which corresponds to that shown in FIG. 30.

Figure 31:
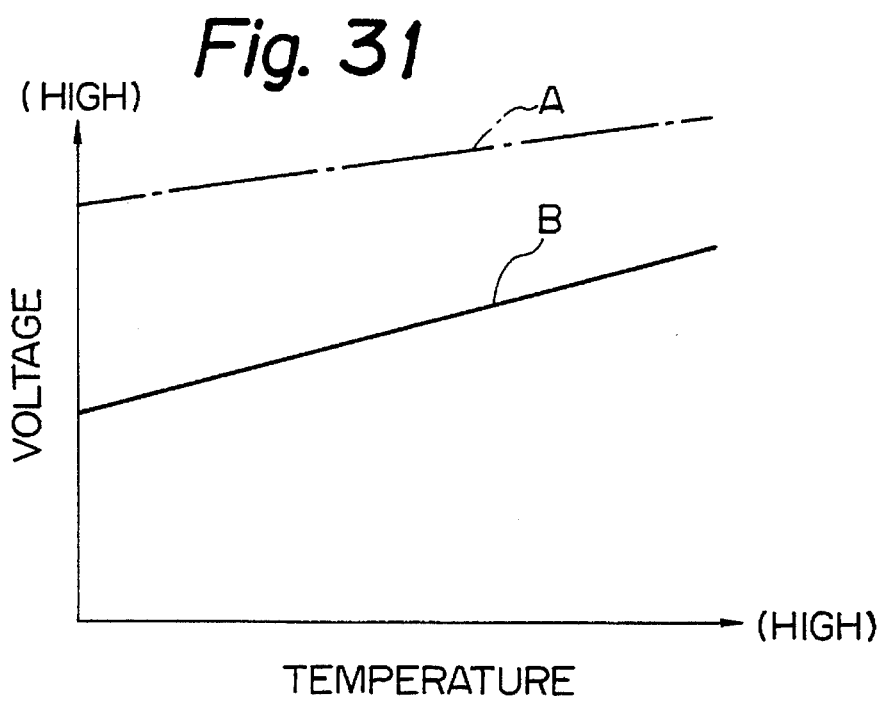
FIG. 31 is a diagram showing the temperature characteristics of stepped down voltages of the step-down power source circuit shown in FIG. 29.
Figure 45:
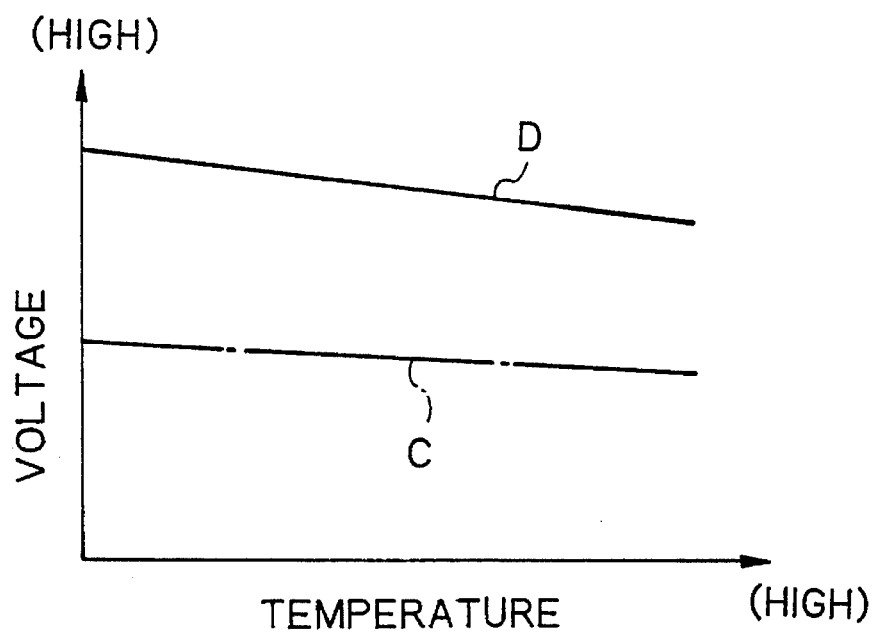
FIG. 45 is a diagram showing the temperature characteristics of stepped down voltages of the step-down power source circuit shown in FIG. 43.

Further, FIG. 45 shows the temperature characteristics of stepped down voltages of the step-down power source circuit shown in FIG. 43, which corresponds to that shown in FIG. 31. In addition, FIG. 46 shows an example of a ring oscillator applying the step-down power source circuit shown in FIG. 43, which corresponds to that shown in FIG. 23.

Figure 46:
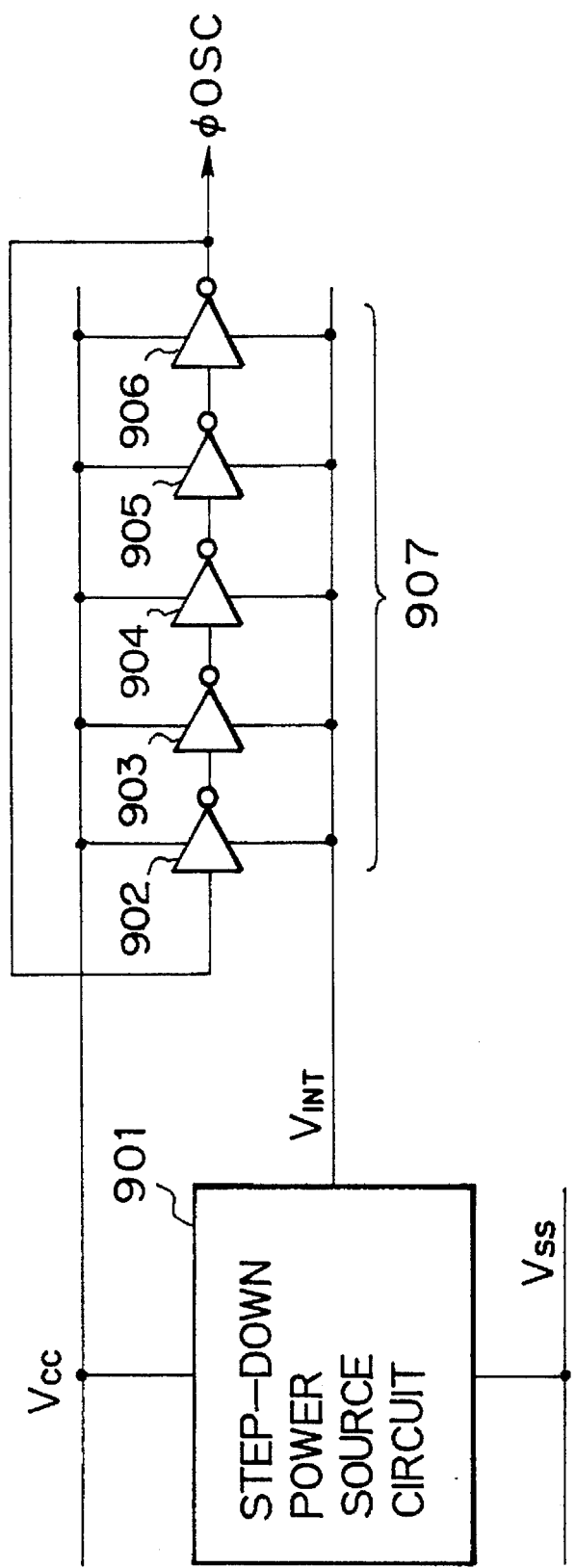
FIG. 46 is a block circuit diagram showing an example of a ring oscillator applying the step-down power source circuit shown in FIG. 43.

As shown in FIG. 46, when applying the step-down power source circuit 901 to a ring oscillator having a plurality of inverters 902 to 906, the driving voltage of the ring oscillator 907 is determined to a difference voltage ($Vcc-V_{INT}$) obtained by subtracting the voltage at a node D (dropped output voltage) $V_{INT}$ from the high potential power source voltage Vcc. Therefore, when increasing the temperature, the voltage of the node D becomes decreased, and thereby the frequency of the ring oscillator 907 becomes high.

Namely, the drive voltage ($Vcc-V_{INT}$) increases as the temperature rises, so that the output $\phi$OSC of the ring oscillator 907 shifts toward a high frequency side as the temperature rises. As a result, the $\phi$OSC changes according to required refresh cycles, and therefore, the refresh cycles are always properly controlled with respect to temperatures ranging from low to high degrees. In particular, excessive refresh operations in an ordinary temperature area are avoidable to decrease power consumption.

In the above descriptions, the step-down power source circuit is mainly applied to the self-refresh circuit in the DRAM. Nevertheless, the semiconductor integrated circuit having the step-down power source circuit according to the present invention cannot be only applied to the DRAM, but also is can be applied to various circuits.

As described above, the step-down power source circuit according to the fourth aspect of the present invention employs a simple arrangement that consumes little power to provide positive temperature characteristics. This circuit generates a stepped down voltage $V_{INT}$ that is appropriate for a ring oscillator for determining a refresh period of, for example, a DRAM.

Many different embodiments of the present invention may be constructed without departing from the spirit and scope of the present invention, and it should be understood that the present invention is not limited to the specific embodiments described in this specification, except as defined in the appended claims.

We claim:

1. A semiconductor memory device having plural memory cells with corresponding memory cell addresses and operative in a self-refresh mode for automatically refreshing the plural memory cells, comprising:

oscillator means for generating pulse signals and providing the pulse signals as an output thereof;

refresh address detection means for detecting refreshed memory cells of the plurality of memory cells and the corresponding addresses thereof and outputting a completion signal upon the completion of the refreshing of the respective memory cells of all of the memory cell addresses; and output control means responsive to a control signal for continuing the self-refresh mode thereby to refresh all memory cells of the respective memory cell addresses according to the completion signal from said refresh address detection means before releasing the self-refresh mode, the pulse signals output from said oscillator means being input to said output control means.

2. A semiconductor memory device as claimed in claim 1, wherein:

said oscillator means comprises a first oscillator for generating and producing, as a first output, pulses having a short period and a second oscillator for generating and producing, as a second output, pulses having a long period; and said semiconductor memory device further comprises a switch means for selectively switching between the first and second output pulses of said first and second oscillators, respectively, in response to a further control signal for releasing the self-refresh mode and such that a refresh operation is automatically carried out in accordance with the short period before and after the self-refresh mode.

3. A semiconductor memory device as claimed in claim 1, wherein said semiconductor memory device further comprises:

refresh address counters corresponding to the respective address bits of the memory cell addresses; and refresh address output buffers corresponding to the plural refresh address counters and, operable for providing the corresponding count values of the respective refresh address counters to the outside of said semiconductor memory device.

4. A semiconductor memory device as claimed in claim 3, further comprising:.

plural address input terminals receiving address bit values from the outside; and said refresh address output buffers provide the corresponding count values in said respective refresh address counters to the outside through the respective address input terminals.

* * * * *

UNITED STATES PATENT AND TRADEMARK OFFICE
CERTIFICATE OF CORRECTION

PATENT NO. : 5,499,213
DATED : March 12, 1996
INVENTOR(S) : NIIMI et al.

It is certified that error appears in the above-indentified patent and that said Letters Patent is hereby corrected as shown below:

TITLE PAGE: [56] References Cited, as the last item, add the following:

OTHER PUBLICATIONS

TANIGUCHI et al., "Fully Boosted 64K Dynamic RAM with Automatic and Self-Refresh," IEEE JOURNAL OF SOLID-STATE CIRCUITS, Vol. SC-16, No. 5, October 1981, pages 492-498.

NOGAMI et al., "1-Mbit Virtually Static RAM," IEEE JOURNAL OF SOLID-STATE CIRCUITS, Vol. SC-21, No. 5, October 1986, pages 662-669.

YOSHIOKA et al., "SESSION I: MEGABIT DRAMs - WAM 1.5: 4MB Pseudo/Virtually SRAM," 1987 IEEE INTERNATIONAL SOLID-STATE CIRCUITS CONFERENCE, Wednesday, February 25, 1987, pages 20-21 & 320-322.

MANO et al., "SESSION I: MEGABIT DRAMs - WAM 1.6: Circuit Technologies for 16Mb DRAMs," 1987 IEEE INTERNATIONAL SOLID-STATE CIRCUITS CONFERENCE, Wednesday, February 25, 1987, pages 22-23 & 323-324.

KONISHI et al., "A 38-ns 4-Mb DRAM with a Battery-Backup (BBU) Mode," IEEE JOURNAL OF SOLID-STATE CIRCUITS, Vol. 25, No. 5, October 1990, pages 1112-1117.

Col. 1, line 8, change "device, and" to --device and,--.

Col. 7, line 38, after "function" insert --,--;
line 39, change "vCAS" to --/CAS--;
line 41, change "$\mu$sec." to --$\mu$ sec.--.

Col. 8, line 13, change "$\mu$sec." to --$\mu$ sec.--.

UNITED STATES PATENT AND TRADEMARK OFFICE
CERTIFICATE OF CORRECTION

PATENT NO. : 5,499,213
DATED : March 12, 1996
INVENTOR(S) : NIIMI et al.

It is certified that error appears in the above-indentified patent and that said Letters Patent is hereby corrected as shown below:

Col. 11, line 24, change "sQn" to --SQn--;
line 26, delete "30".

Col. 17, line 14, change "$\mu$sec." to -- $\mu$ sec.--.

Col. 21, line 30, change "$V_{GS(DMOS12)}$" to --$V_{GS\ (DMOS12)}$--;
line 31, change "$V_{GS(DMOS11)}$" to --$V_{GS\ (DMOS11)}$--;

Col. 22, line 19, change "DMOS" to --$DMOS_{11}$--;
line 20, change "iS" to --is--;
line 64, after "higher" insert --than a normal high voltage Vcc is applied to a high--.

Col. 23, line 8, change "$\alpha'''$" to --$\alpha'$--;
line 11, change "$\beta'''$" to --$\beta'$--.

Col. 26, line 35 (claim 3, line 4), delete "the";
line 37 (claim 3, line 6), delete "plural";
line 38 (claim 3, line 7), delete "the".

Signed and Sealed this

Twentieth Day of August, 1996

BRUCE LEHMAN

Attest:

*Attesting Officer*                    *Commissioner of Patents and Trademarks*